(12) United States Patent
Faucher et al.

(10) Patent No.: US 8,624,641 B1
(45) Date of Patent: Jan. 7, 2014

(54) APPARATUS AND METHOD FOR DRIVING A TRANSISTOR

(75) Inventors: Julien Faucher, Montreal (CA);
Michael Ben Venditti, Montreal (CA)

(73) Assignee: PMC-Sierra, Inc., Sunnyvale, CA (US)

( * ) Notice: Subject to any disclaimer, the term of this patent is extended or adjusted under 35 U.S.C. 154(b) by 0 days.

(21) Appl. No.: 13/288,866

(22) Filed: Nov. 3, 2011

Related U.S. Application Data

(60) Provisional application No. 61/409,881, filed on Nov. 3, 2010.

(51) Int. Cl.
*H03K 3/00* (2006.01)
*H03L 5/00* (2006.01)

(52) U.S. Cl.
USPC ............... 327/112; 327/333; 327/170

(58) Field of Classification Search
USPC .............. 327/108–112, 170, 333; 326/26, 27, 326/62–92; 365/189.11
See application file for complete search history.

(56) References Cited

U.S. PATENT DOCUMENTS

| | | | |
|---|---|---|---|
| 5,510,729 A | 4/1996 | Reymond | |
| 5,959,492 A | 9/1999 | Khoury et al. | |
| 6,114,898 A | 9/2000 | Okayasu | |
| 6,130,556 A * | 10/2000 | Schmitt et al. | 326/81 |
| 6,133,749 A | 10/2000 | Hansen et al. | |
| 6,194,924 B1 | 2/2001 | Welch et al. | |
| 6,288,591 B1 | 9/2001 | Riccio | |
| 6,288,604 B1 | 9/2001 | Shih et al. | |
| 6,373,315 B2 | 4/2002 | Tsuji et al. | |
| 6,507,218 B1 * | 1/2003 | To et al. | 326/81 |
| 6,571,376 B1 | 5/2003 | Levin et al. | |
| 6,577,154 B2 | 6/2003 | Fifield et al. | |
| 6,700,429 B2 | 3/2004 | Kanno et al. | |
| 6,734,702 B1 | 5/2004 | Ikeoku et al. | |
| 6,836,144 B1 | 12/2004 | Bui et al. | |
| 6,894,543 B2 * | 5/2005 | Ho et al. | 327/108 |
| 6,930,666 B2 | 8/2005 | Miyazawa et al. | |
| 7,026,855 B2 | 4/2006 | Sueoka et al. | |
| 7,205,820 B1 | 4/2007 | Yeung et al. | |
| 7,227,400 B1 | 6/2007 | Gillespie et al. | |
| 7,265,581 B2 | 9/2007 | Yeh | |

(Continued)

OTHER PUBLICATIONS

Texas Instruments, "Single-Ended 16-Channel/Differential 8-Channel CMOS Analog Multiplexers", SBFS018A, Jan. 1988—Revised 2003.*

(Continued)

*Primary Examiner* — Lincoln Donovan
*Assistant Examiner* — Thomas Skibinski
(74) *Attorney, Agent, or Firm* — Knobbe Martens Olson & Bear LLP

(57) ABSTRACT

Disclosed is a high-swing voltage-mode transmitter or line driver. The transmitter can operate over a wide range of supply voltages. Increasing the available output swing merely involves increasing the supply voltage; the circuit adapts to maintain the desired output impedance. This allows for a tradeoff between output amplitude and power consumption. Another advantage of the proposed architecture is that it compensates for process, voltage, and temperature (PVT) and mismatch variations so as to keep rise and fall times matched. This feature reduces common-mode noise and hence electromagnetic interference in systems in which the transmitter is used.

17 Claims, 35 Drawing Sheets

(56) References Cited

U.S. PATENT DOCUMENTS

| | | | |
|---|---|---|---|
| 7,368,902 B2 | 5/2008 | Clements et al. | |
| 7,471,107 B1 | 12/2008 | Fortin et al. | |
| 7,495,474 B2 | 2/2009 | Komatsu et al. | |
| 7,501,851 B2 | 3/2009 | Venditti et al. | |
| 7,586,358 B2* | 9/2009 | Park et al. | 327/333 |
| 7,635,990 B1 | 12/2009 | Ren et al. | |
| 7,639,059 B1 | 12/2009 | Yu et al. | |
| 7,777,549 B2 | 8/2010 | Harada | |
| 7,880,501 B2 | 2/2011 | Han et al. | |
| 7,893,720 B2 | 2/2011 | Yadav et al. | |
| 8,058,924 B1 | 11/2011 | Ren et al. | |
| 8,125,245 B2 | 2/2012 | Flynn et al. | |
| 8,222,954 B1 | 7/2012 | Ren et al. | |
| 2002/0109525 A1 | 8/2002 | Shin | |
| 2003/0117207 A1 | 6/2003 | Suk et al. | |
| 2003/0222701 A1 | 12/2003 | Yang et al. | |
| 2005/0237099 A1 | 10/2005 | Tachibana et al. | |
| 2005/0285658 A1 | 12/2005 | Schulmeyer et al. | |
| 2008/0042722 A1 | 2/2008 | Dornbusch | |
| 2009/0153219 A1* | 6/2009 | Wu et al. | 327/333 |
| 2009/0315592 A1 | 12/2009 | Hidaka | |
| 2010/0259303 A1 | 10/2010 | Liao et al. | |

OTHER PUBLICATIONS

Kim, et al.; A Large-Swing Transformer-Boosted Serial Link Transmitter With >$V_{DD}$ Swing; IEEE Journal of Solid-State Circuits; vol. 42; No. 5; pp. 1131-1142; May 2007.

Kossel, et al.; A T-Coil-Enhanced 8.5 Gb/S High-Swing SST Transmitter in 65 Nm Bulk CMOS With <−16 Db Return Loss Over 10 Ghz Bandwidth; IEEE Journal Solid-State Circuits; vol. 43; No. 12; pp. 2905-2920; Dec. 2008.

Meghelli, et. al.; A 10 Gb/S 5-Tap-DFE/4-Tap-FFE Transceiver in 90 Nm CMOS; IEEE Journal of Solid-State Circuits; vol. 41; No. 12; Dec. 2006.

Payne, et. al.; A 6.25-Gb/S Binary Transceiver in 0.13-µM CMOS for Serial Data Transmission Across High Loss Legacy Backplane Channels; IEEE Journal. Solid-State Circuits; vol. 40; No. 12; pp. 2646-2657; Dec. 2005.

Saul, et. al.; Versatile High Voltage Level Shift and Driver for MEMS Applications; Electronics Letters; vol. 39; No. 2; pp. 185-186; Jan. 23, 2003.

Serneels, et. al.; A High Speed, Low Voltage to High Voltage Level Shifter in Standard 1.2V 0.13 µm CMOS; 13th IEEE International Conference on Electronics, Circuits and Systems; pp. 668-671, 2006.

USPTO; Office Action dated Nov. 15, 2012, from related U.S. Appl. No. 12/288,881, filed Nov. 3, 2011.

\* cited by examiner

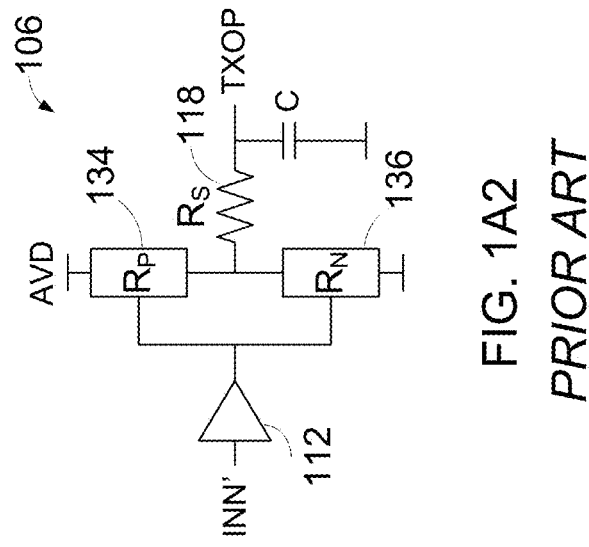
FIG. 1A2 PRIOR ART
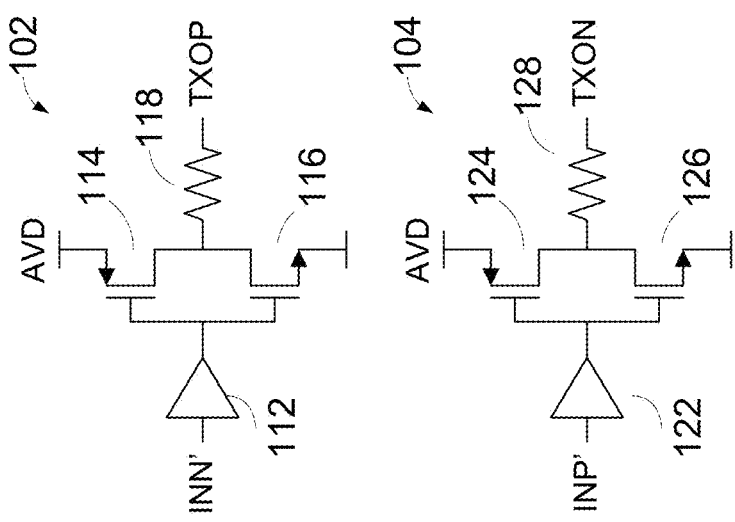
FIG. 1A1 PRIOR ART

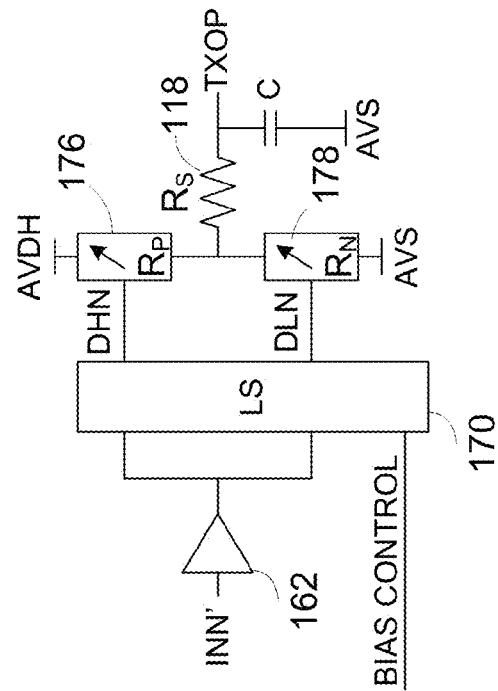
FIG. 1C2
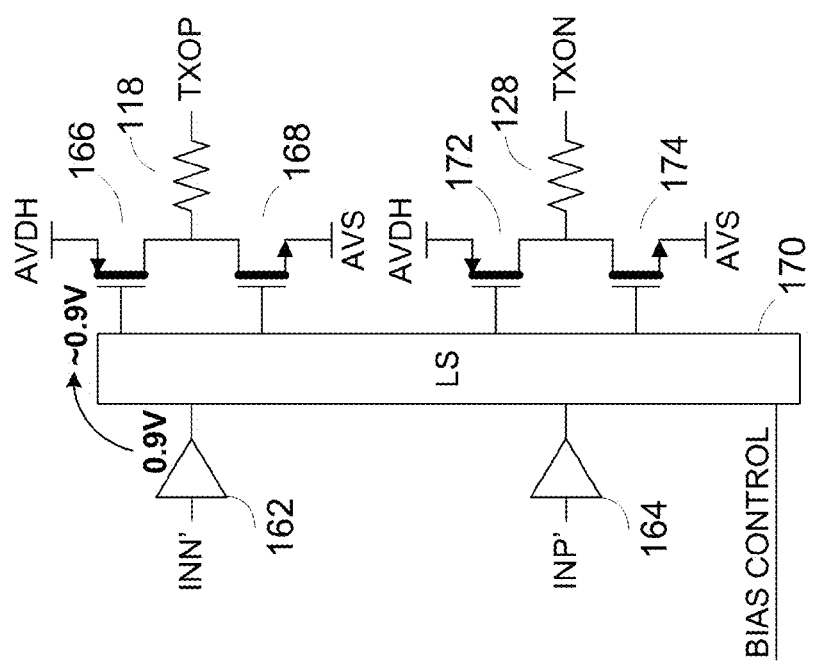
FIG. 1C1

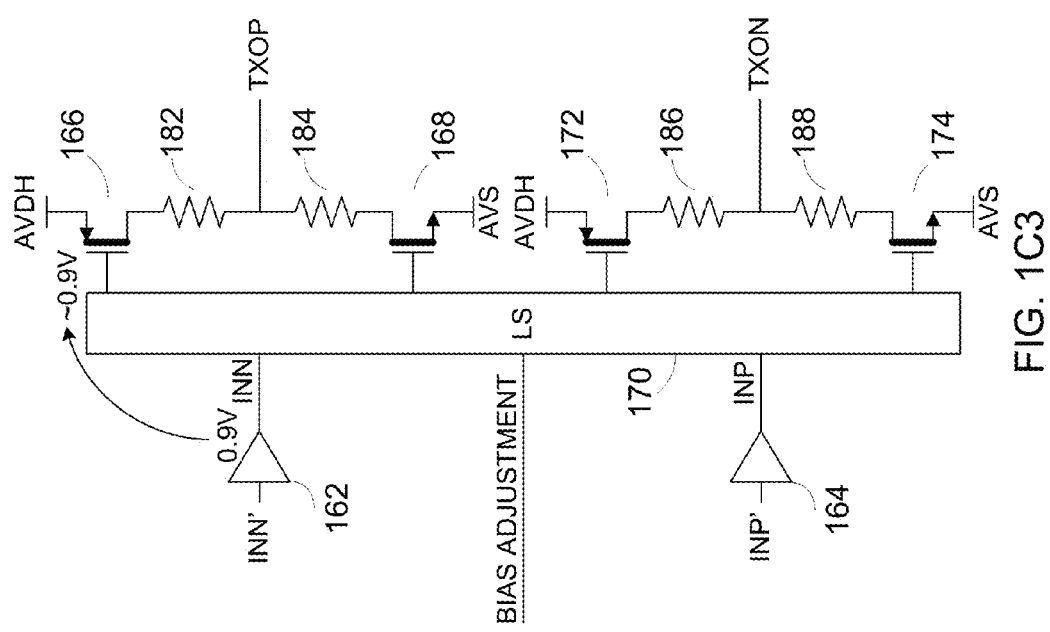
FIG. 1C3

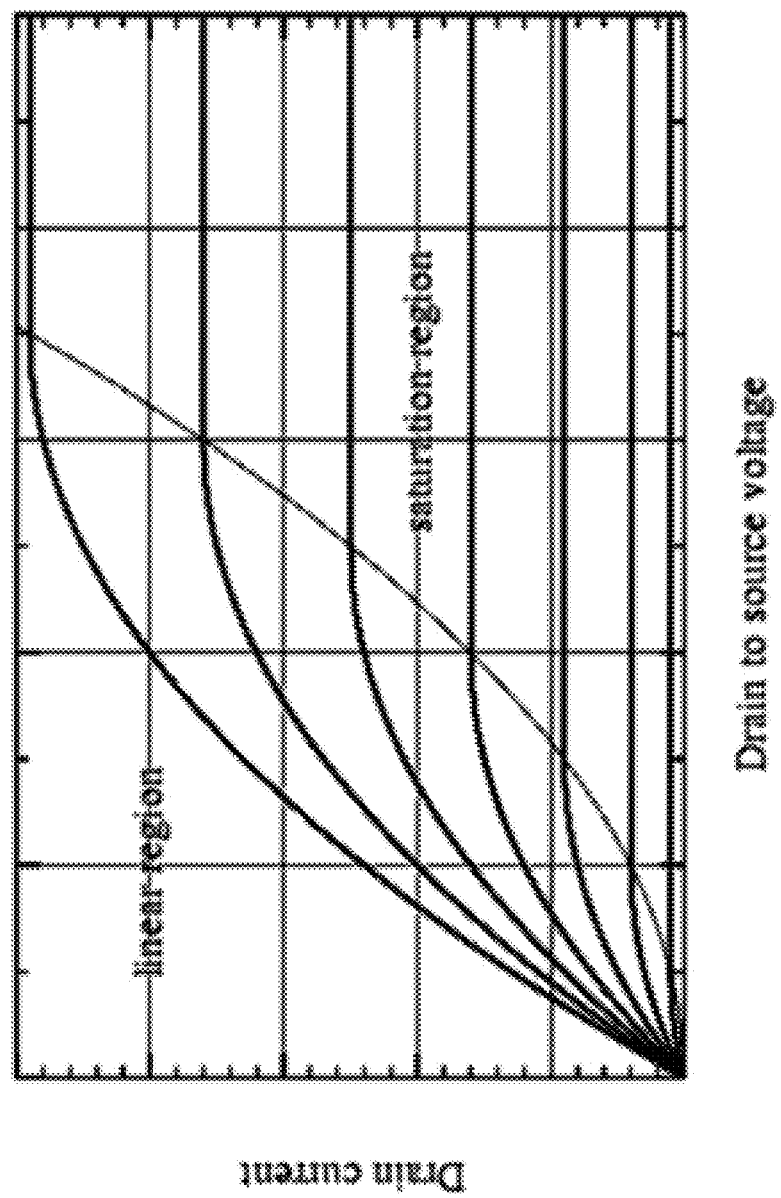
FIG. 1C4

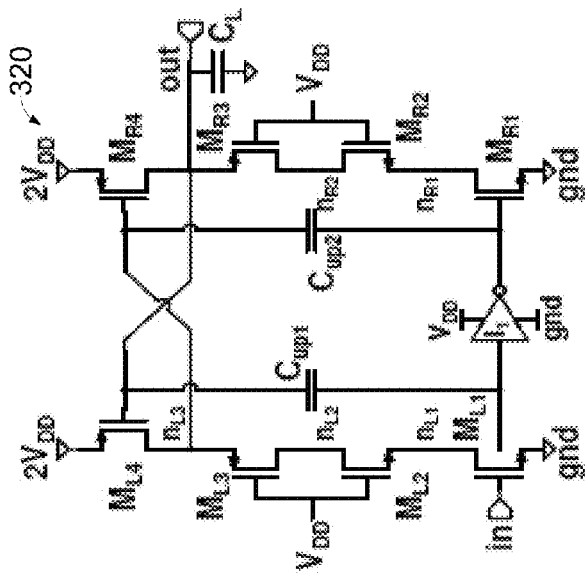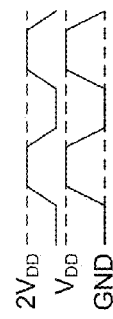
FIG. 3B1 PRIOR ART
FIG. 3B2 PRIOR ART
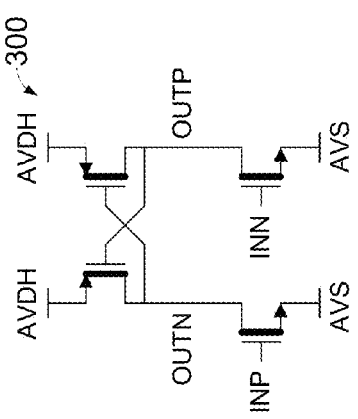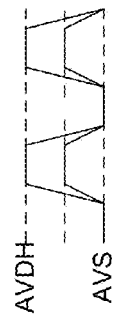
FIG. 3A1 PRIOR ART
FIG. 3A2 PRIOR ART

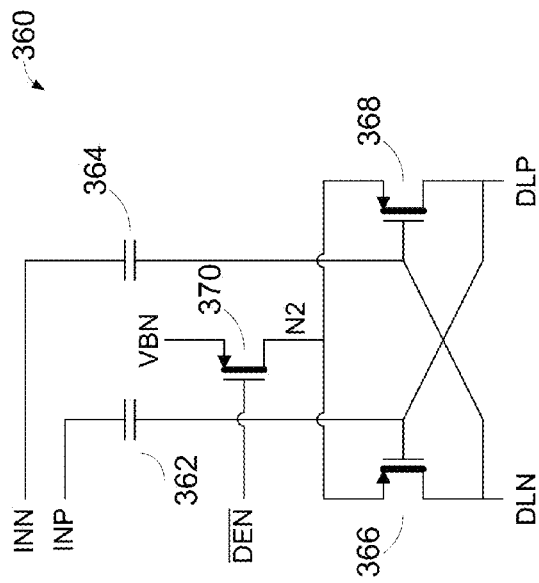
FIG. 3D1
FIG. 3D2
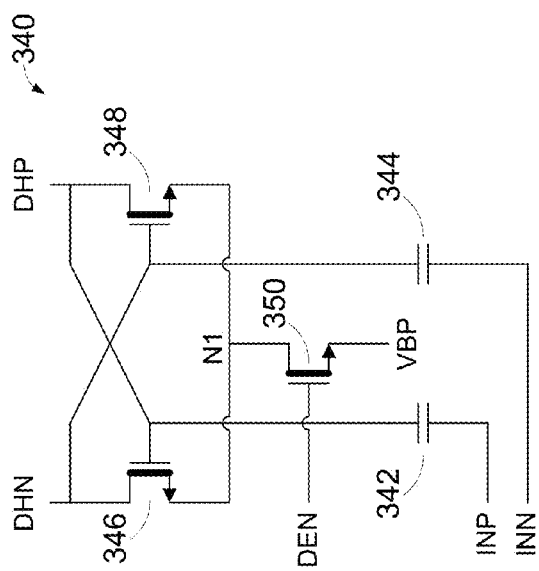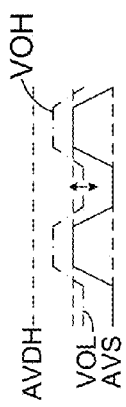
FIG. 3C1
FIG. 3C2

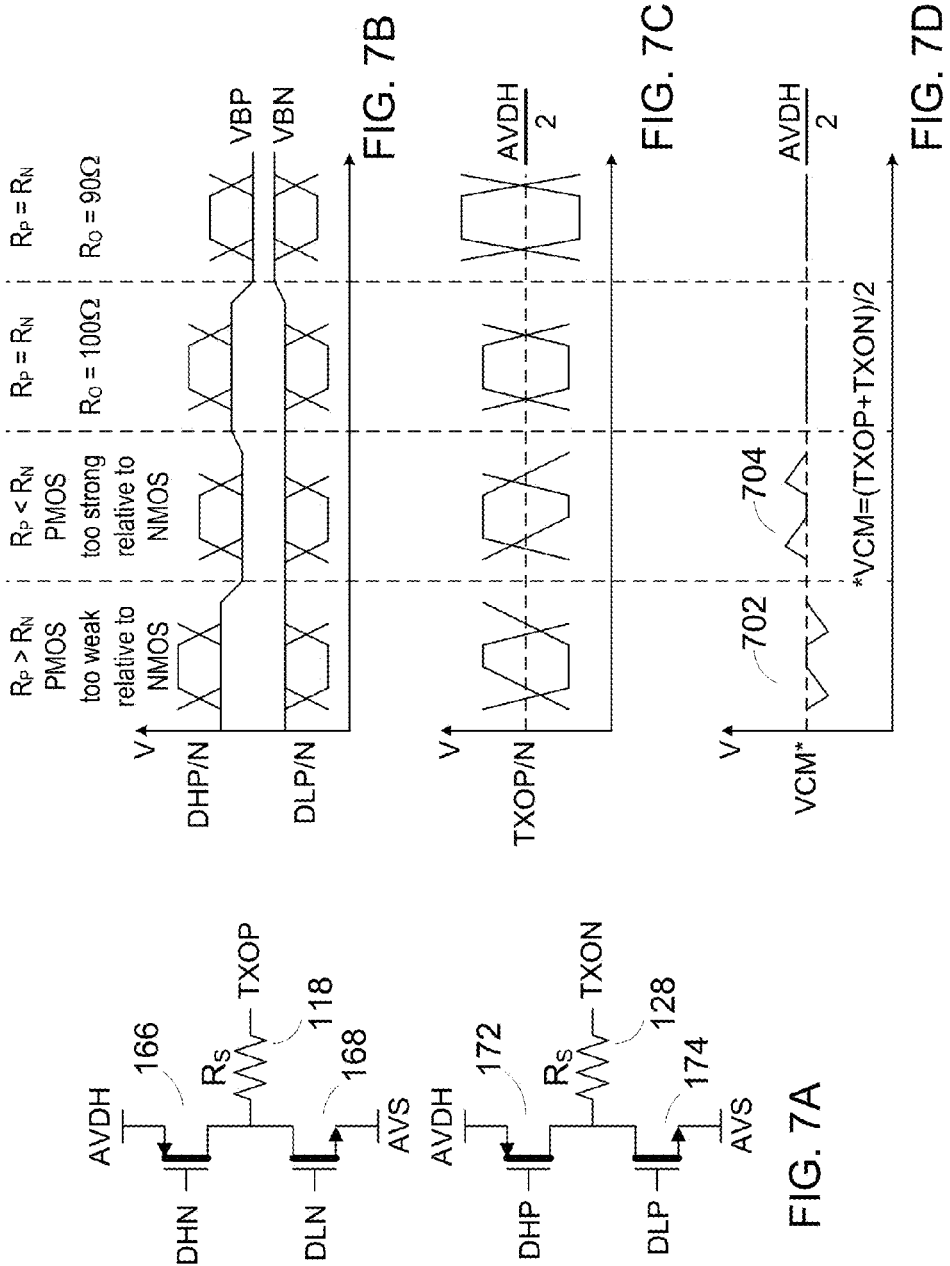

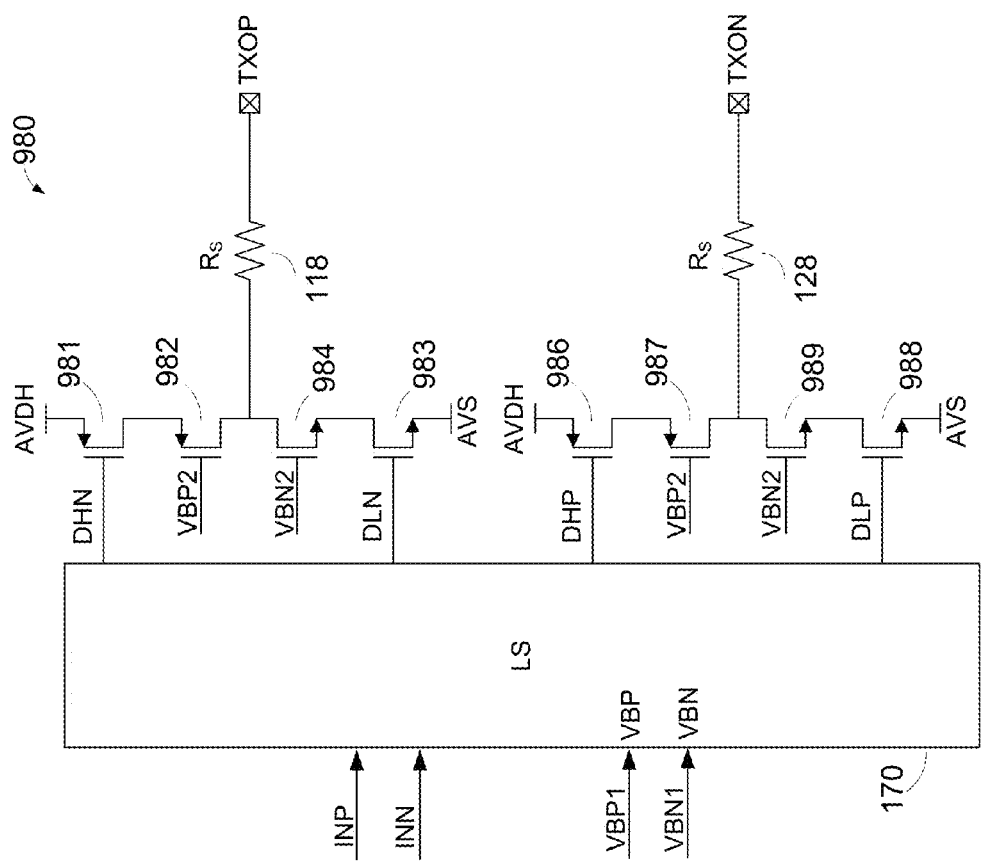
FIG. 9E1

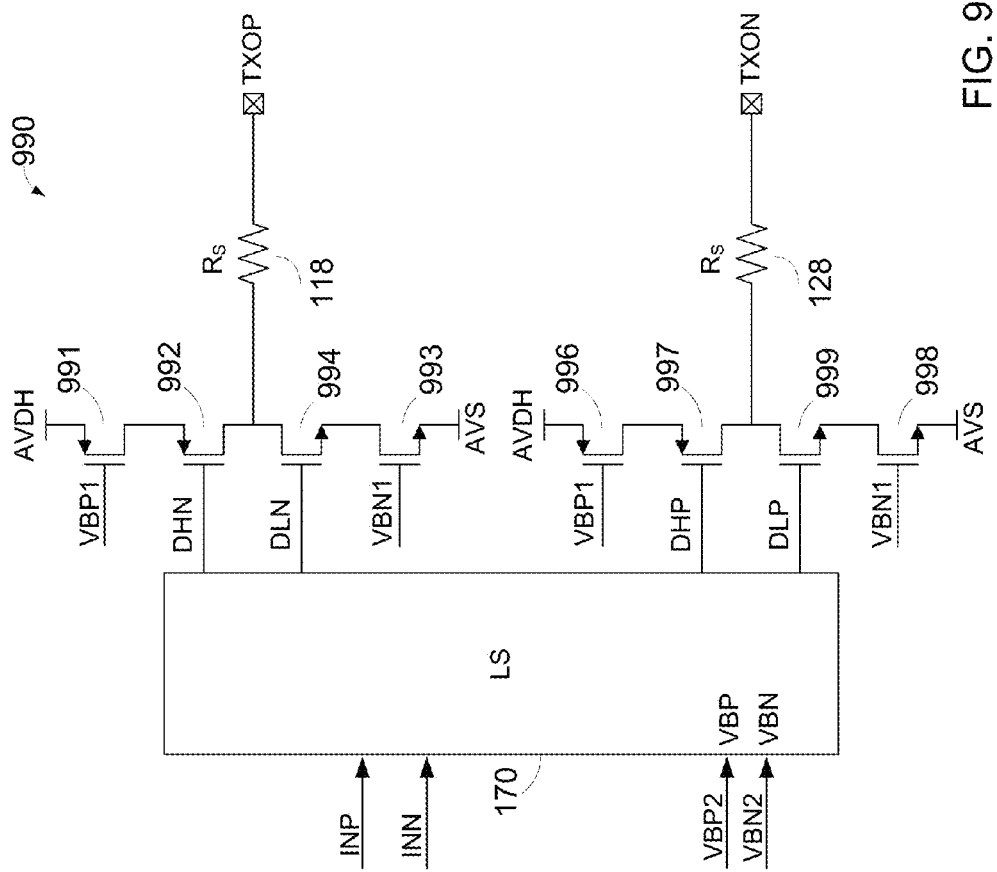
FIG. 9E2

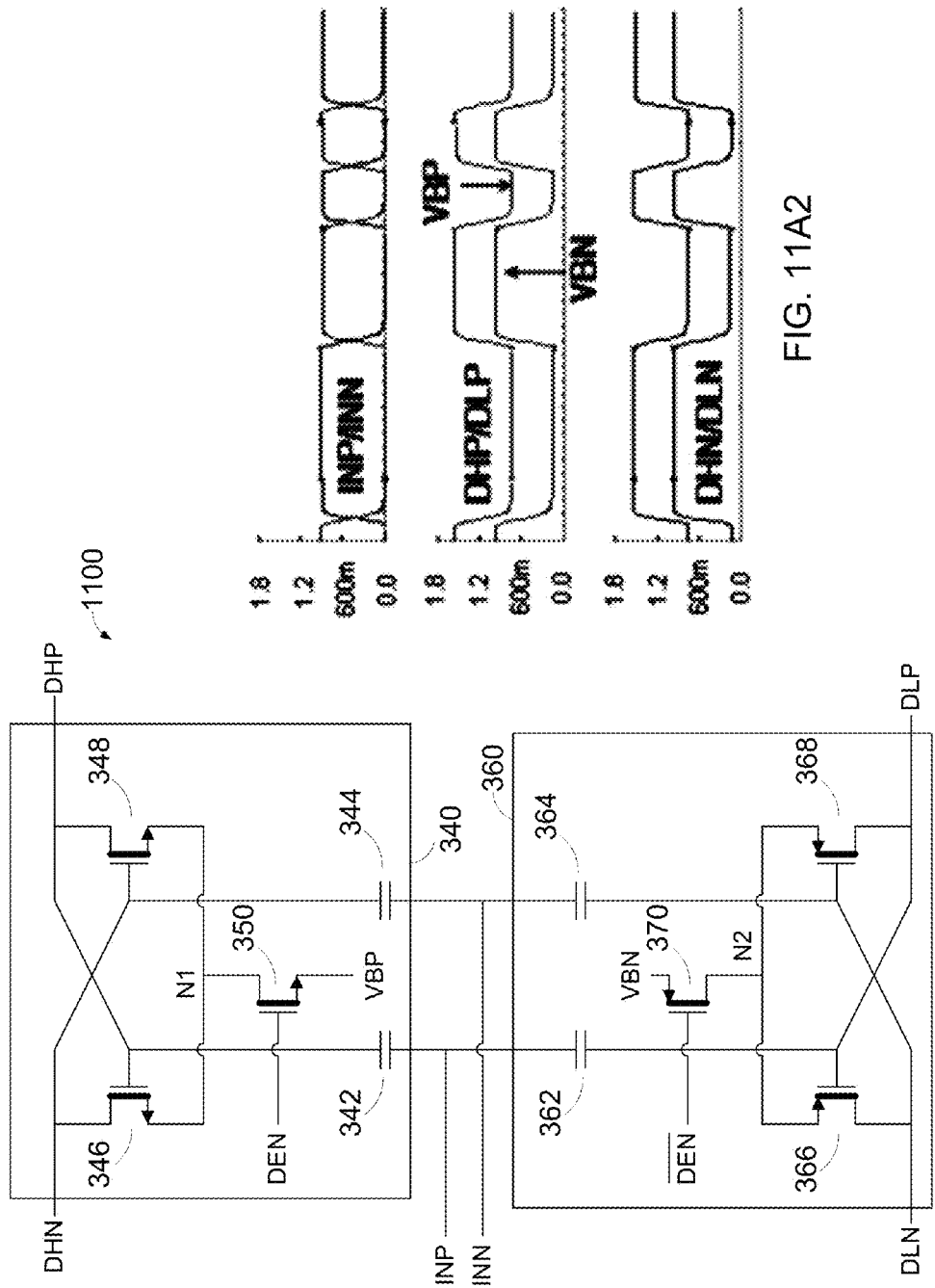

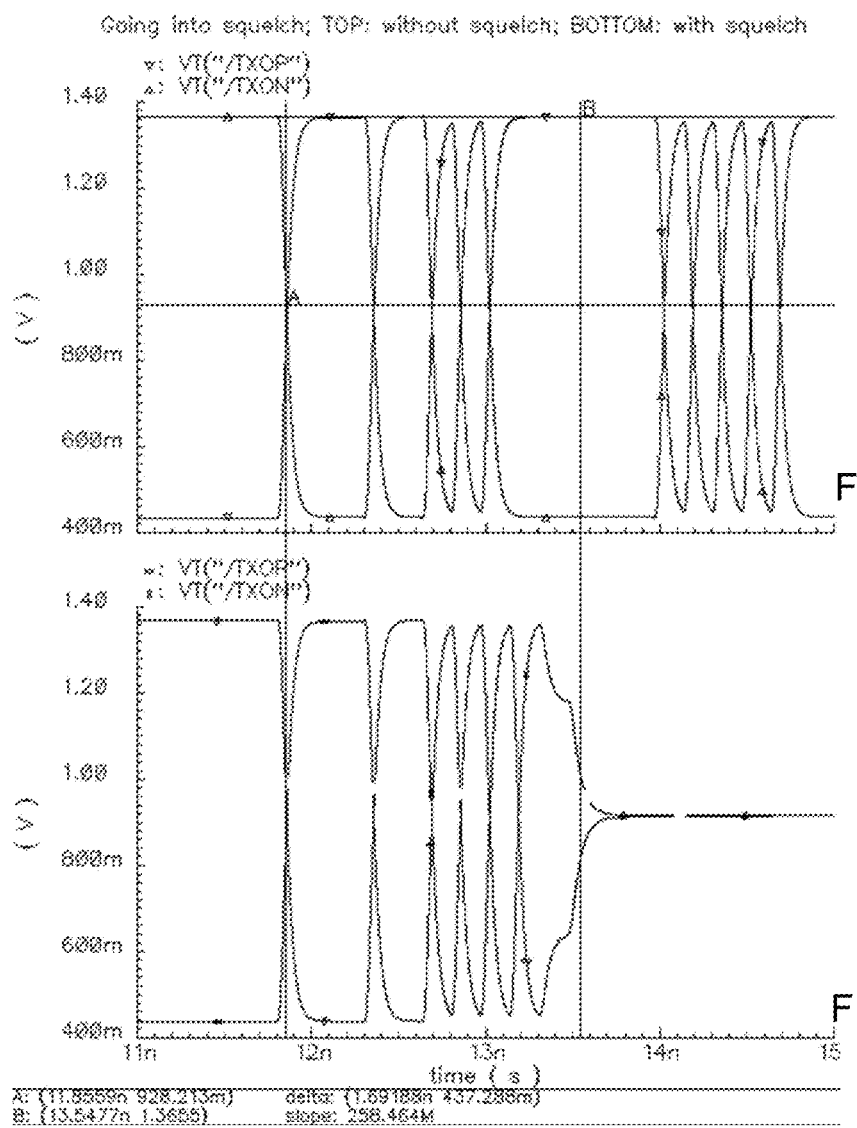
FIG. 12A1
FIG. 12A2

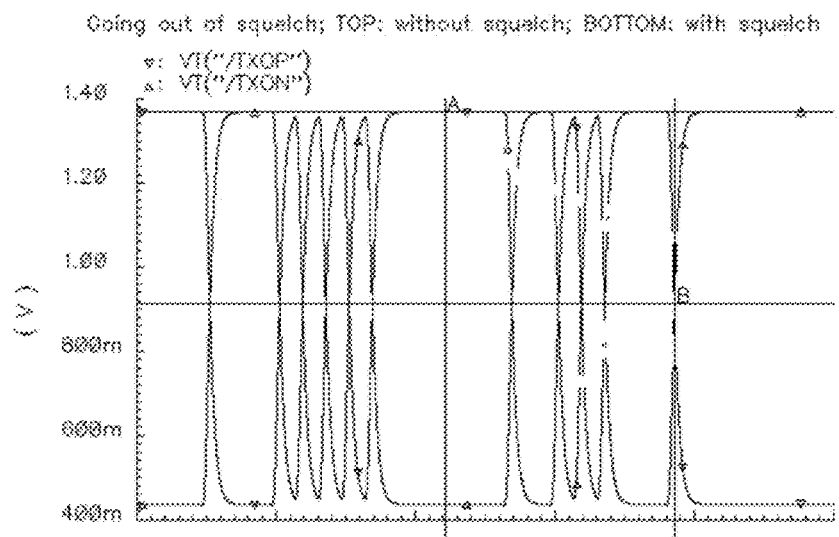
FIG. 12B1
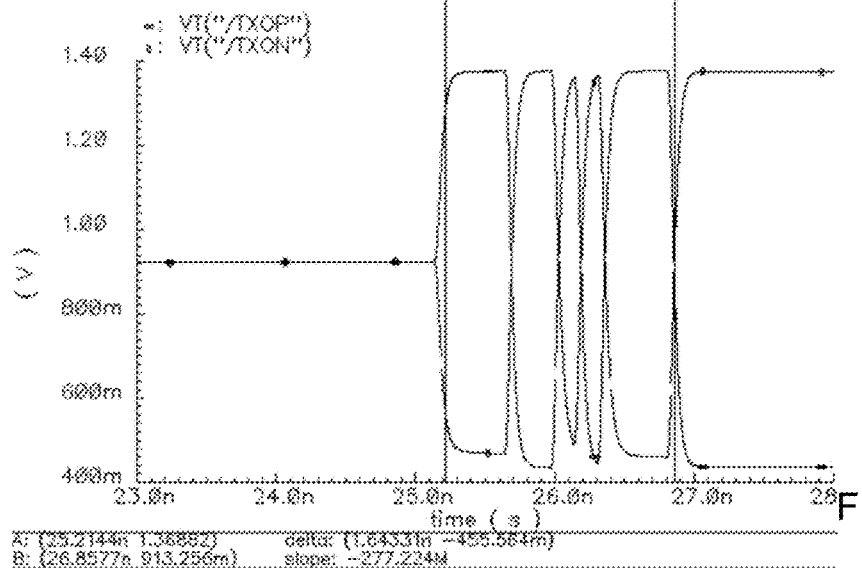
FIG. 12B2

APPARATUS AND METHOD FOR DRIVING A TRANSISTOR

CROSS-REFERENCE TO RELATED APPLICATION

This application claims the benefit under 35 U.S.C. §119 (e) of U.S. Provisional Application No. 61/409,881, filed Nov. 3, 2010, the entirety of which is hereby incorporated by reference.

This application is related to copending applications titled Scalable High-Swing Transmitter with Rise and/or Fall Time Mismatch Compensation, Ser. No. 13/288,875 and Apparatus and Method for Generating a Bias Voltage, Ser. No. 13/288,881, filed on the same date as the present application, the disclosure of which is hereby incorporated by reference in its entirety herein.

BACKGROUND

1. Field of the Invention

The invention generally relates to electronics. In particular, the invention relates to wired transmitters or line drivers.

2. Description of the Related Art

The bandwidth requirements of networking and high-performance processing applications have been projected to continue to increase into the tens of giga bits per second (Gb/s) rates. For example, with reference to serial attached SCSI (SAS) standard, the SAS-2.0 standard defines the maximum data rate as 6 Gb/s, with 12 Gb/s slated to follow in the upcoming SAS-3.0 standard.

One of the limiting factors for high-speed serial links is the band-limited response of the transmission medium (or channel) which causes increasing signal attenuation at high frequencies. In addition, residual low-frequency signal energy from adjacent symbols can cause inter-symbol-interference (ISI), which can corrupt the "data eye" and lead to a reduced signal-to-noise ratio (SNR). ISI-induced SNR degradation can be effectively improved by various channel equalization techniques. More specifically, equalizers commonly compensate for the band-limited response by either de-emphasizing low-frequency power at the transmitter or amplifying high-frequency power at the receiver, both of which are limited by transmitted signal power reduction and receiver noise amplification, respectively. It has been demonstrated that combining transmitter and receiver equalizations can compensate up to 20-30 decibels (dB) of attenuation at the Nyquist frequency. See, for example, M. Meghelli, et al., A 10 Gb/s 5-Tap-DFE/4-Tap-FFE transceiver in 90 nm CMOS, in IEEE ISSCC Dig. Tech. Papers, February 2007, pp. 80-81 and R. Payne, et al., A 6.25-Gb/s binary transceiver in 0.13-µm MOS for serial data transmission across high loss legacy backplane channels, IEEE J. Solid-State Circuits, vol. 40, no. 12, pp. 2646-2657, December 2005.

In future serial-link systems with data rates higher than currently used, the amount of attenuation at the Nyquist frequency could be worse than 30 dB because of (a) legacy backplanes that were not intended for use with the higher signaling frequency and/or (b) less appreciable improvements in the construction of the channel and its materials. See, for example, J Kim et al., A large-swing transformer-boosted serial link transmitter with >VDD swing, IEEE J. Solid-State Circuits, vol. 42, no. 5, pp. 1131-1142, May 2007. For some systems, one solution for maintaining sufficient SNR at the receiver is to increase the signal power by transmitting relatively large voltage swings.

In high-speed data transmission, current-mode-logic (CML) style transmitters are frequently employed because they support high data rates and have an inherently low susceptibility to power supply noise. These advantages, however, come along with some drawbacks, such as relatively high static power consumption, headroom problems due to the lower supply voltage in newer technologies, and the inability to support different DC termination voltages as the output of the CML circuit is generally referenced to one of the two power supply rails.

Voltage-mode transmitters overcome these disadvantages with a CMOS-oriented design style, supporting many different termination voltages. Other advantages of the voltage-mode type of transmitter include its potential for low-power operation (for a given output swing, a voltage-mode driver with a differential RX termination enables a potential 4 fold reduction in drive power compared to a CML driver), and good technology scaling due to the high relative content of digital circuitry versus analog circuitry. These factors make voltage-mode transmitters particularly suitable for multi-standard I/O applications.

As discussed above, some standards call for larger vertical eye openings (that is, higher launch amplitude). Equation 1 expresses a typical maximum output amplitude of a voltage-mode transmitter as a function of various parameters.

$$V_{Odiff} = 2 \cdot AVD \cdot \frac{R_L}{R_L + R_{Odiff}} \quad \text{Equation 1}$$

In Equation 1, the voltage $V_{Odiff}$ corresponds to the peak-to-peak differential output voltage, the voltage AVD corresponds to the supply voltage of the output driver, the resistance $R_L$ corresponds to the load impedance, such as, but not limited to 100 ohms (Ω), and the resistance $R_{Odiff}$ corresponds to the output impedance of the voltage-mode transmitter.

According to Equation 1, an increase in the launch amplitude of a voltage-mode driver can be can be accomplished in two different ways for a constant load impedance: 1) the value of the resistance $R_{Odiff}$ can be reduced, to some extent, by trading off a degraded return loss, or 2) the supply voltage AVD can be raised from the typical 0.9-1.0 V limit used for thin-oxide FETs in 40 nm technology to a value of 1.5 V or even higher. The second option can be used when output swing should be increased more that what the $R_{Odiff}$/return loss tradeoff can provide. This creates new design constraints, such as the desirability to interface a high-voltage output driver to a low-voltage pre-driver. Electrical overstress (EOS) should also be taken into consideration.

One problem that can occur with voltage-mode transmitters is electromagnetic interference (EMI). EMI can be a difficult issue to resolve. EMI compliance requirements are seldom overlooked by product engineering in the specification phase, and EMI compliance is often considered only as an afterthought. EMI requirements typically cannot be waived. EMI compliance difficulties can lead to very expensive last minute shielding solutions or to expensive redesigns.

SUMMARY OF THE DISCLOSURE

Embodiments of the invention advantageously address EMI. By tuning pull-up and/or pull-down resistances, rise and fall times of a non-inverting portion and an inverting portion of a differential signal can be well matched to reduce EMI. A higher launch amplitude enables the use of more equalization to compensate for printed circuit board (PCB) and transmission channel losses. Cheaper PCB materials or longer PCB traces can therefore be supported over lower launch amplitude transmitters. Likewise, longer channels can be supported for improved rack-to-rack connectivity.

An embodiment of the invention includes an apparatus, the apparatus including: an output driver configured to generate a differential output signal, wherein the output driver includes a first subcircuit and a second subcircuit, wherein the first subcircuit is configured to generate a positive-logic output signal of the differential output signal, wherein the first subcircuit includes one or more PMOS transistors configured to pull-up the positive-logic output signal for a first logic state of the differential output signal and one or more NMOS transistors configured to pull-down the positive-logic output signal for a second logic state opposite to the first logic state of the differential output signal; and wherein the second subcircuit is configured to generate a negative-logic output signal of the differential output signal, wherein the negative-logic output signal is inverted with respect to the positive-logic output signal, wherein the second subcircuit includes one or more PMOS transistors configured to pull-up the negative-logic output signal for the second logic state of the differential output signal and one or more NMOS transistors configured to pull-down the negative-logic output signal for the first logic state of the differential output signal; and a control circuit configured to provide gate voltages of the PMOS transistors and/or the NMOS transistors of the output driver such that a relationship between an amount of on resistance of the PMOS transistors as compared to an amount of on resistance of the NMOS transistors is tunable. In one embodiment, the gate voltages are further provided such that the PMOS and NMOS transistors are biased to the triode region and not to the saturation region.

An embodiment of the invention includes a method of reducing electromagnetic interference, wherein the method includes: generating, using an output driver, a differential output signal including, wherein the output driver includes a first subcircuit and a second subcircuit; generating, using the first subcircuit, a positive-logic output signal of the differential output signal, wherein the first subcircuit includes one or more PMOS transistors configured to pull-up the positive-logic output signal for a first logic state of the differential output signal and one or more NMOS transistors configured to pull-down the positive-logic output signal for a second logic state opposite to the first logic state of the differential output signal; and generating, using the second subcircuit, a negative-logic output signal of the differential output signal, wherein the negative-logic output signal is inverted with respect to the positive-logic output signal, wherein the second subcircuit includes one or more PMOS transistors configured to pull-up the negative-logic output signal for the second logic state of the differential output signal and one or more NMOS transistors configured to pull-down the negative-logic output signal for the first logic state of the differential output signal; and providing, using a control circuit, gate voltages of the PMOS transistors and/or the NMOS transistors of the output driver such that when switched on, a relationship between an amount of on resistance of the PMOS transistors as compared to an amount of on resistance of the NMOS transistors is tunable.

One embodiment of the invention includes an apparatus for reducing electromagnetic interference, wherein the apparatus includes: means for generating a differential output signal including, wherein the output driver includes a first subcircuit and a second subcircuit; means for generating, using the first subcircuit, a positive-logic output signal of the differential output signal, wherein the first subcircuit includes one or more PMOS transistors configured to pull-up the positive-logic output signal for a first logic state of the differential output signal and one or more NMOS transistors configured to pull-down the positive-logic output signal for a second logic state opposite to the first logic state of the differential output signal; and means for generating a negative-logic output signal of the differential output signal, wherein the negative-logic output signal is inverted with respect to the positive-logic output signal, wherein the second subcircuit includes one or more PMOS transistors configured to pull-up the negative-logic output signal for the second logic state of the differential output signal and one or more NMOS transistors configured to pull-down the negative-logic output signal for the first logic state of the differential output signal; and means for providing gate voltages of the PMOS transistors and/or the NMOS transistors of the output driver such that when switched on, a relationship between an amount of on resistance of the PMOS transistors as compared to an amount of on resistance of the NMOS transistors is tunable.

One embodiment of the invention includes an apparatus, wherein the apparatus includes: a first switching circuit configured to receive a differential data signal and a first bias voltage, wherein the first switching circuit is configured to convert the differential data signal to a first PMOS drive signal and a second PMOS drive signal for a first PMOS driver transistor and a second PMOS driver transistor, respectively, wherein the first switching circuit is configured to change a state of the first and second PMOS drive signals in response to a change in state of the data signal, wherein a first state of the first or second PMOS drive signal turns on the corresponding PMOS driver transistor and has a voltage level of the first bias voltage, wherein a second state of the first or second PMOS drive signal turns off the corresponding PMOS driver transistor; and a second switching circuit configured to receive the differential data signal and a second bias voltage, wherein the second switching circuit is configured to convert the differential data signal to a first NMOS drive signal and a second NMOS drive signal for a first NMOS driver transistor and a second NMOS driver transistor, wherein the second switching circuit is configured to change a state of the NMOS drive signal in response to a change in state of the data signal, wherein a first state of the first or second NMOS drive signal turns on the corresponding NMOS driver transistor and has a voltage level of the second bias voltage, and wherein a second state of the first or second NMOS drive signal turns off the corresponding NMOS driver transistor.

One embodiment of the invention includes an apparatus, wherein the apparatus includes: an output driver including: a first MOS transistor, wherein the first MOS transistor has a gate, a drain, and a source, wherein the source is electrically connected to a first voltage reference, wherein the drain is directly or indirectly electrically connected to a first driver output; a second MOS transistor, wherein the second MOS transistor has a gate, a drain, and a source, wherein the source is electrically connected to the first voltage reference, wherein the drain is directly or indirectly electrically connected to a second driver output; a switching circuit configured to receive a tunable bias voltage at a first node, a first input signal, and a second input signal, wherein the second input signal is a logical inverse of the first input signal, wherein the switching circuit is configured to generate a first drive signal at a second node and a second drive signal at a third node, wherein the first drive signal is applied to the gate of the first MOS transistor, wherein the second drive signal is applied to the gate of the second MOS transistor, the switching circuit including: a capacitive portion configured to propagate the first input signal and the second input signal to drive the second MOS transistor and the first MOS transistor, respectively; a first capacitor having a first end and a second end, wherein the first end is configured to receive the first input signal, wherein the second end is electrically connected to the third node such that the first capacitor propagates an AC-coupled version of the first input signal to the third node to activate the second MOS transistor in a first half cycle of the first input signal and to deactivate the second MOS transistor in a second half cycle of the first input signal; a second capacitor having a first end and a second end, wherein the first end is configured to receive the second input signal, wherein the second end is electrically connected to the second node such that the second capacitor propagates an AC-coupled version of the second input signal to the second node to activate the first MOS transistor in a first half cycle of the second input signal and to deactivate the first MOS transistor in a second half cycle of the second input signal; an active switching portion configured to receive the bias voltage, the first input signal and the second input signal, wherein the switching circuit is configured to eventually charge the first capacitor and the second capacitor to the bias voltage during the first half cycle of the first input signal and the second input signal, respectively, to the bias voltage; and a switch configured to receive the bias voltage and a control signal for the switch and to selectively provide the bias voltage to the first node of the switching portion such that when the switch is controlled to be on, the switching circuit provides the bias voltage for operation of the output driver. By half cycle, no implication is made that a signal is at 50% duty cycle. Rather, the data signals can carry data and have arbitrary bit patterns.

One embodiment of the invention includes a method for driving a transistor, wherein the method includes: receiving a differential data signal and a first bias voltage in a first switching circuit; converting, using the first switching circuit, the differential data signal to a first PMOS drive signal and a second PMOS drive signal for a first PMOS driver transistor and a second PMOS driver transistor, respectively; changing, using the first switching circuit, a state of the first and second PMOS drive signals in response to a change in state of the data signal, wherein a first state of the first or second PMOS drive signal turns on the corresponding PMOS driver transistor and has a voltage level of the first bias voltage, wherein a second state of the first or second PMOS drive signal turns off the corresponding PMOS driver transistor; receiving the differential data signal and a second bias voltage in a second switching circuit; converting, using the second switching circuit, the differential data signal to a first NMOS drive signal and a second NMOS drive signal for a first NMOS driver transistor and a second NMOS driver transistor; changing, using the second switching circuit, a state of the NMOS drive signal in response to a change in state of the data signal, wherein a first state of the first or second NMOS drive signal turns on the corresponding NMOS driver transistor and has a voltage level of the second bias voltage, and wherein a second state of the first or second NMOS drive signal turns off the corresponding NMOS driver transistor.

One embodiment of the invention includes a method for driving a transistor, wherein the method includes: providing an output driver including: a first MOS transistor, wherein the first MOS transistor has a gate, a drain, and a source, wherein the source is electrically connected to a first voltage reference, wherein the drain is directly or indirectly electrically connected to a first driver output; a second MOS transistor, wherein the second MOS transistor has a gate, a drain, and a source, wherein the source is electrically connected to the first voltage reference, wherein the drain is directly or indirectly electrically connected to a second driver output; receiving a tunable bias voltage at a first node, a first input signal, and a second input signal in a switching circuit, wherein the second input signal is a logical inverse of the first input signal; generating, using the switching circuit, a first drive signal at a second node and a second drive signal at a third node, wherein the first drive signal is applied to the gate of the first MOS transistor, wherein the second drive signal is applied to the gate of the second MOS transistor, wherein generating further includes: capacitively propagating the first input signal and the second input signal to drive the second MOS transistor and the first MOS transistor, respectively, using: a first capacitor having a first end and a second end, wherein the first end is configured to receive the first input signal, wherein the second end is electrically connected to the third node such that the first capacitor propagates an AC-coupled version of the first input signal to the third node to activate the second MOS transistor in a first half cycle of the first input signal and to deactivate the second MOS transistor in a second half cycle of the first input signal; a second capacitor having a first end and a second end, wherein the first end is configured to receive the second input signal, wherein the second end is electrically connected to the second node such that the second capacitor propagates an AC-coupled version of the second input signal to the second node to activate the first MOS transistor in a first half cycle of the second input signal and to deactivate the first MOS transistor in a second half cycle of the second input signal; receiving, using an active switching portion, the bias voltage, the first input signal and the second input signal; charging, using the switching circuit, the first capacitor and the second capacitor to the bias voltage during the first half cycle of the first input signal and the second input signal, respectively, such that when on in their respective first half cycles, the first MOS transistor and the second MOS transistor are biased; receiving, using a switch, the bias voltage and a control signal for the switch; and selectively providing, using the switch, the bias voltage to the first node of the switching portion such that when the switch is controlled to be on, the switching circuit provides the bias voltage for operation of the output driver.

One embodiment of the invention includes an apparatus for driving a transistor, wherein the apparatus includes: means for receiving a differential data signal and a first bias voltage; means for converting the differential data signal to a first PMOS drive signal and a second PMOS drive signal for a first PMOS driver transistor and a second PMOS driver transistor, respectively; means for changing a state of the first and second PMOS drive signals in response to a change in state of the data signal, wherein a first state of the first or second PMOS drive signal turns on the corresponding PMOS driver transistor and has a voltage level of the first bias voltage, wherein a second state of the first or second PMOS drive signal turns off the corresponding PMOS driver transistor; means for receiving the differential data signal and a second bias voltage; means for converting the differential data signal to a first NMOS drive signal and a second NMOS drive signal for a first NMOS driver transistor and a second NMOS driver transistor; means for changing a state of the NMOS drive signal in response to a change in state of the data signal, wherein a first state of the first or second NMOS drive signal turns on the corresponding NMOS driver transistor and has a voltage level of the second bias voltage, and wherein a second state of the first or second NMOS drive signal turns off the corresponding NMOS driver transistor.

One embodiment of the invention includes an apparatus for driving a transistor, wherein the apparatus includes: an output driver including: a first MOS transistor, wherein the first MOS transistor has a gate, a drain, and a source, wherein the source is electrically connected to a first voltage reference, wherein the drain is directly or indirectly electrically connected to a first driver output; a second MOS transistor, wherein the second MOS transistor has a gate, a drain, and a source, wherein the source is electrically connected to the first voltage reference, wherein the drain is directly or indirectly electrically connected to a second driver output; means for receiving a tunable bias voltage at a first node, a first input signal, and a second input signal, wherein the second input signal is a logical inverse of the first input signal; means for generating a first drive signal at a second node and a second drive signal at a third node, wherein the first drive signal is applied to the gate of the first MOS transistor, wherein the second drive signal is applied to the gate of the second MOS transistor, wherein the generating means further includes: first and second capacitors configured to propagate the first input signal and the second input signal to drive the second MOS transistor and the first MOS transistor, respectively, wherein: the first capacitor has a first end and a second end, wherein the first end is configured to receive the first input signal, wherein the second end is electrically connected to the third node such that the first capacitor propagates an AC-coupled version of the first input signal to the third node to activate the second MOS transistor in a first half cycle of the first input signal and to deactivate the second MOS transistor in a second half cycle of the first input signal; the second capacitor has a first end and a second end, wherein the first end is configured to receive the second input signal, wherein the second end is electrically connected to the second node such that the second capacitor propagates an AC-coupled version of the second input signal to the second node to activate the first MOS transistor in a first half cycle of the second input signal and to deactivate the first MOS transistor in a second half cycle of the second input signal; means for receiving the bias voltage, the first input signal and the second input signal; means for charging the first capacitor and the second capacitor eventually to the bias voltage during the first half cycle of the first input signal and the second input signal, respectively, such that when on in their respective first half cycles, the first MOS transistor and the second MOS transistor are biased; means for receiving the bias voltage and a control signal for the switch; and means for selectively providing the bias voltage to the first node of the switching portion such that when the switch is controlled to be on, the switching circuit provides the bias voltage for operation of the output driver.

One embodiment of the invention includes an apparatus including, wherein the apparatus includes: a first node configured to receive a voltage reference; a first current path including: a first MOS transistor of a first semiconductor type, wherein the first MOS transistor is a replica of a driver transistor of the first semiconductor type, wherein the driver transistor is configured to pull up or pull down a non-inverted or inverted signal of a differential signal for a driver; a plurality of resistors arranged in series with the first MOS transistor, wherein the plurality of resistors have a first end, a second end, and an intermediate node; an operational amplifier having a first input, a second input, and an output, wherein the first input is electrically connected to the first node, wherein the second input is electrically connected to the intermediate node, wherein the output is electrically connected to the gate of the first MOS transistor and is provided as a first bias voltage, wherein the operational amplifier is in a closed-loop feedback path such that a voltage at the first node is substantially equal to a voltage at the intermediate node.

One embodiment of the invention includes a method of generating a first bias voltage, wherein the method includes: receiving a voltage reference in a first node; forming a first current path, the first current path including: a first MOS transistor of a first semiconductor type, wherein the first MOS transistor is a replica of a driver transistor of the first semiconductor type, wherein the driver transistor is configured to pull up or pull down a non-inverted or inverted signal of a differential signal for a driver; a plurality of resistors arranged in series with the first MOS transistor, wherein the plurality of resistors have a first end, a second end, and an intermediate node; forming a closed-loop feedback path with an operational amplifier such that a voltage at the first node is substantially equal to a voltage at the intermediate node, the operational amplifier having a first input, a second input, and an output, wherein the first input is electrically connected to the first node, wherein the second input is electrically connected to the intermediate node, wherein the output is electrically connected to the gate of the first MOS transistor and corresponds to the first bias voltage.

One embodiment includes an apparatus for generating a first bias voltage, wherein the apparatus includes: a first node configured to receive a voltage reference; a first current path including: a first MOS transistor of a first semiconductor type, wherein the first MOS transistor is a replica of a driver transistor of the first semiconductor type, wherein the driver transistor is configured to pull up or pull down a non-inverted or inverted signal of a differential signal for a driver; a plurality of resistors arranged in series with the first MOS transistor, wherein the plurality of resistors have a first end, a second end, and an intermediate node; means for forming a closed-loop feedback path with an operational amplifier such that a voltage at the first node is substantially equal to a voltage at the intermediate node, the operational amplifier having a first input, a second input, and an output, wherein the first input is electrically connected to the first node, wherein the second input is electrically connected to the intermediate node, wherein the output is electrically connected to the gate of the first MOS transistor and corresponds to the first bias voltage.

BRIEF DESCRIPTION OF THE DRAWINGS

These drawings and the associated description herein are provided to illustrate specific embodiments of the invention and are not intended to be limiting.

FIG. 1A1 illustrates a conventional voltage-mode driver with both non-inverting and inverting portions for a differential signal shown.

FIG. 1A2 illustrates a simplified model of the non-inverting portion of the conventional voltage-mode driver illustrated in FIG. 1A1.

FIG. 1C1 illustrates a top-level view of a high-swing voltage mode transmitter according to an embodiment of the invention.

FIG. 1C2 illustrates a simplified model of the non-inverting portion of the transmitter illustrated in FIG. 1C1.

FIG. 1C3 illustrates a top-level view of a high-swing voltage mode transmitter according to another embodiment of the invention.

FIG. 1C4 illustrates a family of curves illustrating the linear region, also known as the triode or ohmic region, versus the saturation region.

FIG. 2 illustrates a conventional voltage-mode transmitter with impedance tuning banks.

FIG. 3A1 illustrates a conventional DC-coupled level shifter.

FIG. 3A2 illustrates waveforms for the level shifter of FIG. 3A1.

FIG. 3B1 illustrates a conventional capacitively-coupled level shifter.

FIG. 3B2 illustrates waveforms for the level shifter of FIG. 3B1.

FIG. 3C1 illustrates a level shifter according to an embodiment of the invention.

FIG. 3C2 illustrates waveforms for the level shifter of FIG. 3C1.

FIG. 3D1 illustrates a level shifter according to an embodiment of the invention, which corresponds to an inverse of the level shifter illustrated in FIG. 3C1.

FIG. 3D2 illustrates waveforms for the level shifter of FIG. 3D1.

FIG. 4 illustrates a high-swing voltage driver circuit.

FIG. 7A illustrates the output driver portion of the high-swing voltage mode transmitter illustrated earlier in FIG. 1C1.

FIG. 7B illustrates input drive signal to the output driver portion of FIG. 7A.

FIG. 7C illustrates output signals of the output driver portion of FIG. 7A in a condition with matched versus mismatched rise and fall times.

FIG. 7D illustrates a common-mode signal resulting from mismatched rise and fall times, which then gives rise to electromagnetic interference (EMI).

FIGS. 9E1 and 9E2 illustrate examples of a level shifter and a cascoded differential output stage.

FIG. 11A1 illustrates capacitively-coupled level shifter unit according to an embodiment of the invention.

FIG. 11A2 illustrates waveforms at various nodes of the capacitively-coupled level shifter unit of FIG. 11A1.

FIG. 12A1 illustrates normal output waveforms of the high-swing transmitter of FIG. 1C1.

FIG. 12A2 illustrates output waveforms of the high-swing transmitter of FIG. 1C1 before and after activation of the squelch mode.

FIG. 12B1 illustrates normal output waveforms of the high-swing transmitter of FIG. 1C1.

FIG. 12B2 illustrates output waveforms of the high-swing transmitter of FIG. 1C1 before and after deactivation of the squelch mode.

DETAILED DESCRIPTION OF SPECIFIC EMBODIMENTS

Figure 1B:
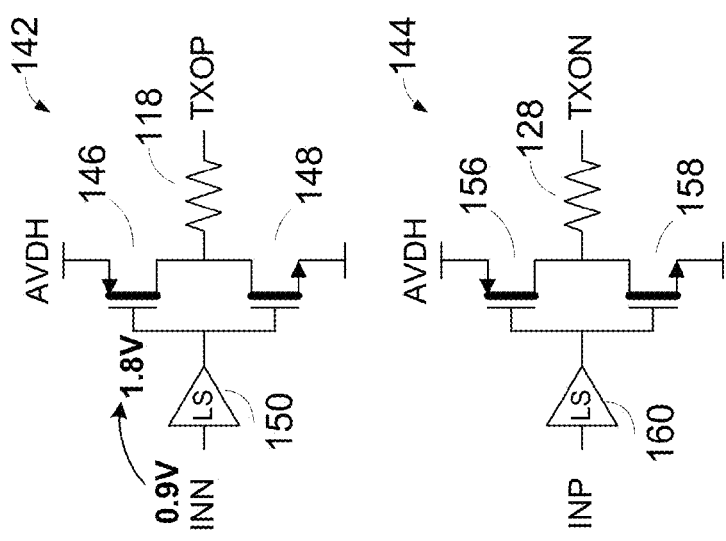
FIG. 1B illustrates a conventional voltage-mode transmitter for high-swing applications, wherein transistors with thick oxide layers are used and a level-shifter is used to drive the transistors.

Although particular embodiments are described herein, other embodiments of the invention, including embodiments that do not provide all of the benefits and features set forth herein, will be apparent to those of ordinary skill in the art.

In this description, reference is made to the drawings in which like reference numerals indicate identical or functionally similar elements.

The field-effect transistors (FETs) or "transistors" described herein can correspond to transistors known as metal-oxide-semiconductor field-effect transistors (MOSFETs). While the terms "metal" and "oxide" are present in the name of a MOSFET device, it will be understood that these transistors can have gates made out of materials other than metals, such as polysilicon, and that the dielectric oxide region can also be implemented not just with silicon dioxide, but with other dielectrics, such as high-k dielectrics. For example, reference in the description is made to "thin oxide" and to "thick oxide," and it will be understood that these regions can be implemented with materials other than silicon dioxide.

Electromagnetic Interference (EMI)

Companies that integrate point-to-point links typically instantiate many channels in parallel. The presence of more channels results in more EMI radiated, which can cause errors during data transmission. Those companies therefore set tight EMI specifications and keep a close eye on the amount of common-mode noise generated by the transmitter. A transmitter generating too much common-mode noise can make the overall system fail an EMI specification. It can therefore be desirable to keep common-mode noise low over PVT variations, especially for relatively large output swings.

One source of EMI occurs in the context of transmission of differential signals. Examples of high-speed serial interfaces currently in use are high speed USB, XAUI, Fiber-channel, Infiniband, serial ATA (SATA), serial attached SCSI (SAS), Gigabit Ethernet, SFP, XFI, and the like. These high-speed interfaces typically start from half a Gigabit per second (Gb/sec) and are now offering more than 10 Gb/sec data rates, with future information rates of over the 25 Gb/s, even 40 Gb/sec on a single high-speed input/output device (HSIO), such as a serializer/deserializer (SERDES). These interfaces use differential signal lines to carry high-speed digital data.

Differential signaling has several advantages over single-ended signaling. A differential signal is carried with two conductors to convey the signal from the transmitter to the receiver. When received at the receiver, the signal is more immune to noise as noise sources tend to affect both conductors carrying the signal in a similar fashion. While a receiver can reject the common mode signal on a pair of signal lines, radiation of the common mode signal can cause EMI.

Mismatches in rise and fall times are a problem for high speed transmitters. Mismatches in the rise and fall time give rise to high common mode signals, which results in EMI. See, for example, commonly-owned U.S. patent application Ser. No. 12/627,345, filed Nov. 30, 2009, the disclosure of which is hereby incorporated by reference in its entirety herein. Techniques disclosed herein can improve the matching of the rise and fall times of differential signals, thereby reducing common mode signals and advantageously reducing EMI.

High-Swing Architecture

FIG. 1A1 illustrates a conventional voltage-mode driver with both a positive-logic or true portion 102 and a negative-logic or false portion 104 for driving a differential signal. The conventional driver of FIG. 1A1 is an example of a low-swing architecture.

Figure 4:
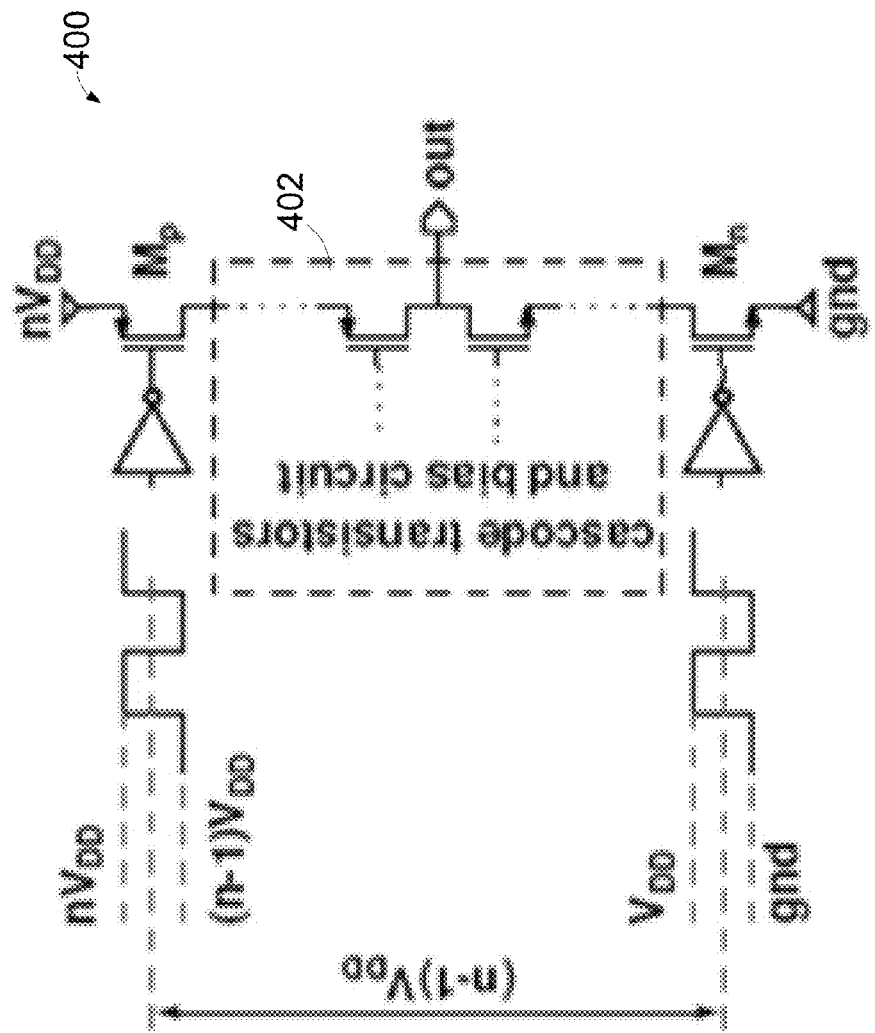

The positive-logic portion 102 receives an inverted input signal INN' and generates a positive-logic output signal TXOP. The positive-logic portion 102 includes a pre-driver 112, which is illustrated as a buffer, but can alternatively be an inverter, a p-channel MOSFET (PMOS transistor) 114, an n-channel MOSFET (NMOS transistor) 116, and a termination resistor 118. During operation, each of the PMOS transistor 114 and the NMOS transistor 116 turns on or off to generate the output signal TXOP. When "on," the PMOS transistor 114 and the NMOS transistor 116 are in the triode or linear region, which is also known as the ohmic region. FIG. 1C4 illustrates a family of curves illustrating the linear region versus the saturation region. Typically, the negative-logic portion 104 is identical to the positive-logic portion, except for the connections. The negative-logic portion 104 includes a pre-driver 122, a PMOS transistor 124, an NMOS transistor 126, and a resistor 128. The termination resistors 118, 128 are for transmitter-side or source-side termination.

Figure 1D:
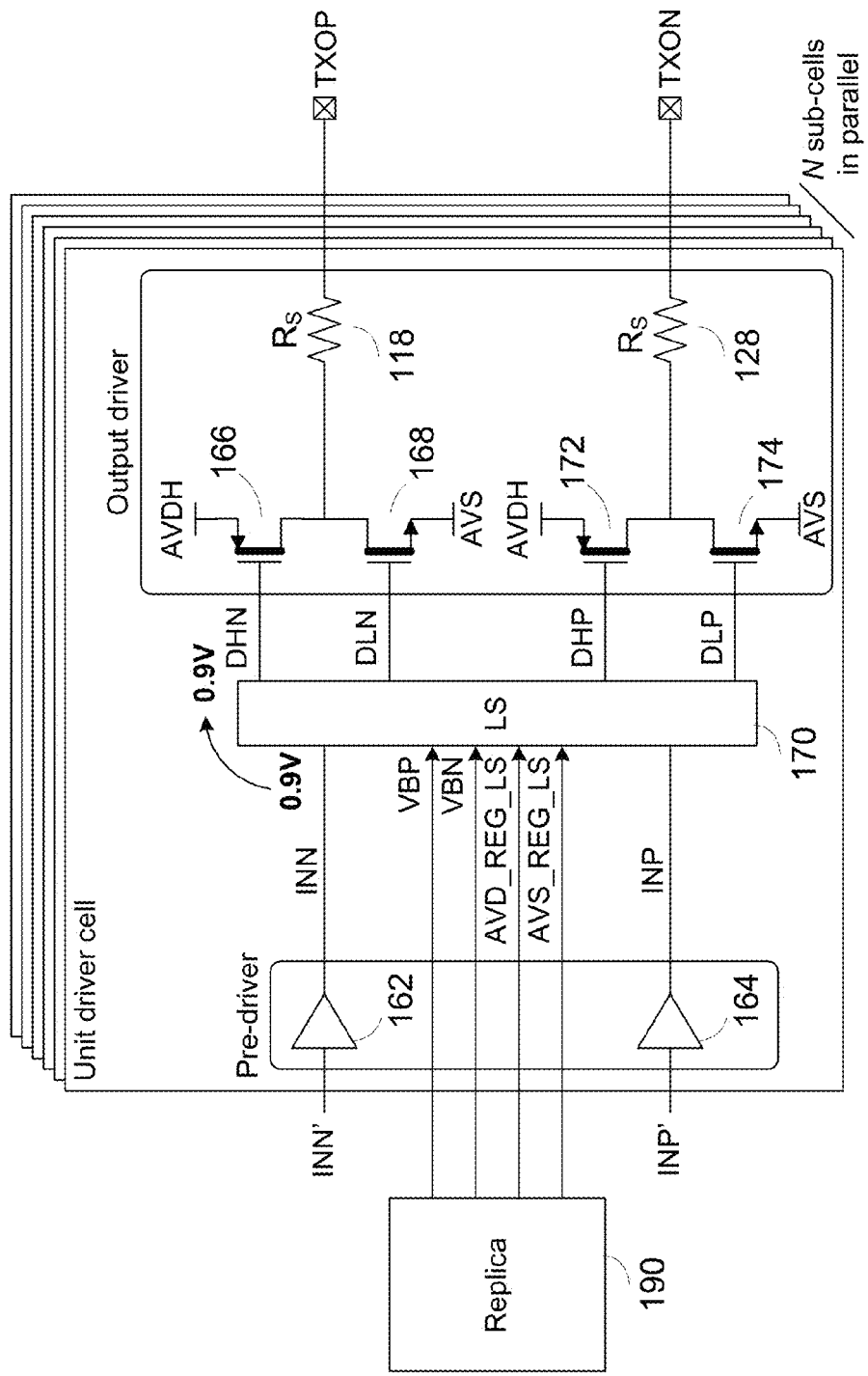
FIG. 1D illustrates a scalable high-swing transmitter with rise/fall time mismatch compensation according to an embodiment of the invention.
Figure 2:
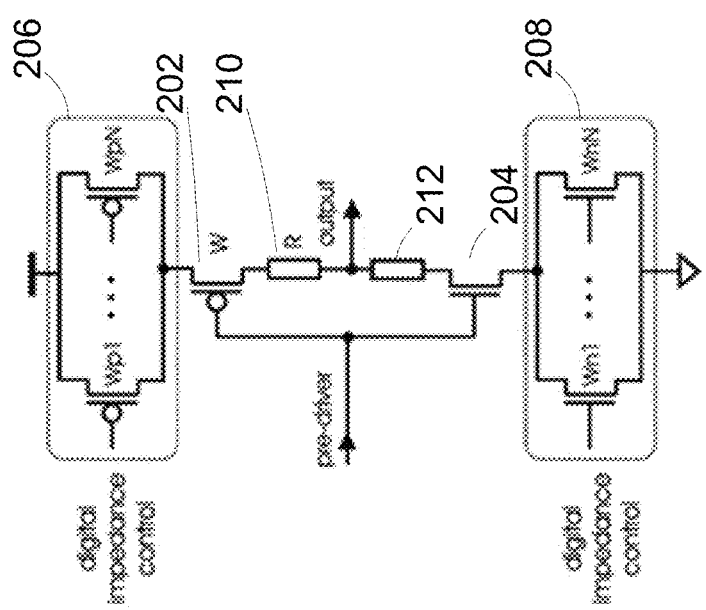

FIG. 1A2 illustrates a simplified model 106 of the positive-logic portion 102 of the conventional voltage-mode driver illustrated in FIG. 1A1. A resistor block $R_P$ 134 models the "on" resistance from drain to source or "$R_{Dson}$" of the PMOS transistor 114. A resistor block $R_N$ 136 models the "on" resistance of the NMOS transistor 116. Typically, these two "on" resistances would not be on at the same time. A termination resistor $R_S$ models transmitter-side termination resistance and a capacitor C models parasitic capacitance at the transmitter end.

FIG. 1B illustrates a conventional voltage-mode transmitter for high-swing applications. Again, the positive-logic portion 142 and the negative-logic portion 144 are identical to each other, save for the connections. In connection with the positive-logic portion 142, to increase the voltage swing over the configuration illustrated in FIG. 1A1, a PMOS transistor 146 and a NMOS transistor 148 have thicker oxide regions than the PMOS transistor 114 and the NMOS transistor 116 (FIG. 1A1) for higher voltage handling capability. The greater oxide thickness is illustrated in the drawing by a thick line from drain to source. In one example, with thin oxide FETs of 40 nanometer (nm) technology, the typical supply voltage limit is around 0.9 volts. With thicker oxide regions, a FET can handle higher voltages, such as around 1.5 volts, 1.8 volts, etc. In the illustrated embodiments, the general digital logic circuits with thin oxide FETs are powered from a supply voltage AVD, and the thicker oxide FETs are powered from a supply voltage AVDH, which is higher than the supply voltage AVD. In one example, general digital logic circuits can be supplied with 0.9 volts for digital supply AVD, and a supply voltage AVDH or voltage reference of 1.8 volts, intended for analog circuits, can be used for the PMOS transistor 146 and the NMOS transistor 148 of the high-swing voltage-mode transmitter to make the higher output swing possible. The sources of the PMOS transistors 146, 156 are coupled to the supply voltage AVDH, and the sources of the NMOS transistors 148, 158 are coupled to ground, which is indicated as AVS. Other voltage references than AVDH and AVS can alternatively be used. A level shifter 150 provides appropriate gate voltages to drive the PMOS transistor 146 and the NMOS transistor 148. Conventional examples of the level shifter 150 will be described in greater detail later in connection with FIGS. 3A1 and 3B1.

The negative-logic portion 144 includes a PMOS transistor 156, an NMOS transistor 158, a level shifter 160, and the resistor 128. Aside from being logically inverted from the positive-logic portion 142 due to the phase of the input signals INN, INP, the negative-logic portion 144 operates in an identical manner.

Tunable Bias Level

FIG. 1C1 illustrates a top-level view of a high-swing voltage mode transmitter according to an embodiment of the invention. The transmitter includes pre-drivers 162, 164, a tunable-output level shifter 170, and an output driver. The pre-drivers 162, 164 can be implemented as multiplexers (MUXes) as will be described later in connection with FIG. 5A. While the illustrated pre-drivers 162, 164 are shown as non-inverting buffers, inverters can alternatively be used with appropriate phase inversions elsewhere. Signals INN', INP' are provided as inputs to the pre-drivers 162, 164, which buffer the signals to generate the input signals INN, INP, which are functionally the same as the input signals INN', INP' but are different voltage nodes. The positive-logic portion of the output driver includes a PMOS driver transistor 166, an NMOS driver transistor 168, and the termination resistor 118. The negative-logic portion of the output driver includes a PMOS transistor 172, an NMOS transistor 174, and the resistor 128. For high swing capability, the driver transistors 166, 168, 172, 174 are fabricated with thicker gate "oxide" regions than transistors used for digital circuits, such as for the pre-drivers 162, 164.

As illustrated in FIG. 1C1, the level shifter 170 has an input for a bias control. While conceptually illustrated in FIG. 1C1 with a single line, the bias control can include more than one signal as will be described later in connection with FIG. 1D. The conventional level shifters 150, 160 described earlier in connection with FIG. 1B shifted drive levels to the driver transistors 146, 148, 156, 158 (FIG. 1B) from 0 to 0.9 volts to toggle between 0 and 1.8 volts for an amplitude of 1.8 volts, that is, with the amplitude of the analog supply voltage AVDH. In contrast, the level shifter 170 toggles the drive levels that vary with the bias control, which will be discussed later in connection with bias voltages VBN, VBP.

For example, for the case in which the analog supply voltage AVDH is about 1.8 volts, the level shifter 170 can toggle the drive level between about 1.8 volts and 0.9 volts for the PMOS driver transistors 166, 172 and between about 0 and 0.9 volts for the NMOS driver transistors 168, 174. Advantageously, the drive level for the "on" condition (PMOS or NMOS transistor on, not necessarily logic state on) can be adjusted to change the "on" resistance of the driver transistors

166, 168, 172, 174. While the change in conductivity of a FET that is operating in the triode region is not as dramatic with gate voltage as it is for a FET that is operating in the saturation region, the gate voltage does have an effect on the "on" resistance of a FET operating in the triode region.

FIG. 1C2 illustrates a simplified model of the non-inverting portion of the transmitter illustrated in FIG. 1C 1. The model includes the pre-driver 162, the level shifter 170, a resistor $R_P$ 176 modeling the PMOS driver transistor 166, a resistor $R_N$ 178 modeling the NMOS driver transistor 168, the termination resistor $R_S$, and the capacitor C. The termination resistor $R_S$ and the capacitor C are as described earlier in connection with FIG. 1A2.

The resistor $R_P$ 176 models the "on" resistance of the PMOS driver transistor 166, which corresponds to the pull-up resistance during operation. The resistor $R_N$ 178 models the "on" resistance of the NMOS driver transistor 168, which corresponds to the pull-down resistance during operation. Typically, these two "on" resistances would not be on at the same time. As indicated by the slanted arrow within the resistors 176, 178, the "on" resistances are tunable. In a conventional voltage-mode transmitter such as the examples illustrated earlier in connection with FIGS. 1A1, 1A2, and 1B, these "on" resistances are not controlled and can vary significantly over process, voltage, and temperature (PVT). Because the "on" resistance can vary over PVT, this is likely to create a mismatch of the pull-up and pull-down strengths, which in turn is likely to create a mismatch of the rise and fall times, which results in EMI.

Embodiments of the invention permit the pull-up and pull-down resistances to be relatively well matched, which improves the matching of the rise and fall times, which improves EMI performance. With reference to FIG. 1C1, it should be noted that it is the matching of the rise time of the TXOP signal with the fall time of the TXON signal, and the matching of the rise time of the TXON signal with the fall time of the TXOP signal that should be relatively well matched for low common mode generation and the resulting good EMI performance. However, the two PMOS driver transistors 166, 172 illustrated in FIG. 1C1 can be expected to track each other closely through PVT variations because they are identical to each other, and similarly, the two NMOS driver transistors 168, 174 can also be expected to track each other closely through PVT variations. Good layout techniques will help keep good matching between the two PMOS (or NMOS) transistors. Accordingly, while the disclosed techniques match the rise and fall times within a driver for a single line TXOP or TXON, because of the matching of the PMOS driver transistors 166, 172 and the NMOS driver transistors 168, 174, such techniques result in matching of the rise and fall times across the signals TXOP and TXON.

As will be explained later in connection with FIGS. 1D, 3C1, and 3D1, a bias control input to the level shifter 170 indicates control of the "on" level of the data high positive logic signal DHP, data high negative logic signal DHN, data low positive logic signal DLP, and data low negative logic signal DLN from the level shifter 170 that drive the PMOS driver transistor 172, the NMOS driver transistor 174, the PMOS driver transistor 166, and the NMOS driver transistor 168, respectively. When "on," at least one of the PMOS transistor or the NMOS transistors can be adjustably "on" within the triode region for control of at least one of rise or fall times such that rise and fall times match for relatively good EMI performance.

Equation 2 and Equation 3 illustrate the proportionality (∝) of rise time tr and fall time tf to the capacitance and various resistances of the model illustrated in FIG. 1C2.

$$tr \propto (R_P + R_S) \cdot C \qquad \text{Equation 2}$$

$$tf \propto (R_N + R_S) \cdot C \qquad \text{Equation 3}$$

FIG. 1C3 illustrates a top-level view of a high-swing voltage mode transmitter according to another embodiment of the invention. The embodiment illustrated in FIG. 1C3 is identical to the embodiment illustrated in FIG. 1C1 except that the termination resistors 118, 128 are split into resistors 182, 184, 186, 188. The resistance values can remain the same, and the model of FIG. 1C2 can still be applicable, but it is also possible for the resistance values to differ and the difference in resistance made up via adjustment of the pull-up resistance $R_P$ or the pull-down resistance $R_N$.

In yet another alternative embodiment, the transistors 166, 168, 172, 174 (FIG. 1C1 or 1C3) can be replaced with a cascoded output stage as will be explained later in connection with FIG. 4.

FIG. 1D illustrates a scalable high-swing transmitter with rise time and fall time mismatch compensation according to an embodiment of the invention. In the illustrated embodiment, the driver for the high-swing transmitter is implemented with N number of unit driver cells. The value for N can vary in a very wide range. In one embodiment, the number N corresponds to 48, but other values will be readily determined by one of ordinary skill in the art. In one embodiment, the N unit driver cells are each of the same scale. In other embodiments, the N unit driver cells can have at least two different scales, such as 8×, 4×, 2×, and 1× cells. In addition, the N unit driver cells can be enabled/disabled individually and/or in groups.

A selected number, at least 1, of the N paralleled unit driver cells are enabled during operation. The number to be enabled depends on the desired output swing voltage. The higher the number of unit driver cells enabled, the lower the pull-up and pull-down resistances and the higher the output swing. Different cells can drive different patterns through the pre-drivers 162, 164 (FIG. 5A) so as to add de-emphasis. For more details on the voltage-mode transmitter structure, refer U.S. Pat. No. 7,501,851, which is incorporated by reference herein. For example, with reference to Equation 1, the resistance $R_{Odiff}$ can correspond approximately to the average of $R_P$ and $R_S$ and $R_N$ and $R_S$, as illustrated in Equation 4, which can then be substituted into Equation 1 to estimate the voltage swing. In Equation 4, N corresponds to the number of cells.

$$R_{Odiff} \approx \frac{(R_P + R_S) + (R_N + R_S)}{N} \qquad \text{Equation 4}$$

In the illustrated embodiment, a replica circuit 190 generates bias voltages VBP and VBN for control of the "on" levels of both the PMOS driver transistors 166, 172 and the NMOS driver transistors 168, 174, and optionally generates AVD_REG_LS and AVS_REG_LS, which correspond to regulated voltages for power, which can be useful in combination with squelching as will be explained later in connection with FIG. 11B. By control of the "on" levels, the pull-down resistance $R_P$ can be adjusted relative to pull-down resistance $R_N$, which can then improve the matching between rise and fall times and improve EMI performance. In one embodiment, the pull-down resistance $R_P$ matches the pull-down resistance $R_N$ within 2%, thereby making the rise and fall times match within 2%. Other amounts of matching, such as, but not limited to 3%, 5%, and 10% will also be applicable.

In alternative embodiments, fewer or additional bias voltages can be used. For example, in an alternative embodiment, one of the rise time or the fall time can be left alone, and the other adjusted to match.

While described above with selection of the number of unit drivers being enabled being performed first and the bias levels for the relative resistance being adjusted later, the order of operation can be interchanged. For example, the relative amount of pull-up resistance $R_P$ versus pull-down resistance $R_N$ can be adjusted first, and then the number of unit driver cells selected later.

By contrast, FIG. 2 illustrates a conventional voltage-mode transmitter with impedance tuning banks See, for example, M. KOSSEL, A T-coil-enhanced 8.5 Gb/s high-swing SST transmitter in 65 nm bulk CMOS with <−16 dB return loss over 10 GHz bandwidth, IEEE J. Solid-State Circuits, vol. 43, no. 12, pp. 2905-2920, December 2008. Rather than coupling the sources of a PMOS transistor 202 and an NMOS transistor 204 to voltage rails, additional transistors 206, 208 are disposed in the power path between the PMOS transistor 202 and a first power rail, and between the NMOS transistor 204 and a second power rail. FIG. 2 also illustrates an alternative configuration for termination resistors 210, 212.

By turning on a selected number of these additional transistors 206, 208, the impedance at the output can be varied. One disadvantage of the conventional art is that the impedance can be varied only in discrete steps by activating or deactivating transistors 206, 208. By contrast, in certain embodiments of the invention, the pull-up resistance $R_P$ and the pull-down resistance $R_N$ can be adjusted in an analog manner without having to resort to relatively discrete steps. Even when combined with control from a digital-to-analog converter, the step size can be smaller than that of activating or deactivating transistors 206, 208. This can permit better matching of rise and fall times.

Level Shifters

FIG. 3A1 illustrates a conventional DC-coupled level shifter 300. FIG. 3A2 illustrates waveforms for the level shifter 300 of FIG. 3A1. As illustrated in FIG. 3A2, the level shifter 300 not only shifts the input signals INP, INN, but also amplifies them to generate the output signals OUTP, OUTN. It is difficult to maintain good signal integrity and matched rise/fall times in a level-shifter that amplifies, thereby limiting its use in relatively low-speed applications.

FIG. 3B1 illustrates a conventional capacitively-coupled level shifter 320. FIG. 3B2 illustrates waveforms for the level shifter 320 of FIG. 3B1. The level shifter 320 uses both active and passive devices and exhibits higher operating speeds than the level shifter 300 of FIG. 3A1. See B. SERNEELS, ET. AL., A high speed, low voltage to high voltage level shifter in standard 1.2V 0.13 µm CMOS, 13th IEEE International Conference on Electronics, Circuits and Systems, pp. 668-671, 2006. In contrast to Serneels's level shifter, the disclosed level shifter permits fine tuning of the "on" resistance for relatively good EMI performance.

FIG. 3C1 illustrates a capacitively-coupled portion of a first level shifter 340 according to an embodiment of the invention. The first level shifter 340 has a first coupling capacitor 342, a second coupling capacitor 344, a first NMOS transistor 346, a second NMOS transistor 348, and a third NMOS transistor 350. The third NMOS transistor 350 operates as an enable switch. In the illustrated embodiment, the first level shifter 340 is provided with input signals INP, INN, a data enable signal DEN for control, and a bias voltage VBP as inputs. The first level shifter 340 generates the data high positive logic signal DHP and the data high negative logic signal DHN as outputs. The input signals INP, INN are out of phase by 180 degrees with respect to each other. These signals DHP, DHN are applied as inputs to PMOS driver transistors 166, 172 of the output driver (FIG. 1D). To turn off a PMOS transistor, its gate is pulled up. To turn on a PMOS transistor, its gate voltage is pulled down. To tune the relative impedance of a PMOS transistor when it is on, its gate voltage is pulled down to the bias voltage VBP, which can be adjusted as described following a description of a second level shifter 360 illustrated in FIG. 3D1.

FIG. 3D1 illustrates a second level shifter 360 that is an inverse of the first level shifter 340 of FIG. 3C1. The second level shifter 360 has a first coupling capacitor 362, a second coupling capacitor 364, a first PMOS transistor 366, a second PMOS transistor 368, and a third PMOS transistor 370. The third PMOS transistor 370 operates as an enable switch. In the illustrated embodiment, the second level shifter 360 is also provided with input signals INP, INN, an inverted data enable signal DEN for control, and a bias voltage VBN as inputs. The second level shifter 360 generates the data low positive logic signal DLP and the data low negative logic signal DLN as outputs. These signals DLP, DLN are applied as inputs to the NMOS driver transistors 168, 174 of the output driver (FIG. 1D). To turn off an NMOS transistor, its gate is pulled down. To turn on an NMOS transistor, its gate voltage is pulled up. To tune the relative impedance of an NMOS transistor when it is on, its gate voltage is pulled up to the bias voltage VBN, which can be adjusted.

When the level shifters 340, 360 are enabled via activation of the enable switches 350, 370, the bias voltages VBP, VBN are operative to tune the effective drive level $V_{eff}$ for the driver transistors 166, 168, 172, 174 (FIG. 1D), which in turn affects the "on" resistance in the triode region as expressed in Equation 5. In Equation 5, $\mu_n$ corresponds to the charge-carrier mobility, W is the gate width, L is the gate length, and $C_{ox}$ is the gate oxide capacitance per unit area.

$$R_{on} = \frac{1}{\mu_n C_{ox} \frac{W}{L} V_{eff}} \qquad \text{Equation 5}$$

Transistors 350, 370, when disabled, eliminate the positive feedback of the cross coupled transistors 346, 348 and transistors 366, 368, respectively. The positive feedback is useful in normal mode and in squelch mode because it helps maintain DHP/DHN and DLP/DLN differential. When in the disabled mode (DEN not asserted), on the other hand, the gates of the PMOS and NMOS transistors of the output driver should be pulled up and down, respectively, by a DC path, which will be discussed later in connection with another embodiment, so as to put the output driver in a high-impedance state. Having a state in which the data high signals DHP, DHN are equal to each other and the data low signals DLP, DLN are equal to each other is possible with the positive feedback killed, that is, with DEN=0.

Returning now to FIG. 3C1, the first level shifter 340 is enabled when the enable signal DEN is high and disabled otherwise. When enabled, the third NMOS transistor 350 is on, and a node N1 is biased approximately equal to the bias voltage VBP if the third NMOS transistor 350 is sized sufficiently large. When not enabled, the third NMOS transistor 350 is off, and the bias voltage VBP is not applied to the node N1. In an alternative embodiment wherein enabling is not used, the bias voltage VBP can be applied directly to the node N1. This bias voltage VBP is the voltage that is tuned to control the gate voltage of the PMOS driver transistors 166, 172 (FIG. 1D) to a particular level for control of their "on" resistance. The tuning of the level VOL is illustrated by the double-headed arrow in the waveforms of FIG. 3C2. The bias voltage VBN correspondingly can be adjusted to control the "on" resistance of the NMOS driver transistors 168, 174 (FIG. 1D) as illustrated by the double-headed arrows in the waveforms of FIG. 3D2. The following operational description assumes that the level shifters 340, 360 are enabled. Operationally, at high speeds, the AC-coupled level shifter 340 can be simplified to the first coupling capacitor 342 and the second coupling capacitor 344, which drive on or off the PMOS driver transistors 166, 172 (FIG. 1D). At high speeds, the transistors 346, 348 do not operate fast enough to drive on or off the PMOS driver transistors 166, 172 (FIG. 1D); rather, the signal is propagated through the AC coupled path. However, over a long time constant, the transistors 346, 348 set the VOL voltage level (FIG. 3C2) of the data high positive logic signal DHP and the data high negative logic signal DHN by providing a charging path for the capacitors 342, 344. For example, when the input signal INP is high, the input signal INN is low, and the enable switch 350 is on or enabled, the transistor 346 is on and provides a path for charging the capacitor 344 to the bias voltage VBP. When INN goes from low to high, DHN goes from the bias voltage VBP (the VOL level in FIG. 3C2) to "VBP+(coupling efficiency*AVD)," which is the VOH level in FIG. 3C2." Due to the parasitic capacitance in the path from the data high negative logic signal DHN to the bias voltage VBP and the drain-to-source resistance of the transistors 350, 346, it will typically take many cycles for the capacitor to charge to the bias voltage VBP. Given that transistors 346, 348 are active devices and could potentially cause signal distortion and/or ISI, it is actually desirable to not have the transistors 346, 348 play an effective role in driving the PMOS driver transistors 166, 172 (FIG. 1D) and instead, let the signals propagate through the AC paths undistorted. Given that transistors 346, 348 only function to set the level VOL, in one embodiment, the transistors 346, 348 can be as small as practical so as to minimize parasitic effects on the data high signals DHP, DLH and to improve coupling efficiency. For example, the transistors 346, 348 can be the smallest geometry devices available under the fabrication process.

In one embodiment, a coupling efficiency of 80 to 90% can be used to have the voltage level VOH depicted in FIG. 3C2 sufficiently high so as to turn the PMOS transistor of the driver stage sufficiently off. Likewise, a relatively good coupling efficiency will assure that the voltage level VOL depicted in FIG. 3D2 is sufficiently low so as to turn the NMOS transistor of the driver stage sufficiently off. The amount of coupling efficiency used can depend on the threshold voltage of the transistors 166, 168, 172, 174 (FIG. 1D) used in the driver stage, which in turn depends on the process technology, for example, 40 nm, and the type of transistors (thin oxide vs. thick oxide). For example, with reference to Equation 6, a coupling efficiency of 90% can be obtained if the coupling capacitors 342, 344, 362, 364 are about 9 times larger than the load capacitance on nodes carrying the signals DHN and DHP. Note that the load capacitance includes the parasitic capacitance of transistors 346, 348, 366, 368, 1122, 1124, 1126, 1128 (FIGS. 3C1, 3D1, 11B) (hence the desirability for these transistors to be small), the routing capacitance from the level shifters 340, 360 to the output stage transistors, and the gate capacitance of the output stage transistors 166, 168, 172, 174. For a coupling efficiency of 80%, the amount of coupling capacitance should be about 4 times larger than load capacitance.

With the nodes N1, N2 clamped to the bias voltage VBP, VBN, respectively, by the enable switches 350, 370, the operation of the transistors 346, 348, 366, 368 to control the VOL/VOH voltages for the data high signals DHP, DHN and the data low signals DLP, DLN will now be described. The order of operation is presented in the order of the positive logic output signal TXOP being asserted high, the positive logic output signal TXOP being asserted low, the negative logic output signal TXON being asserted high, and the negative logic output signal TXON being asserted low.

The positive logic output signal TXOP is asserted high as follows. With an input symbol transitions from a 0 to 1 such that the input signals INP, INN transition from (0,1) to (1,0), the following occurs with reference to the first level shifter 340. The transition from 0 to 1 for the input signal INP is capacitively coupled via the first coupling capacitor 342 over to the data high positive logic signal DHP and to the gate of the first NMOS transistor 346. This turns on the first NMOS transistor 346 and turns off the PMOS driver transistor 172 (FIG. 1D), permitting the NMOS driver transistor 168 to control the negative logic output signal TXON. The input signal INN transitions from 1 to 0, and the capacitor 344 capacitively couples the transition to the data high negative logic signal DHN, which then turns on the PMOS driver transistor 166 to generate a "high" or "1" for the positive logic output signal TXOP. The level VOL of the data high negative logic signal DHN determines the on resistance of the PMOS driver transistor 166 when turned on to the triode region. The settling of the level VOL will now be discussed.

Since the input signal INN transitions from 1 to 0, with logic state 0 being ground for the illustrated embodiment, the capacitor 344 then is momentarily connected between the data high negative logic signal DHN and ground. Returning to the first NMOS transistor 346 being on, by turning on the first NMOS transistor 346, the data high negative logic signal DHN is momentarily connected to the bias voltage VBP through the following path: the first NMOS transistor 346, to the node N1, and to third NMOS transistor 350. Over time, the bias voltage VBP charges across the capacitor 344 and makes the level VOL (DHN) converge to the bias voltage VBP. Thus, the capacitor 344 can AC couple or capacitively couple over the input signal INN to the data high negative logic signal DHN with the VOL of the DHN signal (FIG. 3C2) tunable for the desired on resistance for the driver transistor 166 (FIG. 1D) by tuning of the bias level VBP.

In the illustrated embodiment, the connection from the data high negative logic signal DHN to the bias voltage VBP is present only when a '1' is transmitted. At startup, depending on the initial charge across the capacitor 342, $VOL_{DHN}$ might be far away from the bias voltage VBP, and it will typically take many bit periods for the two to converge given the small size of the first NMOS transistor 346 and its high on-resistance. Meanwhile, the data high negative logic signal DHN will toggle between VOH and VOL (due to the AC coupling cap) with VOL slowly converging to the bias voltage VBP. For example, in one embodiment, it can take on the order of a few microseconds for the VOL portion (FIG. 3C2) to stabilize at the bias voltage VBP. The time it takes to stabilize can vary in a very broad range and will depend on various "on" resistances of the transistors, the parasitic capacitances involved, the data rate, and the bit pattern. If a feedback loop is used to set the bias voltage VBP, this settling time should be accounted for in the loop stability analysis. The corresponding transition from 1 to 0 for the input signal INN is capacitively coupled via the second coupling capacitor 344 to create a 1-0 transition on the data high negative logic signal DHN. The data high negative logic signal DHN is simultaneously pulled low through the first NMOS transistor 346, the first node N1, and the third NMOS transistor 350, as explained above, and through the second AC coupling capacitor 344. Both paths work in parallel, with the pull-down path to the bias voltage VBP being configured to set the levels $VOL_{DHN}$ equal to the bias voltage VBP (with a long time constant), and the AC coupling capacitor being configured to couple the 0-1 and 1-0 transitions. Meanwhile, the second NMOS transistor 348 is off due to the 1-0 transition of the input signal INN and the data high negative logic signal DHN having toggled low. While the convergence of the level VOL (FIG. 3C2) may be relatively slow, the switching of voltage via capacitively coupling across a capacitor occurs virtually instantaneously.

With the data high negative logic signal DHN low, the second NMOS transistor 348 is off and the pull-down path of the data high positive logic signal DHP, to the node N1, to the bias voltage VBP is disabled. In the illustrated embodiment, the high level state of the data high positive logic signal DHP is set by the AC-coupled path and can remain high since there is no discharge path for the charges (the pull-down path is off and the data high positive logic signal DHP is connected to the gate of the PMOS driver transistor 172 in FIG. 1D). In addition, due to the conduction that occurs when the first NMOS transistor 346 is on, the second coupling capacitor 344 eventually charges to a voltage equal to the difference in voltage between (a) the bias voltage VBP and (b) the voltage for logic 0, which is typically 0 V, such that the voltage charged to is about VBP. Thus, in the illustrated embodiment, the second coupling capacitor 344 typically charges to the bias voltage VBP, which is then used for a subsequent cycle.

The positive logic output signal TXOP is asserted low as follows. With an input symbol transition from a 1 to a 0 such that the input signals INP, INN transition from (1,0) to (0,1), the following occurs with reference to the second level shifter 360. The transition from 1 to 0 for the input signal INP is capacitively coupled via the first coupling capacitor 362 over to the data low positive logic signal DLP and to the gate of the first PMOS transistor 366. This turns on the first PMOS transistor 366 and turns off the NMOS driver transistor 174 (FIG. 1D), permitting the PMOS driver transistor 172 to control the negative-logic output signal TXON.

The input signal INN transitions from 0 to 1, and the capacitor 364 capacitively couples the transition to the data low negative logic signal DLN, which then turns on the NMOS driver transistor 168 (FIG. 1D) to generate a "low" or "0" for the positive logic output signal TXOP. The level VOH (FIG. 3D2) of the data low negative logic signal DLN determines the on resistance of the NMOS driver transistor 168 (FIG. 1D) when turned on to the triode region. The settling of the level VOH will now be discussed.

Since the input signal INN transitions from 0 to 1, the capacitor 364 then is momentarily connected between the data low negative logic signal DLN and the voltage corresponding to logic 1 for the low voltage side from the predriver 162, that is, the power supply voltage AVD. Returning to the first PMOS transistor 366 being on, the data low negative logic signal DLN is momentarily connected to the bias voltage VBP through the following path: the first PMOS transistor 366, to the node N2, and to the third PMOS transistor 370. Over time, the bias voltage VBN charges onto an end of the capacitor 364 and makes the level $VOH_{DLN}$ converge to the bias voltage VBN, while the other end of the capacitor 364 is at the power supply voltage AVD via the input signal INN. Thus, the capacitor 364 can capacitively couple over the input signal INN to the data low negative logic signal DLN with the VOH of the DLN signal (FIG. 3D2) tunable for the desired on resistance for the driver transistor 168 (FIG. 1D) by tuning of the bias level VBN.

By turning on the first PMOS transistor 366, the VOH portion (FIG. 3D2) of the signal DLN is eventually pulled up to the bias voltage VBN via the "on" resistance of the first PMOS transistor 366 and the enable switch 370, which operates to keep on the NMOS driver transistor 168 (FIG. 1D) so that the positive-logic output signal TXOP is low. Due to the relatively high "on" resistance of the first PMOS transistor 366 particularly if the first PMOS transistor 366 is relatively small, it can take relatively many cycles of transitions for the VOH portion (FIG. 3D2) to match the level of the bias voltage VBN. For example, in one embodiment, it can take on the order of a few microseconds for the VOH portion (FIG. 3D2) to stabilize at the bias voltage VBN. The time it takes to stabilize can vary in a very broad range and will depend on various "on" resistances of the transistors and the parasitic capacitances involved. If a closed-loop feedback loop is used to set the bias voltage VBN, this stabilization time should be accounted for in the loop. It should be noted that while the level VOH (FIG. 3D2) may converge relatively slowly, the switching of voltage by the capacitor 364 occurs virtually instantaneously.

The negative logic output signal TXON is asserted high as follows. With an input symbol transition from a 1 to a 0 such that the input signals INP, INN transition from (1,0) to (0,1), the following occurs with reference to the first level shifter 340. The transition from 1 to 0 for the input signal INP is capacitively coupled via the first coupling capacitor 342 over to the data high positive logic signal DHP and to the gate of the first NMOS transistor 346. This shuts off the first NMOS transistor 346 and turns on the PMOS driver transistor 172 (FIG. 1D), which sets the negative-logic output signal TXON high. The corresponding transition from 0 to 1 for the input signal INN is capacitively coupled via the second coupling capacitor 344 to the data high negative logic signal DHN, which then turns on the second NMOS transistor 348 and turns off the PMOS driver transistor 166 (FIG. 1D), permitting the NMOS driver transistor 168 to control the voltage of the negative-logic output signal TXOP. Since the first NMOS transistor 346 is off, the data high negative logic signal DHN remains high, and the PMOS driver transistor 166 remains off.

By turning on the second NMOS transistor 348, the VOL portion (FIG. 3C2) of the data high positive logic signal DHP eventually converges to the bias voltage VBP via the following path: the second NMOS transistor 348, the node N1, and the enable switch 350. The illustrated embodiment is symmetrical with respect to the data high positive logic signal DHP and the data high negative logic signal DHN, and thus, the earlier description for adjustment of the VOL portion (FIG. 3C2) of the data high negative logic signal DHN is applicable.

The negative logic output signal TXON is asserted low as follows. With an input symbol transition from a 0 to 1 such that the input signals INP, INN transition from (0,1) to (1,0), the following occurs with reference to the second level shifter 360. The transition from 0 to 1 for the input signal INP is capacitively coupled via the first coupling capacitor 362 over to the data low positive logic signal DLP and to the gate of the first PMOS transistor 366. This shuts off the first PMOS transistor 366 and turns on the NMOS driver transistor 174 (FIG. 1D). The corresponding transition from 1 to 0 for the input signal INN is capacitively coupled via the second coupling capacitor 364 to the data low negative logic signal DLN, which then turns on the second PMOS transistor 368 and turns off the NMOS driver transistor 168 (FIG. 1D), permitting the PMOS driver transistor 166 (FIG. 1D) to control the voltage of the positive-logic output signal TXOP. Since the first PMOS transistor 366 is off, the data low negative logic signal DLN remains low, and the NMOS driver transistor 168 (FIG. 1D) remains off.

By turning on the second PMOS transistor 368, the VOH portion (FIG. 3D2) of the data low positive logic signal DLP eventually converges to the bias voltage VBN via the following path: the second PMOS transistor 368, the node N2, and the enable switch 370. The illustrated embodiment is symmetrical with respect to the data low positive logic signal DLP and the data low negative logic signal DLN, and thus, the earlier description for adjustment of the VOH portion (FIG. 3D2) of the data low negative logic signal DLN is applicable.

FIG. 4 illustrates a high-swing voltage driver circuit 400. The output drivers illustrated in FIG. 4 are in a cascoded configuration that is well known to those of ordinary skill in the art. The cascoded configuration can be used as an alternative to the CMOS-style thick-oxide driver described earlier in connection with FIG. 1D. There is an even number n transistors in series between ground (gnd) and $nV_{DD}$. The value of n is typically 4, but other applicable values will be readily determined by one of ordinary skill in the art. For the output stage of FIG. 4, and for any high voltage design in a standard low voltage technology, one objective is to find the correct operating point so that the voltages across the terminals of the transistors are within the limits of the technology. This is called the transistor's safe operating region, in which breakdown mechanisms and hot carrier degradation are minimized. This should provide a reliable operation over the lifetime of the circuit. If the transistors operate outside of the safe region, electrical overstress (EOS) will occur, and the lifetime of the circuit will be degraded.

Because it is built from thin-oxide devices, the cascoded output stage 402 may operate at higher speeds than a thick-oxide approach. On the other hand, it is more prone to EOS issues. The cascoded output stage 402 also uses at least two additional bias voltages for n of 4, which complicates both the design of the replica and the compensation of mismatch variations. The thick-oxide output stage is simpler and can support moderately high data rates. In one embodiment, the thick-oxide output stage is used for data rates up to about 6 Gb/s.

Figure 5A:
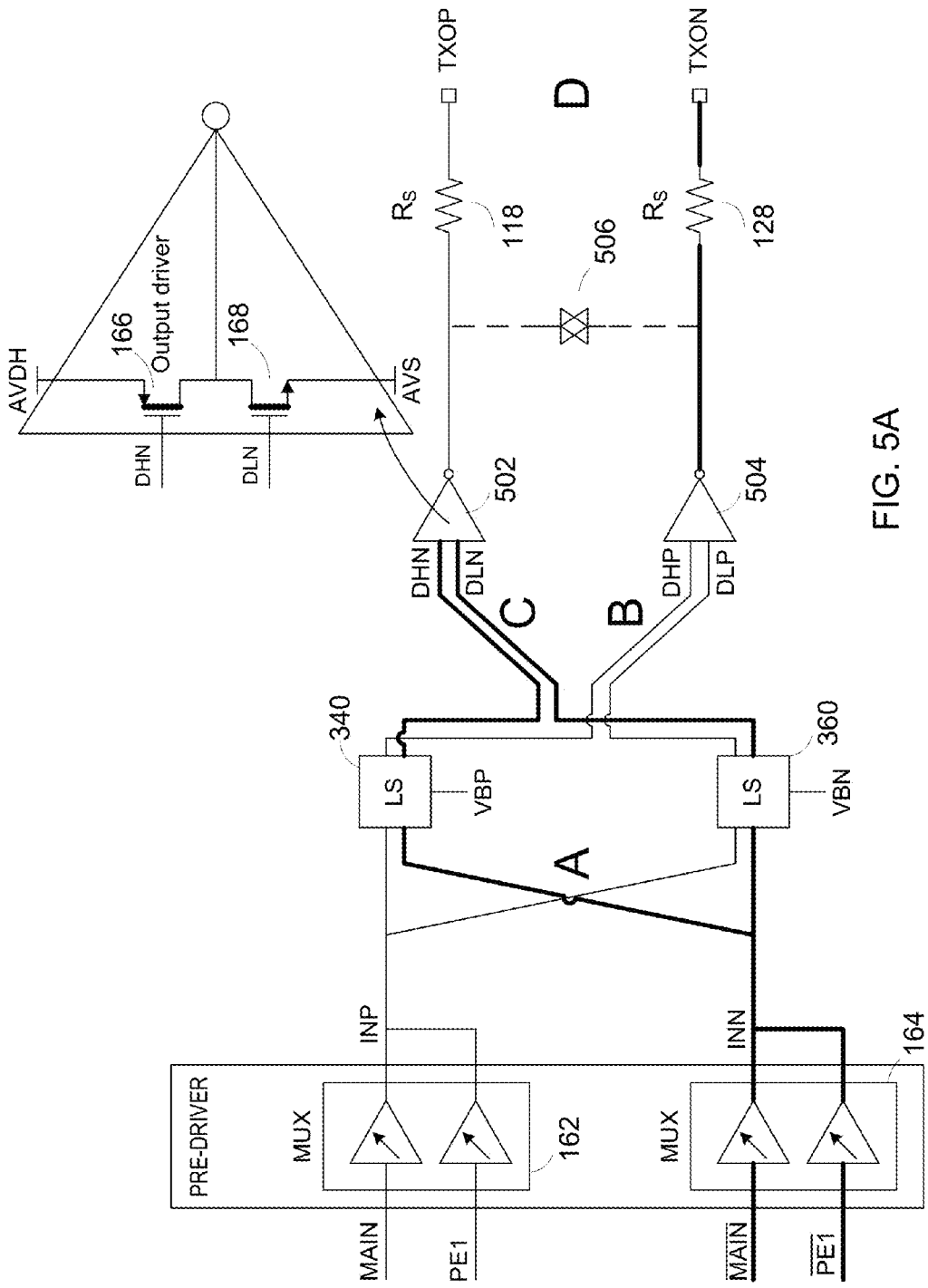
FIG. 5A illustrates multiplexed pre-drivers and various data paths for a high-swing transmitter.

To implement rise and fall time control with the cascoded output stage 402, in one embodiment, each additional pair of the n transistors beyond 2 will be matched with a pair of level shifters, such as the level shifters 340, 360 described earlier in connection with FIGS. 3C1 and 3D1. Adjustments can be made to a replica circuit as will be described later in connection with FIGS. 9A-9D, Multiplexed Pre-Drivers FIG. 5A illustrates multiplexed pre-drivers and various data paths for a high-swing transmitter. In the embodiment illustrated in FIG. 5A, the buffers within the pre-driver 162 are multiplexed so as to connect either one of MAIN or PE1 to INP. If the MAIN input is some given signal, then the PE1 input can be, for example, a delayed or advanced version of MAIN (and possibly inverted). By having different sub-cells drive different patterns on the output signals TXOP/TXON, an equalized output having pre-emphasis or de-emphasis can be generated. In addition, the strength of the drive provided by the pre-drivers can be adjusted as indicated in the drawing by the diagonal arrows. In one embodiment, three-state gate logic can be used to implement the multiplexing.

In FIG. 5A, the output drivers 166, 168 are shown as a block 502, and the output drivers 172, 174 are shown as a block 504 for clarity. A transmission gate 506 can optionally be included to keep the output impedance constant over various amplitude settings. The optional transmission gate 506 can maintain an impedance between the positive-logic output signal TXOP and the negative-logic output signal TXON when the transmitter is off.

Figure 5B:
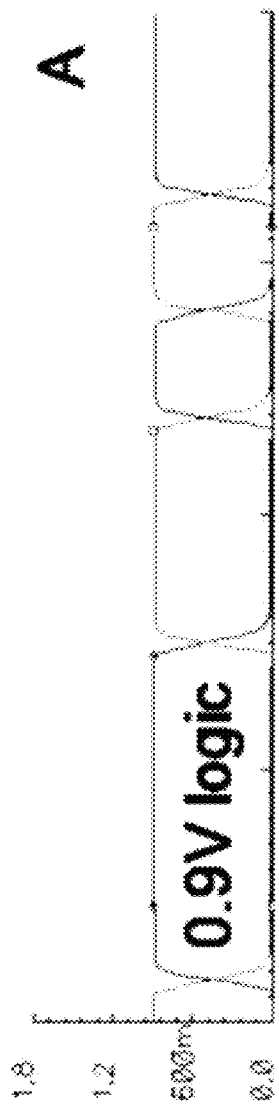
FIG. 5B illustrates waveforms for data path "A."
Figure 5C:
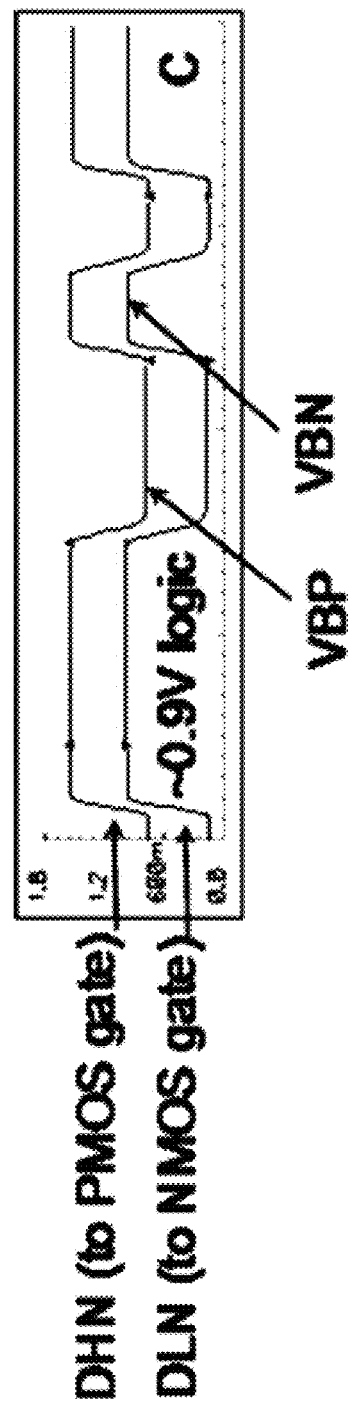
FIG. 5C illustrates waveforms for data path "C."

During operation, the various signal lines can be expected to be switching logic states. To illustrate the logic states along the data paths, bold signal lines indicate negative logic and normal signal lines indicate positive logic. Thus, bold signal lines can indicate one logic state (0 or 1) and the not bolded signal lines can indicate the opposite logic state (1 or 0). In addition, various letters A, B, C, and D appear in FIG. 5A. Examples of waveforms for the signal lines near the letter "A" are illustrated in FIG. 5B. As illustrated in FIG. 5B, the inputs to the level shifters 340, 360 have an amplitude of 0.9 volts. The signal lines for "B" and "C" should appear to be the same except that they are inverted from one another. FIG. 5C illustrates an example of waveforms for the signal lines near "C." As illustrated in FIG. 5C, the outputs of the level shifters 340, 360 have an amplitude of less than 0.9 volts. The coupling efficiency is expressed as $V_O/V_I$ of the level shifters 340, 360, an abstract representation of which will be described later in connection with FIG. 6.

Figure 5D:
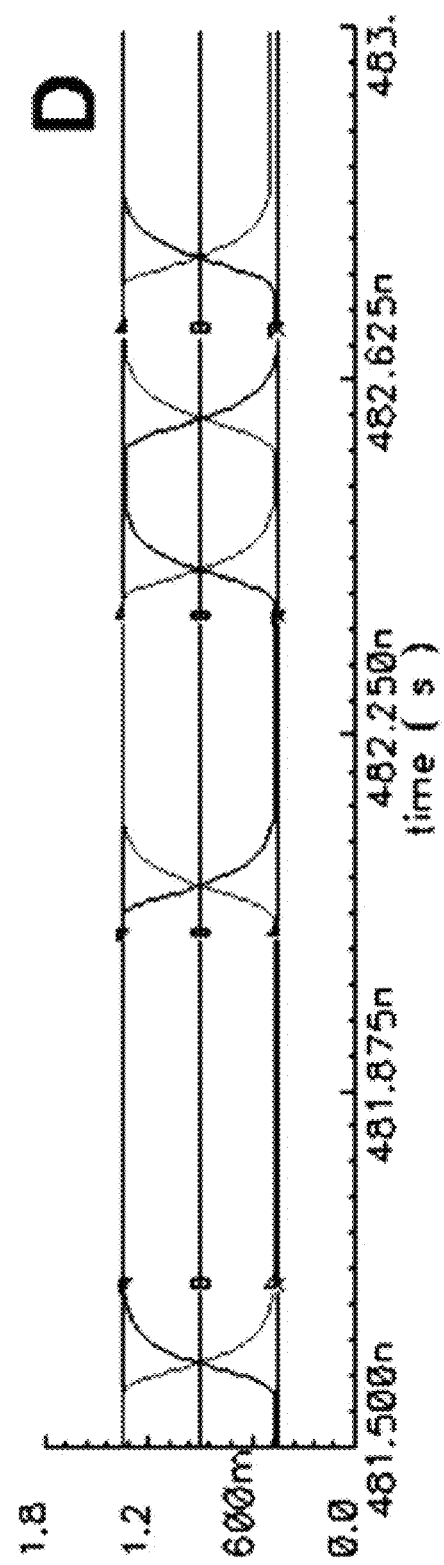
FIG. 5D illustrates waveforms for data path "D."

FIG. 5D illustrates an example of waveforms for the signal lines near "D." The level shifters 340, 360 receive voltages bias VBP, VBN as control inputs. These bias voltages VBP, VBN can be generated by a replica circuit as will be described later in connection with FIG. 8B. The bias voltage VBP sets the voltage VOL (voltage output low) of the signals DHP/DHN, which drive the PMOS driver transistors 166, 172 (FIG. 1D) of the output driver; and the bias voltage VBN sets the voltage VOH (voltage output high) of the signals DLP/DLN, which drive the NMOS driver transistors 168, 174 (FIG. 1D) of the output driver. By tuning the bias voltages VBP and VBN, which are used by the sub-cells of the transmitter, the "on" resistances can be adjusted and hence, the pull-up and the pull-down resistances can be matched over PVT. This results in well matched rise and fall times as illustrated in FIG. 5D and relatively low common-mode noise over PVT.

Coupling Efficiency

Figure 6:
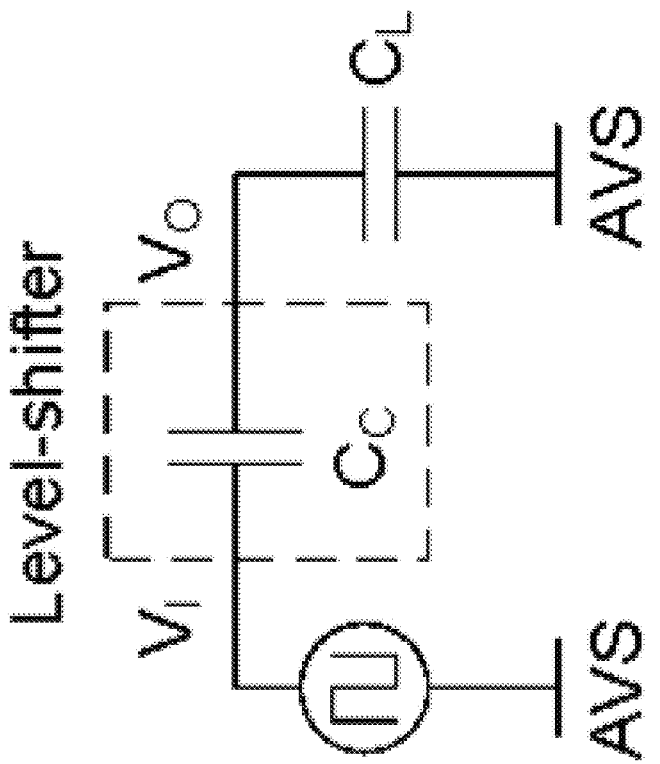
FIG. 6 illustrates a simplified model of a capacitively-coupled level shifter.

FIG. 6 illustrates a simplified model of a capacitively-coupled level shifter, such as the conventional capacitively-coupled level shifter of FIG. 3B1 or the embodiments of the level shifters of 3C1 and 3D1. The loss in amplitude across the level-shifter is a function of the coupling efficiency. The coupling efficiency is expressed in Equation 6 as VO/VI of the level shifter.

$$\text{coupling\_efficiency} = \frac{V_O}{V_I} = \frac{C_C}{C_C + C_L} \qquad \text{Equation nn6}$$

Matching Rise Time and Fall Time

Equation 7 expresses the "on" resistance $R_N$ of the NMOS driver transistors 168, 174 (FIG. 1D) for operation in the triode region. In the illustrated embodiments, the NMOS driver transistors 168, 174 are used to pull down the output signals TXOP, TXON.

$$R_N = \frac{1}{\mu_n C_{ox}\left(\frac{W}{L}\right)(VBN - V_{tn})} \qquad \text{Equation 7}$$

As illustrated in Equation 7, the "on" resistance $R_N$ varies as a function of the bias voltage VBN. Also, in Equation 7, $V_{tn}$ corresponds to the NMOS transistor threshold voltage, W to the width of the transistor, L to the length of the transistor, $\mu_n$ to the electron mobility, and $C_{ox}$ to the gate capacitance per unit area.

Equation 8 expresses the "on" resistance $R_P$ of PMOS driver transistors 166, 172 (FIG. 1D) for operation in the triode region. In the illustrated embodiments, the PMOS driver transistors 166, 172 are used to pull up the output signals TXOP, TXON.

$$R_P = \frac{1}{\mu_p C_{ox}\left(\frac{W}{L}\right)((AVDH - VBP) - |V_{tp}|)} \quad \text{Equation 8}$$

As illustrated in Equation 8, the "on" resistance $R_P$ varies as a function of the bias voltage VBP. Also, in Equation 8, $V_{tp}$ corresponds to the PMOS transistor threshold voltage, W to the width of the transistor, L to the length of the transistor, $\mu_p$ to the hole mobility, and $C_{ox}$ to the gate capacitance per unit area.

The pull-down resistance $R_N$ can be decreased by increasing the bias voltage VBN, whereas the pull-up resistance $R_P$ can be decreased by decreasing the bias voltage VBP. For reference, FIG. 7A illustrates the driver portions described earlier in connection with FIG. 1D. FIGS. 7B-7D illustrate how the rise and fall times vary as a function of bias voltages VBP and VBN.

If the bias voltage VBP is too high, then the pull-up resistance $R_P$ will be too large relative to the pull-down resistance $R_N$. This would result in the conductivity of the PMOS driver transistors 166, 172 being too weak relative to the conductivity of the NMOS driver transistors 168, 174, rise times being slower than fall times as shown in FIG. 7C, and a common-mode noise profile with negative spikes 702 as shown in FIG. 7D.

If the bias voltage VBP is too low, then the pull-up resistance $R_P$ will be too small relative to the pull-down resistance $R_N$. This would result in the conductivity of the PMOS driver transistors 166, 172 being too strong relative to the NMOS, rise times being faster than fall times as shown in FIG. 7C, and common-mode noise profile with positive spikes 704 as shown in FIG. 7D.

When the bias voltages VBP, VBN are set such that the pull-up resistance $R_P$ is about equal to the pull-down resistance $R_N$, this equalizes the rise and fall times and reduces or minimizes common-mode noise thereby resulting in relatively good EMI performance. In addition, the bias voltages VBP, VBN can also be used to fine tune the output impedance of the transmitter as illustrated in FIG. 7B. Tuning of the output impedance can be useful to reduce reflections in the system and to improve signal integrity. Tuning of the output impedance can also be used to boost output signal amplitude by, for example, reducing the output impedance from 100 ohms to 90 ohms as shown in the illustrated example of FIG. 7B. One way to tune the output impedance is by manipulating the optional switchable replica resistors 890, which will be described in further detail later in connection with FIG. 8B. For example, by drawing more current than normally used in the optional switchable replica resistors 890, the output impedance of the drivers can be reduced.

In a theoretical driver, the resistance of the pull-up and pull-down paths would be dominated by the corresponding series termination resistor, such as the termination resistor $R_S$ (FIG. 7A), because the resistance of the switch FETs can be rather nonlinear and susceptible to process variations. However, from a practical point of view, to obtain a negligible resistance of the FETs in the "on" state, their widths would have to be large and consequently, the FETs would present a relatively high load capacitance for the pre-driver, which would be contrary to a design target of high-speed and low-power signaling.

In a transmitter architecture accordingly to an embodiment of the invention, it can be advantageous to keep the FETs 166, 168, 172, 174 of the output driver relatively small because a capacitively-coupled level-shifter 170 sits in the signal path between the pre-drivers 162, 164 and the output drivers 166, 168, 172, 174. Such a level-shifter can be sensitive to the load capacitance, which determines the coupling efficiency as described earlier in connection with Equation 6. In practice, a trade-off between the size of the switch FETs 166, 168, 172, 174 and the series termination resistor $R_S$ is typically made to lower the load resistance at the cost of a slightly reduced accuracy of the pull-up/pull-down path resistance. The replica circuit to be discussed next compensates for the high variations on a FET's "on" resistance over PVT. The replica circuit can also compensate for mismatch variations when it is used in a closed loop configuration.

Replica Circuit

Figure 8A:
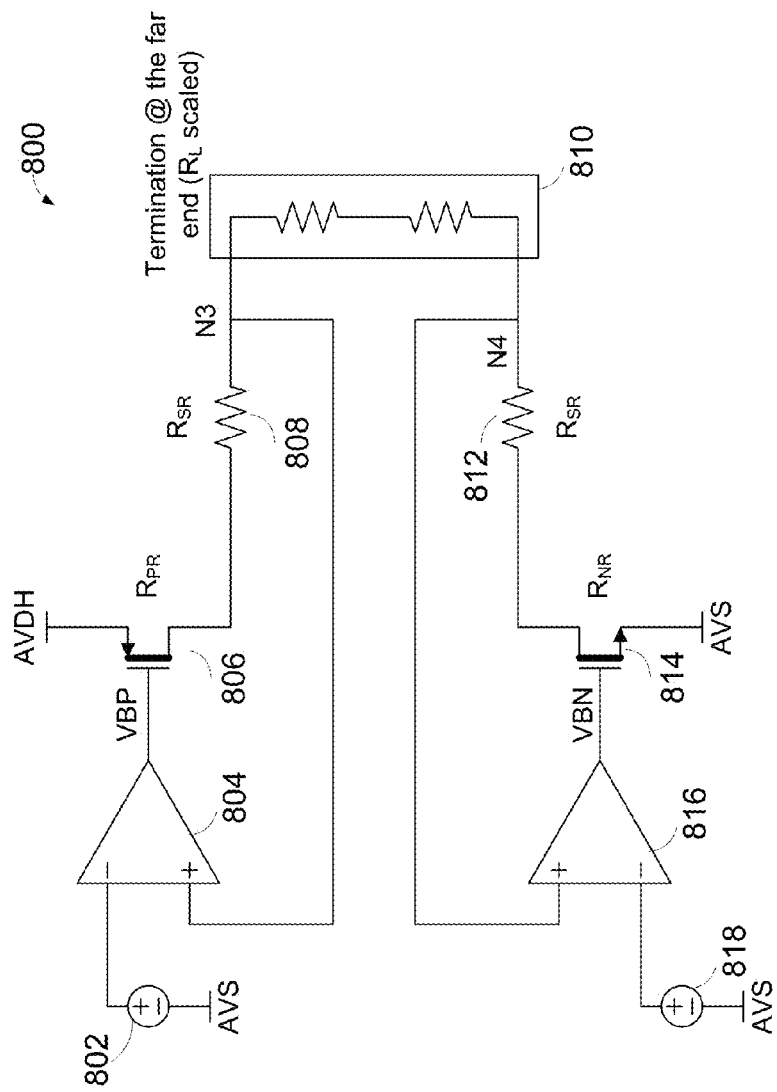
FIG. 8A illustrates one embodiment of a replica circuit that generates bias voltages VBP, VBN for a level shifter circuit.
Figure 8B:
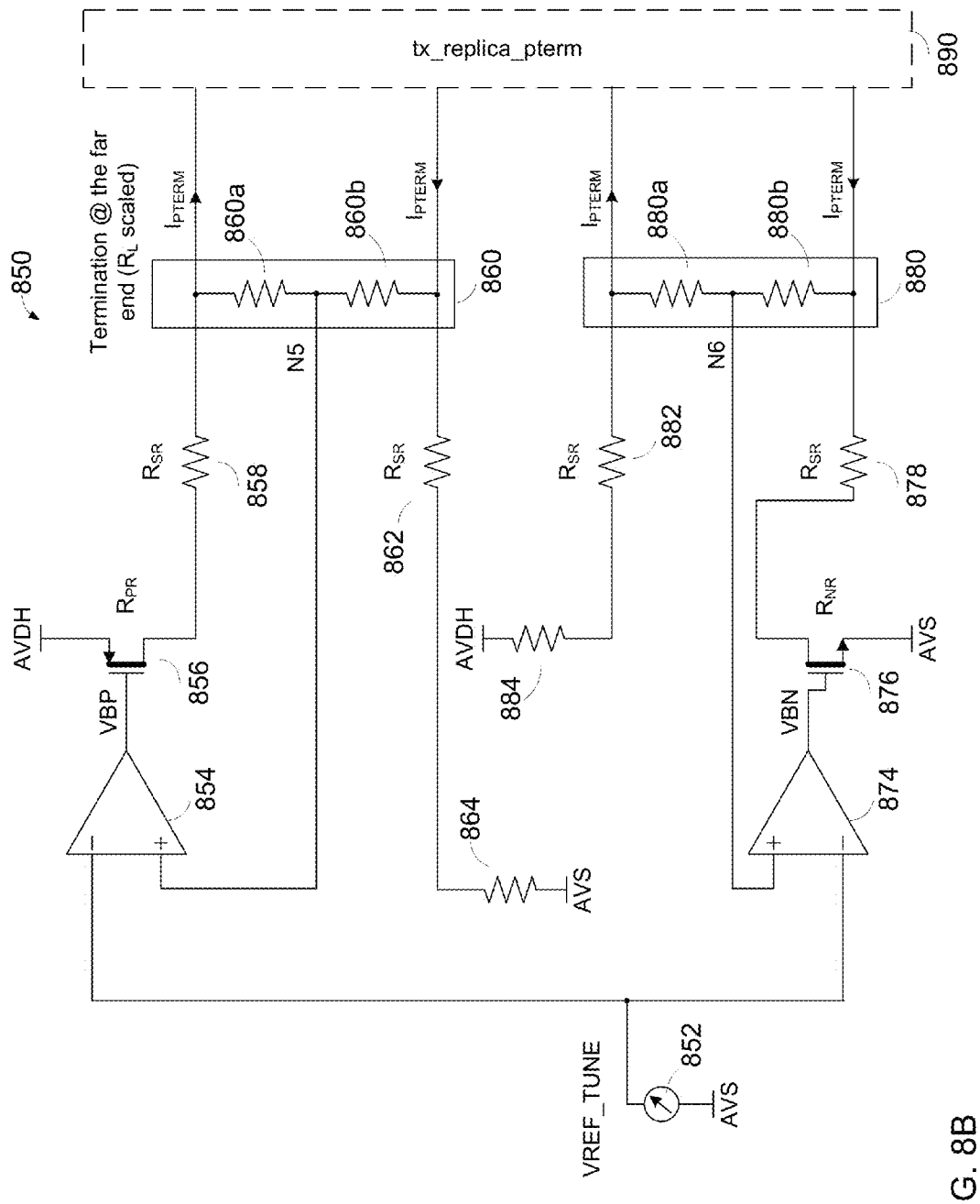
FIG. 8B illustrates another embodiment of a replica circuit that generates bias voltages VBP, VBN for a level shifter circuit.

FIGS. 8A and 8B illustrate two different configurations of replica circuits 800, 850 that can generate level shifter bias voltages VBP, VBN. A single-loop replica circuit 800 is illustrated in FIG. 8A. A two-loop replica circuit 850 is illustrated in FIG. 8B.

The single-loop replica circuit 800 has a first voltage reference 802, a first operational amplifier 804, a PMOS replica transistor 806, a first replica termination resistor $R_{SR}$ 808, a replica far-end termination resistor 810, a second replica termination resistor $R_{SR}$ 812, an NMOS replica transistor 814, a second operational amplifier 816, and a second voltage reference 818. The PMOS replica transistor 806 and the NMOS replica transistor 814 are replicas of the PMOS driver transistors 166, 172 (FIG. 1D) and the NMOS driver transistors 168, 174 (FIG. 1D), respectively. The first replica termination resistor $R_{SR}$ 808 and the second replica termination resistor $R_{SR}$ 812 are replicas of the termination resistors 118, 128 (FIG. 1D). The replica far-end termination resistor 810 can be a scaled replica of the termination resistance at the receiver end.

An output from the first voltage reference 802 is provided as an input to an inverting input of the first operational amplifier 804. An output of the first operational amplifier 804 corresponds to the bias voltage VBP, which is provided as an input to the level shifter 170 (FIG. 1D) and to the gate of the PMOS replica transistor 806. A source of the PMOS replica transistor 806 is coupled to the power supply voltage AVDH. A drain of the PMOS replica transistor 806 is coupled to a first end of the first replica termination resistor $R_{SR}$ 808. A second end of the first replica termination resistor $R_{SR}$ 808 forms a node N3 with the non-inverting input of the first operational amplifier 804 and a first end of the replica far-end termination resistor 810.

An output from the second voltage reference 818 is provided as an input to an inverting input of the second operational amplifier 816. An output of the second operational amplifier 816 corresponds to the bias voltage VBN, which is provided as an input to the level shifter 170, 340, 360 (FIGS. 1D, 3C1, 3D1) and to the gate of the NMOS replica transistor 814. A source of the NMOS replica transistor 814 is coupled to the power supply voltage AVS, which can be ground. A drain of the NMOS replica transistor 814 is coupled to a first end of the second replica termination resistor $R_{SR}$ 812. A second end of the second replica termination resistor $R_{SR}$ 812 forms a node N4 with the non-inverting input of the second operational amplifier 816 and a second end of the replica far-end termination resistor 810.

The various components of the single-loop replica circuit 800 can be scaled to reduce chip area size and/or reduce power consumption. For example, in one embodiment, the PMOS replica transistor 806 and the NMOS replica transistor 814 are scaled to have an "on" resistance capable of being less than about 1.0 kilo ohms (kΩ) when fully on, and the single-loop replica circuit 800 operates to tune this "on" resistance to a steady value greater than the minimum amount. Further, for example, the first replica termination resistor $R_{SR}$ 808 and the second replica termination resistor $R_{SR}$ 812 can be scaled to about 1.4 kΩ, and the replica far end termination resistor 810 can be scaled to about 4.8 kΩ of series resistance and can be implemented by one or more resistors, such as resistors in series.

In one embodiment, the first voltage reference 802 generates about 1.35 volts (which is about ¾ of the supply voltage AVDH), the second voltage reference 818 generates about 0.45 volts (which is about ¼ of the supply voltage AVDH), the supply voltage AVDH is 1.8 volts, and the supply voltage AVS is 0 volts. The first voltage reference 802 and the second voltage reference 818 can be implemented by a resistive divider off of the power supply voltage AVDH. Of course, the voltage dividers for both reference voltages can be generated from the same resistor tree. Other techniques of generating voltage references will be readily determined by one of ordinary skill in the art. In addition, in alternative embodiments, the voltage references 802, 818 can be adaptively adjusted to further tune initial values for the bias voltages VBP, VBN, and the single-loop replica circuit 800 operates to further adjust the bias voltages VBP, VBN over one or more PVT variations.

The single-loop replica circuit 800 operates as follows. A negative feedback loop exists from the output of the first operational amplifier 804, through the PMOS replica transistor 806, which inverts the signal, the first replica termination resistor $R_{SR}$ 808, and back to the non-inverting input of the first operational amplifier 804. Via the feedback loop, the first operational amplifier 804 generates the bias voltage VBP such that the voltage at the node N3 is about equal to the voltage at the inverting input of the first operational amplifier 804. That bias voltage VBP is provided as an input to the level shifter 170, 340 (FIGS. 1D and 3C1).

Similarly, a negative feedback loop including the second operational amplifier 816 operates to generate the bias voltage VBN such that the voltage at the node N4 is about the same as the voltage at the inverting input of the second operational amplifier 816. That bias voltage VBN is provided as an input to the level shifter 170, 360 (FIGS. 1D and 3D1). In the illustrated example, 0.45 volts is provided by the second voltage reference 818 to the inverting input of the second operational amplifier 816 and also appears at the node N4. Accordingly, the current through the path from the power supply voltage AVDH to AVS via the PMOS replica transistor 806, the first replica termination resistor $R_{SR}$ 808, the replica far-end termination resistor 810, the second replica termination resistor $R_{SR}$ 812, the NMOS replica transistor 814 should be equal to the voltage drop across the replica far-end termination resistor 810 divided by its resistance. In the illustrated embodiment, the DC current is thus 187.5 microamps (μA). Accordingly, the feedback loops operate to control the amount of "on" resistance of the PMOS replica transistor 806 and of the NMOS replica transistor 814 to about 1.0 kΩ each, for a total pull up and pull down resistance of about 2.4 kΩ in the illustrated example. Of course, by selection of other values of reference voltages and other values of replica resistances, other values for the "on" resistance of the PMOS replica transistor 806 and of the NMOS replica transistor 814 will be applicable. Despite being subjected to variations over PVT, the feedback loops of the single-loop replica circuit 800 operate to provide appropriate values for the bias voltages VBP, VBN. In addition, one advantage of the single-loop replica circuit 800 is that it should consume a relatively small amount of chip area, and should accordingly be relatively inexpensive to implement.

The two-loop replica circuit 850 has a voltage reference 852, a first operational amplifier 854, a PMOS replica transistor 856, a first replica termination resistor $R_{SR}$ 858, a first replica far-end termination resistor(s) 860, a second replica termination resistor $R_{SR}$ 862, an NMOS replica resistance 864, a second operational amplifier 874, an NMOS replica transistor 876, a third replica termination resistor $R_{SR}$ 878, a second replica far-end termination resistor(s) 880, a fourth replica termination resistor $R_{SR}$ 882, and a PMOS replica resistance 884. For clarity and context for the two-loop replica circuit 850, many of the illustrated resistances are schematically drawn separately, but it will be understood by one of ordinary skill in the art that such resistances can be combined in practice. Optional switchable replica resistors 890 will be discussed later.

The PMOS replica transistor 856 and the NMOS replica transistor 876 are replicas of the PMOS driver transistors 166, 172 (FIG. 1D) and the NMOS driver transistors 168, 174 (FIG. 1D), respectively. The first replica termination resistor $R_{SR}$ 858 and the second replica termination resistor $R_{SR}$ 862 are replicas of the termination resistors 118, 128 (FIG. 1D). The fourth replica termination resistor $R_{SR}$ 882 and the third replica termination resistor $R_{SR}$ 878 are also replicas of the termination resistors 118, 128 (FIG. 1D). The first replica far-end termination resistor(s) 860 and the second replica far-end termination resistor(s) 880 are scaled replicas of the termination resistance at the receiver end.

The voltage reference VREF_TUNE output of the voltage reference 852 is provided as an input to the inverting input of the first operational amplifier 854 and to the inverting input of the second operational amplifier 874. The output of the first operational amplifier 854 drives the gate of the PMOS replica transistor 856. The source of the PMOS replica transistor 856 is coupled to the power supply reference AVDH. A drain of the PMOS replica transistor 856 is coupled to a first end of the first replica termination resistor $R_{SR}$ 858. A second end of the first replica termination resistor $R_{SR}$ 858 is coupled to a first end of the first replica far-end termination resistor(s) 860. A second end of the first replica far-end termination resistor(s) 860 is coupled to a first end of the second replica termination resistor $R_{SR}$ 862, which has a second end coupled to a first end of the NMOS replica resistance 864. A second end of the NMOS replica resistance 864 is coupled to a voltage reference AVS, which can be ground. A common-mode point within the first replica far-end termination resistor(s) 860 forms a node N5 with the non-inverting input of the first operational amplifier 854. The NMOS replica resistance 864 replicates the "on" resistance of the NMOS driver transistors 168,174 (FIG. 1D) in an open-loop manner.

The output of the second operational amplifier 874 drives the gate of the NMOS replica transistor 876. The source of the NMOS replica transistor 876 is coupled to the power supply reference AVS, which can be ground. A drain of the NMOS replica transistor 876 is coupled to a first end of the third replica termination resistor $R_{SR}$ 878. A second end of the third replica termination resistor $R_{SR}$ 878 is coupled to a first end of the second replica far-end termination resistor(s) 880. A second end of the second replica far-end termination resistor(s) 880 is coupled to a first end of the fourth replica termination resistor $R_{SR}$ 882, which has a second end coupled to a first end of the PMOS replica resistance 884. A second end of the PMOS replica resistance 884 is coupled to the power supply reference AVDH. A common-mode point within the second replica far-end termination resistor(s) 880 forms a node N6 with the non-inverting input of the second operational amplifier 874. The PMOS replica resistance 884 replicates the "on" resistance of the PMOS driver transistors 166,172 (FIG. 1D) in an open-loop manner.

During operation, the feedback loop from the output of the first operational amplifier 854 to the PMOS replica transistor 856, to the first replica termination resistor $R_{SR}$ 858, to the node N5, and back to the non-inverting input of the first operational amplifier 854 operates to generate the bias voltage VBP such that the voltage at the node N5 is about equal to the voltage reference VREF_TUNE from the voltage reference 852. Similarly, the feedback loop from the output of the second operational amplifier 874 to the NMOS replica transistor 876, to the third replica termination resistor $R_{SR}$ 878, to the node N6, and back to the non-inverting input of the second operational amplifier 874 operates to generate the bias voltage VBN such that the voltage at the node N6 is about equal to the voltage reference VREF_TUNE from the voltage reference 852.

In one embodiment, with the voltage reference VREF_TUNE output of the voltage reference 852 set to about half of the power supply voltage AVDH, the voltages of 0.9 volts and 1.8 volts are applicable for voltage reference VREF_TUNE and the power supply voltage AVDH, respectively, and the power supply voltage AVS is 0 volts. In one embodiment, the replica termination resistors 858, 862, 878, 882 have about 1.4 kΩ of resistance. In one embodiment, each portion 860a, 860b, 880a, 880b of the replica far-end termination resistors 860, 880 has about 2.4 kΩ of resistance, and each of the NMOS replica resistance 864 and the PMOS replica resistance 884 have about 1.0 kΩ of resistance. Assuming no contribution to the circuit operation from the optional switchable replica resistors 890, the operational amplifiers 854, 874 operate to provide bias voltages VBP, VBN such that 0.9 volts appears at the nodes N5, N6 and such that 187.5 to of current flows through each of the PMOS replica transistor 856 and the NMOS replica transistor 876 through separate paths. With the voltage reference VREF_TUNE set to half of the power supply voltage, the bias voltages VBP, VBN are set such that the PMOS replica transistor 856 and the NMOS replica transistor 876 each have about 1.0 kΩ of resistance, and the pull-up resistance and the pull-down resistance contribution by the PMOS driver transistors 166, 172 (FIG. 1D) and the NMOS driver transistors 168, 174 (FIG. 1D), respectively, should be about the same, and EMI performance should be relatively good.

Should it be desired to tune the relative amounts of pull-up resistance and pull-down resistance, the voltage reference VREF_TUNE can be adjusted. An increase in the voltage reference VREF_TUNE lowers the bias voltage VBP, which in turn results in the PMOS replica transistor 856 being "on" with a lower resistance than previously and also results in the PMOS driver transistors 166, 172 (FIG. 1D) switching "on" to a lower resistance when switched by the level shifter 170 (FIG. 1D), 340 (FIG. 3C1). As a result, the rise time should become shorter. Similarly, the same increase in the voltage reference VREF_TUNE lowers the bias voltage VBN, which in turn results in the NMOS replica transistor 876 being "on" with a higher resistance than previously and also results in the NMOS driver transistors 168, 174 (FIG. 1D) switching "on" to a higher resistance when switched by the level shifter 170 (FIG. 1D), 360 (FIG. 3C1). As a result, the fall time should become longer. Thus, when it is desired to shorten the rise time relative to the fall time, the voltage reference VREF_TUNE can be increased, which lowers the pull-up resistance relative to the pull-down resistance. Conversely, when it is desired to lengthen the rise time relative to the fall time, the voltage reference VREF_TUNE can be lowered, which raises the pull-up resistance relative to the pull-down resistance.

For example, without adjustment of the reference voltage VREF_TUNE, offsets and mismatches will make the pull-up and pull-down resistances slightly different, which in turn would cause a mismatch of the rise and fall times and hence common-mode noise, which generates EMI. In one hypothetical example, assume that the rise times are slightly faster than the fall times. In that situation, the common-mode voltage would be peaking up, as illustrated by the common-mode noise profile with positive spikes 704 in FIG. 7. Because of the positive spikes on the common-mode signal, the average of the filtered common-mode signal avg(VCM) (FIG. 15) will be slightly higher than midway between the voltage references AVDH, AVS that power the output drivers, which with 0 volts for the voltage reference AVS, should be the value of the voltage AVDH divided by two (midpoint value AVDH/2). In order to bring the average back down to the midpoint value AVDH/2, the voltage reference VREF_TUNE should be lowered. When the voltage reference VREF_TUNE is lowered, the inverting input of the first operational amplifier 854 becomes smaller than the positive input. This makes the first operational amplifier 854 increase its output voltage, which is the bias voltage VBP, which in turn increases the on-resistance of the PMOS replica transistor 856. The larger PMOS resistance decreases the common-mode voltage of the PMOS replica transistor 856, as well as that of the corresponding PMOS transmitter driver transistors 166, 172 (FIG. 1D). Meanwhile, lowering VREF_TUNE made the second operational amplifier 874 increase its output, which is the bias voltage VBN. A higher bias voltage VBN reduces the on-resistance of the NMOS replica transistor 876, which pulls the common-mode voltage down. As illustrated in the foregoing, decreasing the reference voltage VREF_TUNE makes both the PMOS replica transistor 856 and the NMOS replica transistor 876 work in the same direction to pull the common-mode voltage back down to the midpoint value AVDH/2. For the case in which the rise times are slightly slower than the fall times, the negative peaks on the common-mode signal can result and an average that is slightly lower than the midpoint value AVDH/2 can result. In order to compensate for that situation, VREF_TUNE would typically be increased.

Moreover, the voltage reference VREF_TUNE can either be adjusted in open loop or in closed loop. Note that the voltage reference VREF_TUNE can be an analog voltage that is controlled digitally using a digital-to-analog converter (DAC). In open loop operation, for example, test equipment can sweep the DAC setting and monitor the filtered common-mode voltage avg(VCM) (FIG. 15) during production or manufacturing test. The DAC setting that reduces or minimizes the difference between the average common-mode voltage VCM avg(VCM) (FIG. 15) and the midpoint value AVDH/2 should be picked. In one embodiment, this setting is applied across all devices. In an alternative embodiment, EMI can be monitored and the DAC setting that reduces or minimizes EMI can be selected.

The optional switchable replica resistors 890 can be used to switch in and out other resistances in parallel with the replica far-end termination resistors 860, 880. While illustrated in connection with the two-loop replica circuit 850, the principles of the optional switchable replica resistors 890 are also applicable to the single-loop replica circuit 800. Returning now to FIG. 1D, in one embodiment, N unit driver cells are arranged in parallel. During operation, a selected number of these N unit driver cells are enabled based on the desired output swing voltage. In one embodiment, the replica circuit 800, 850 is optimized for operation with all N unit driver cells enabled, though of course, it can be optimized for other conditions, such as relatively few unit driver cells enabled. When optimized for all N unit driver cells in operation, but only relatively few unit driver cells are actually enabled, there can be a mismatch between the replica circuit 800, 850 and the enabled sub-cells. One way to compensate for the mismatch is to include the optional switchable replica resistors 890 and switch them on in parallel with the replica far-end termination resistors 860, 880 when the number of enabled unit driver cells is low. This causes the operational amplifiers 854, 874 to drive the replica transistors 856, 876 "on" harder, that is, to pass more current, and provide more appropriate bias voltages VBP, VBN as a result. Of course, the optional switchable replica resistors 890 can be activated in stages, or in other embodiments, can be in series with the feedback loops and controlled in the opposite manner as described for the illustrated paralleled embodiment. In addition, while illustrated in connection with FIG. 8B, the optional switchable replica resistors 890 can also be used with the embodiments of FIG. 8A or 9A-9D. In an alternative embodiment, the function provided by the optional switchable replica resistors 890 can be provided by current sources/sinks instead of resistors. The function of the optional switchable replica resistors 890 is to push or pull an incremental current from the PMOS replica transistor 856 and the NMOS replica transistor 876 so that the total current drawn from the transistors of the replica is the same (adjusted for scale) as the current drawn from the transistors in the sub-cells as the output amplitude changes. If the currents are equal, then their drain-to-source voltages VDS will be equal, and the transistors in the replica will have their terminal characteristics (gate-to-source voltage VGS and drain-to-source voltage VDS) matched to the transistors of the sub-cells. Note that matching the gate-to-source voltage VGS is handled by the propagation of the bias voltages VBP, VBN to the sub-cells; the optional switchable replica resistors 890 takes care of matching the drain-to-source voltage VDS.

Further, the two-loop replica circuit 850 can be used in either open loop or in closed loop to find appropriate values for the bias voltages VBP, VBN. For example, in open loop, the reference voltage VREF_TUNE can be swept to find a value that is appropriate to reduce or minimize common-mode noise. The selected setting for the single reference voltage VREF_TUNE can be used across the various unit driver cells, such as across all the unit driver cells (FIG. 1D). In closed-loop operation, the voltage reference VREF_TUNE can be used as an actuator in a feedback loop; in one embodiment, a relatively good setting for the voltage reference VREF_TUNE can be found for each device or channel. A similar technique can be used for the single-loop replica circuit 800 and will be readily determined by one of ordinary skill in the art.

FIGS. 9A-9D illustrate four separate loops of replica circuits similar to the two-loop replica circuit 850 to accommodate cascoded output stages as described earlier in connection with FIG. 4. For example, when two transistors are cascoded (so that n=4, wherein n is the number of transistors in series between ground and $nV_{DD}$ as discussed in FIG. 4), bias voltages VBP1, VBP2 VBN1, and VBN2 are generated for their corresponding level shifter circuits by the replica circuits 900, 920, 940, 960 of FIGS. 9A, 9B, 9C, and 9D, respectively. Of course, further extensions to higher numbers of n are possible. It should be noted that, in contrast to the transistors of the embodiments illustrated in FIGS. 8A and 8B, the replica transistors 906, 926, 946, 966 of FIGS. 9A-9D and the driver transistors 982, 984, 988, 986, 992, 994, 996, 998 of FIG. 9E can be of the lower-voltage thinner oxide construction.

Each of the replica circuit 920 and the replica circuit 940, which generate the bias voltages VBP1 and VBP2, respectively, is similar to the upper loop of the two-loop replica circuit 850 described earlier in connection with FIG. 8B, but with the addition of a resistor $R_{PR2}$ 902 and a resistor 916 for a replica circuit 900 and a resistor $R_{PR1}$ 922 and a resistor 936 for the replica circuit 920. Each of the replica circuit 960 and the replica circuit 980, which generate the bias voltages VBN2 and VBN1, respectively, is similar to the lower loop of the two-loop replica circuit 850 described earlier in connection with FIG. 8B, but with the addition of a resistor $R_{NR2}$ 962 and a resistor 956 for the replica circuit 940 and a resistor $R_{NR1}$ 962 and a resistor 76 for the replica circuit 960. It will be understood that the various series resistances described herein can be combined when implemented.

Figure 9A:
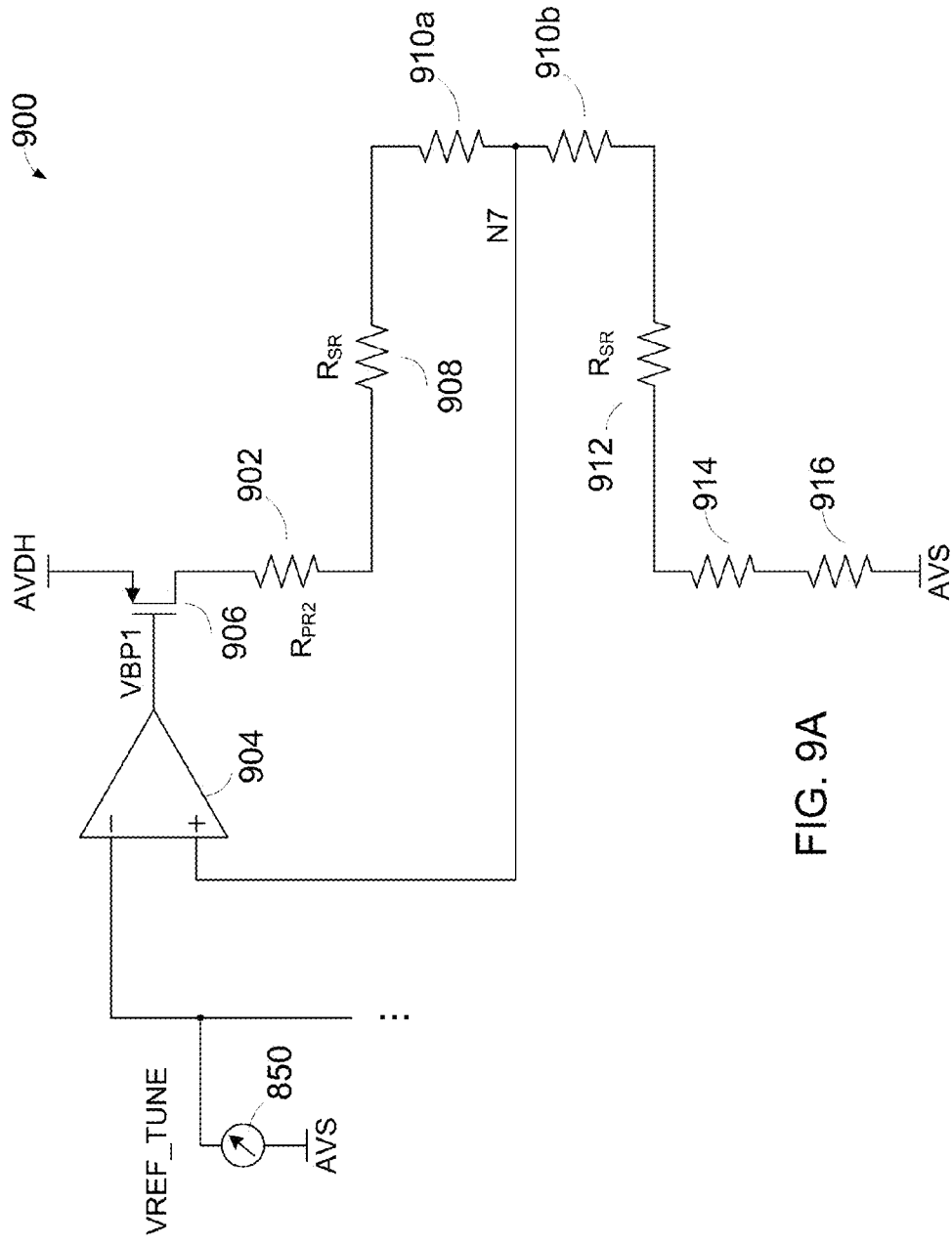
FIGS. 9A-9D illustrate a replica circuit that generates bias voltages VBP1, VBP2, VBN1, VBN2 for a cascoded differential output stage.
Figure 9B:
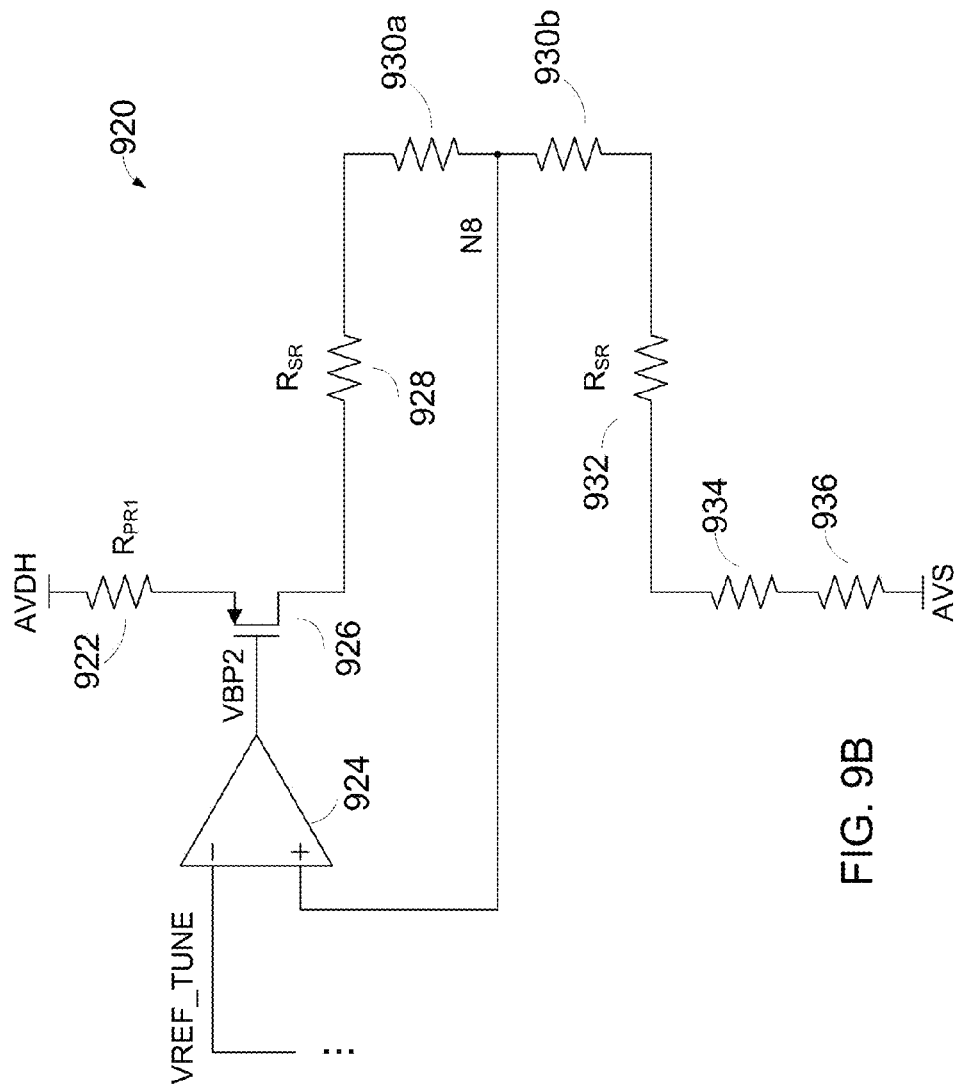

The voltage reference 852 that generates VREF_TUNE can be as described earlier in connection with FIG. 8B. The descriptions of the first operational amplifier 854, the first replica termination resistor $R_{SR}$ 858, the portions 860a, 860b of the first replica far-end termination resistor(s) 860, and the second replica termination resistor $R_{SR}$ 862 are applicable to the operational amplifier 904, replica termination resistor $R_{SR}$ 908, the portions 910a, 910b of a replica far-end termination resistor(s), and the replica termination resistor $R_{SR}$ 912, respectively, of the replica circuit 900 (FIG. 9A) and to the operational amplifier 924, the replica termination resistor $R_{SR}$ 928, the portions 930a, 930b of a replica far-end termination resistor(s), and the replica termination resistor $R_{SR}$ 932, respectively, of the replica circuit 920 (FIG. 9B). Further, with reference to the replica circuit 900 of FIG. 9A, a PMOS replica transistor 906 is a replica of a PMOS driver transistor 981 (FIG. 9E1), a resistor $R_{PR2}$ 902 replicates the on resistance of a PMOS driver transistor 982 (FIG. 9E1), a resistor 914 replicates the on resistance of an NMOS driver transistor 989 (FIG. 9E1), and a resistor 916 replicates the on resistance of an NMOS driver transistor 988 (FIG. 9E1).

With reference to the replica circuit 920 of FIG. 9B, a resistor $R_{PR1}$ 922 replicates the on resistance of the PMOS driver transistor 981 (FIG. 9E1), a PMOS replica transistor 926 is a replica of the PMOS driver transistor 982 (FIG. 9E1), a resistor 934 replicates the on resistance of the NMOS driver transistor 989 (FIG. 9E1), and a resistor 936 replicates the on resistance of the NMOS driver transistor 988 (FIG. 9E1). The voltage at nodes N7 and N8 are fed back to the operational amplifiers 904, 924 in a like manner as the voltage at the node N5 (FIG. 8B).

Figure 9C:
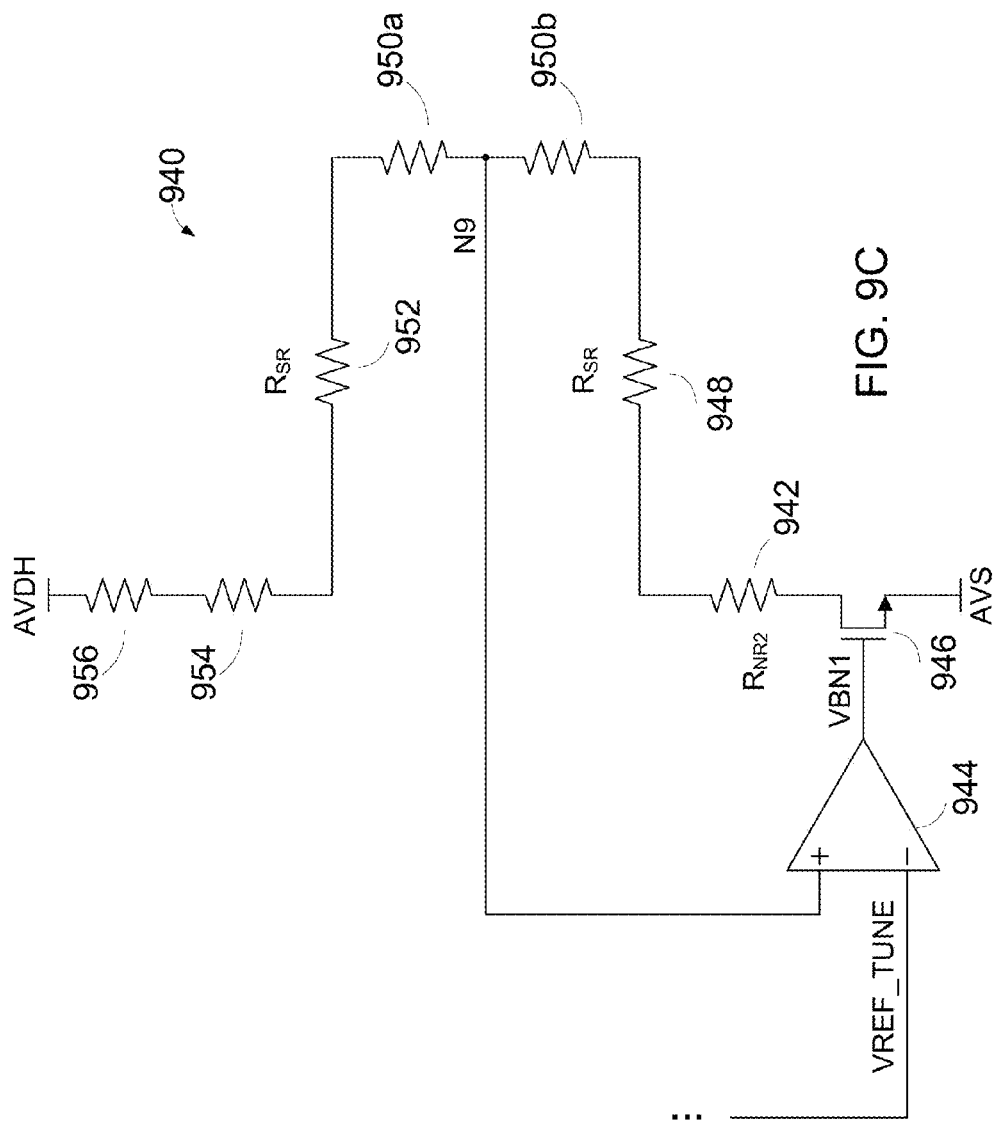
Figure 9D:
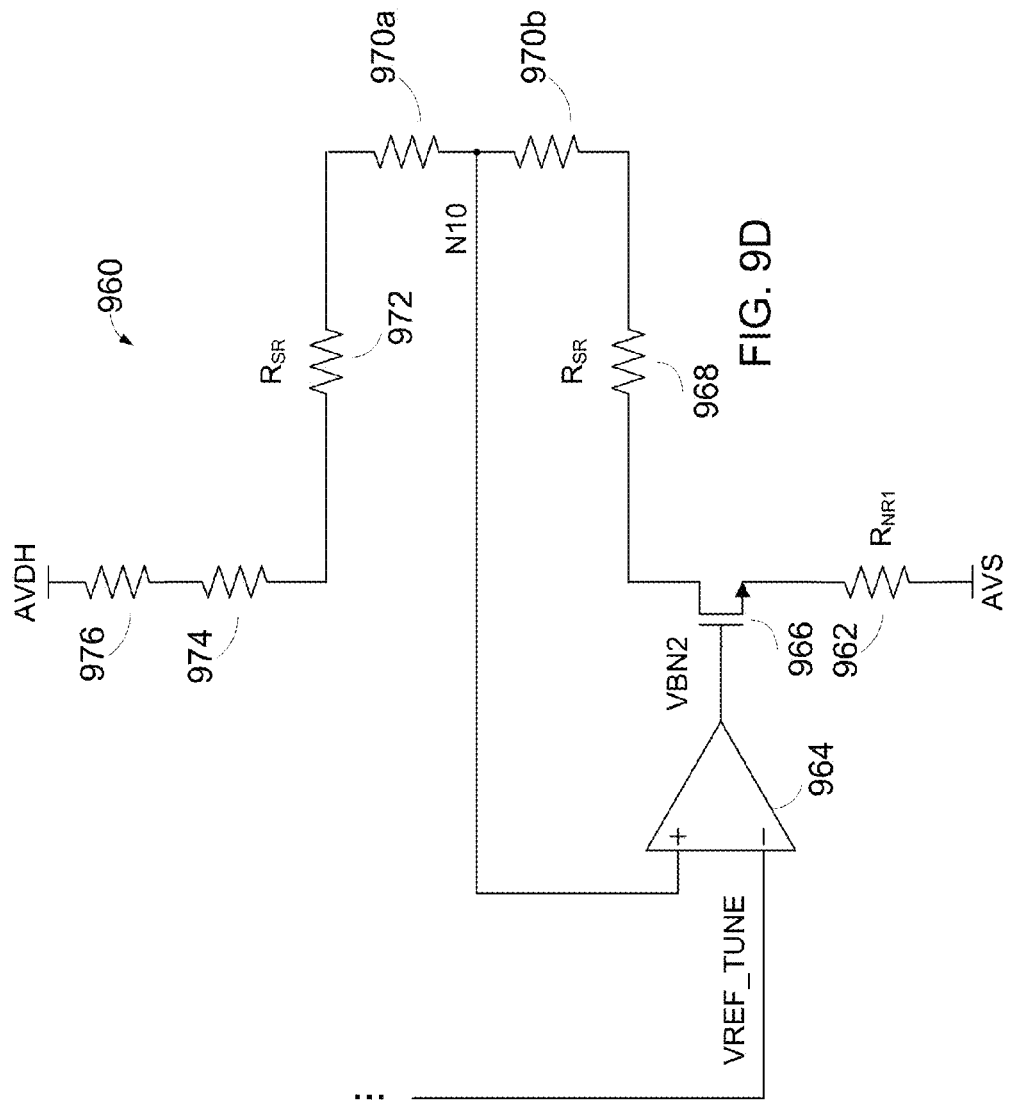

Similarly, the descriptions of the second operational amplifier 874, the third replica termination resistor $R_{SR}$ 878, the portions 880a, 880b of the second replica far-end termination resistor(s) 880, and the fourth replica termination resistor $R_{SR}$ 882 are applicable to the operational amplifier 944, the replica termination resistor $R_{SR}$ 948, the portions 950a, 950b of a replica far-end termination resistor(s), and the replica termination resistor $R_{SR}$ 952, respectively, of the replica circuit 940 (FIG. 9C) and to the operational amplifier 964, the replica termination resistor $R_{SR}$ 968, the portions 970a, 970b of a replica far-end termination resistor(s), and the replica termination resistor $R_{SR}$ 972, respectively, of the replica circuit 960 (FIG. 9D).

With reference to the replica circuit 940 of FIG. 9C, an NMOS replica transistor 946 is a replica of the NMOS driver transistor 988 (FIG. 9E1), a resistor $R_{NR2}$ 942 replicates the on resistance of the NMOS driver transistor 989 (FIG. 9E1), a resistor 954 replicates the on resistance of the PMOS driver transistor 982 (FIG. 9E1), and a resistor 956 replicates the on resistance of the PMOS driver transistor 981 (FIG. 9E1).

With reference to the replica circuit 960 of FIG. 9D, a resistor $R_{NR1}$ 962 replicates the on resistance of the NMOS driver transistor 988 (FIG. 9E1), an NMOS replica transistor 966 is a replica of the NMOS driver transistor 989 (FIG. 9E1), a resistor 974 replicates the on resistance of the PMOS driver transistor 982 (FIG. 9E1), and a resistor 976 replicates the on resistance of the PMOS driver transistor 981 (FIG. 9E1). The voltage at nodes N9 and N10 are fed back to the operational amplifiers 944, 964 in a like manner as the voltage at the node N6 (FIG. 8B).

Table I illustrates examples of values for the resistors in FIGS. 9A-9D. The resistor values can vary in a broad range particularly in view of possible transistor and resistor scaling, and alternative values will be readily determined by one of ordinary skill in the art. In addition, the resistances of the resistors described herein can be combined and/or distributed among more or fewer resistors. With the resistor values as selected in Table I, the feedback loops should operate such that the corresponding "on" resistance of each of the transistors 906, 926, 946, 966 is about 0.5 kiloohms.

TABLE I

| FIG. 9A | FIG. 9B | FIG. 9C | FIG. 9D | Resistance (Ohms) |
|---|---|---|---|---|
| 902 | 922 | 942 | 962 | 0.5k |
| 908 | 928 | 948 | 968 | 1.4k |
| 910a | 930a | 950a | 970a | 48 × 50 |
| 910b | 930b | 950b | 970b | 48 × 50 |
| 912 | 932 | 952 | 972 | 1.4k |
| 914 | 934 | 954 | 974 | 0.5k |
| 916 | 936 | 956 | 976 | 0.5k |

FIGS. 9E1 and 9E2 illustrate cascoded examples 980, 990 showing the level shifter block 170 and cascoded output drivers. The level shifter block 170 can be as described earlier in connection with FIG. 1D and can include the first level shifter circuit 340 (FIG. 3C1) and the second level shifter circuit 360 (FIG. 3D1). In addition, the DC coupled paths of FIG. 11B can also be incorporated into the level shifter block 170.

For the cascoded example 980 (FIG. 9E1), the bias voltage VBP1 is applied as an input to the "VBP" node of the level shifter circuit 340 to generate DHP and DHN outputs to drive the PMOS driver transistor 986 and the PMOS driver transistor 981, respectively. The bias voltage VBP2 is applied as a static input to the gates of the PMOS driver transistor 982 and the PMOS driver transistor 987. Further, the bias voltage VBN1 is applied as an input to the "VBN" node of the level shifter circuit 360 to generate DLP and DLN outputs to drive the NMOS driver transistor 988 and the NMOS driver transistor 983, respectively. The bias voltage VBN2 is applied to the gates of the NMOS driver transistor 984 and the NMOS driver transistor 989. Other optional features, such as a transmission gate, low-pass filter, etc., can also be used with the cascoded output drivers.

For the cascoded example 990 (FIG. 9E2), the bias voltage VBP2 is applied as an input to the "VBP" node of the level shifter circuit 340 to generate DHP and DHN outputs to drive the PMOS driver transistor 997 and the PMOS driver transistor 992, respectively. The bias voltage VBP1 is applied as a static input to the gates of the PMOS driver transistor 991 and the PMOS driver transistor 996. Further, the bias voltage VBN2 is applied as an input to the "VBN" node of the level shifter circuit 360 to generate DLP and DLN outputs to drive the NMOS driver transistor 999 and the NMOS driver transistor 994, respectively. The bias voltage VBN1 is applied to the gates of the NMOS driver transistor 993 and the NMOS driver transistor 998. Other optional features, such as a transmission gate, low-pass filter, etc., can also be used with the cascoded output drivers.

Figure 10A:
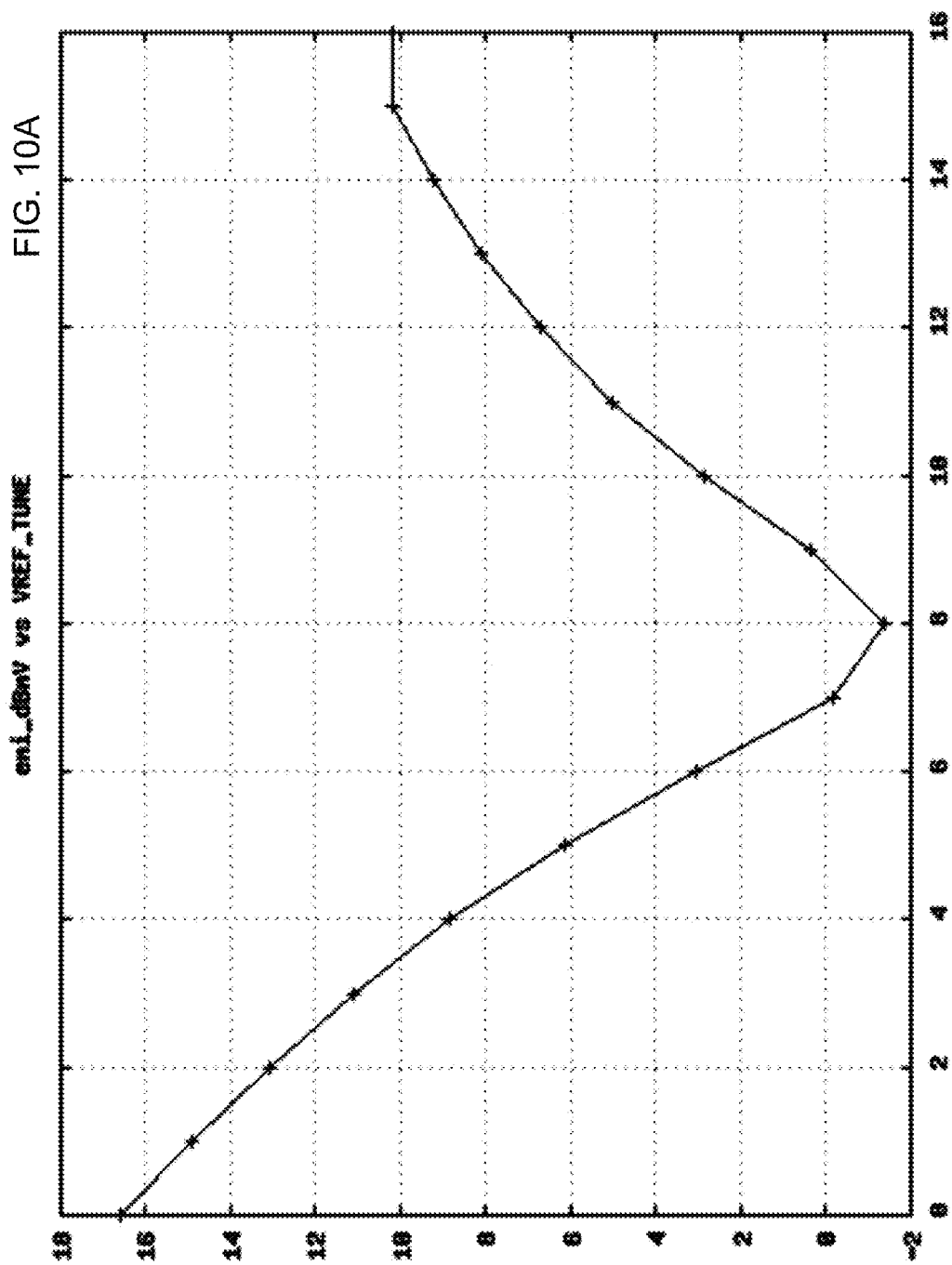
FIG. 10A is a chart that illustrates simulated EMI generation (vertical axis) versus a digital-to-analog converter (DAC) setting (horizontal axis) that is used to control the voltage reference VREF_TUNE of FIG. 8B.

FIG. 10A is a chart that illustrates simulated EMI generation (vertical axis in dBmV) versus a digital-to-analog converter (DAC) setting (horizontal axis) that is used to control the voltage reference VREF_TUNE. FIG. 10A illustrates how the EMI varies with the DAC setting. In this particular example, the optimum DAC setting is 8.

In the closed-loop configuration that will be described later in connection with FIG. 15, the common-mode voltage is low-pass filtered on-chip to generate the filtered common-mode voltage avg(VCM). The feedback loop then uses the filtered common-mode signal avg(VCM) as an input to assess whether the voltage reference VREF_TUNE should be increased or decreased. If the filtered common-mode signal avg(VCM) is greater than the midpoint value AVDH/2 or the midpoint between the power supply voltages AVDH and AVS, then the voltage reference VREF_TUNE should be decreased. Else, it should be increased. The feedback loop can either be an analog loop or a digital loop. In an analog loop, an operational amplifier can compare the filtered common-mode voltage avg(VCM) to the midpoint value AVDH/2 and set the voltage reference VREF_TUNE so as to reduce or minimize their difference. Stability issues should be taken into considerations for the analog loop. With the digital loop, a comparator is used to compare the filtered common-mode voltage avg(VCM) to the midpoint value AVDH/2. If the filtered common-mode voltage avg(VCM) is greater than the midpoint value AVDH/2, then the comparator outputs a 1. Otherwise, it outputs a zero. A digital controller can then use the output of the comparator to converge to a relatively good voltage reference VREF_TUNE setting, such as an optimum voltage reference VREF_TUNE setting.

Figure 10B:
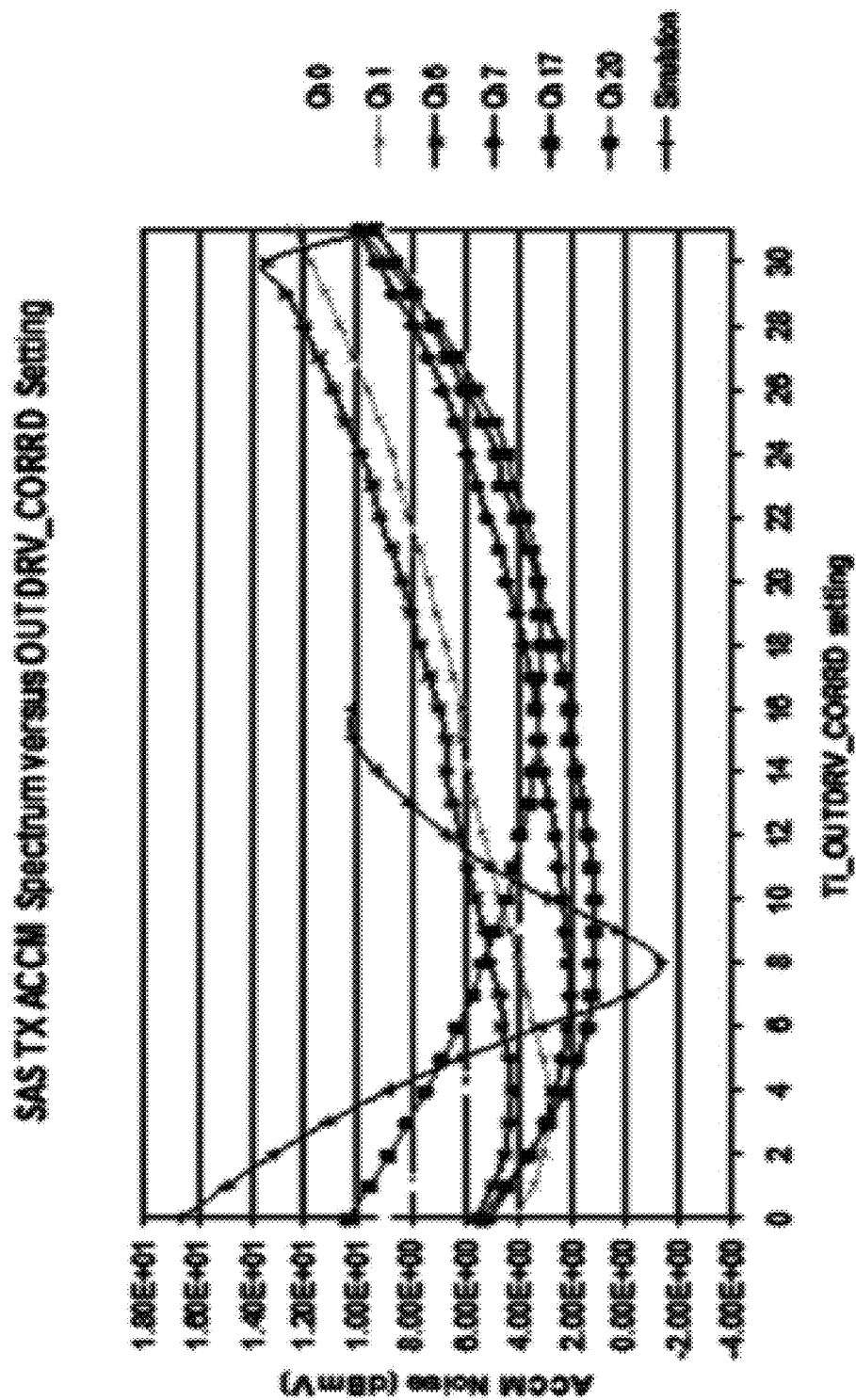
FIG. 10B illustrates AC common-mode (ACCM) noise (vertical axis) versus a DAC setting (horizontal axis) for the level shifter circuit for several different channel characteristics.

FIG. 10B illustrates laboratory results of AC common-mode (ACCM) noise (vertical axis in dBmV) versus a DAC setting (horizontal axis) for the level shifter circuit for several different channel characteristics. By contrast, FIG. 10A illustrates simulation results. As illustrated by FIG. 10B, a relatively good choice for the DAC setting can vary due to channel-to-channel variations. In the illustrated example, the optimum DAC settings for channels 6 and 20 are 4 and 18, respectively. When operated in open loop, the transmitter is therefore typically not always using an optimum voltage reference VREF_TUNE setting.

Table II illustrates a simulated example of the improvement to EMI performance with closed loop operation versus open loop operation. The simulation performed used local Monte Carlo (LMC) to simulate mismatch variations.

TABLE II

| Parameter | Min | Typ | Max | Notes |
|---|---|---|---|---|
| EMI dBmV without feedback | −5.18 | 5.62 | 15.6 | Mismatch sim |
| EMI dBmV with feedback | −10.3 | −2.47 | 4.19 | with 31 |
| delta (dB) | 5.12 | 8.09 | 11.41 | iterations |

The functionality of the replica circuit 800, 850 can be summarized as follows: When operated in open loop with the voltage reference VREF_TUNE set to the middle of the range, the replica circuit 800, 850 provides a relatively coarse bias voltage VBP, VBN settings for matching the rise and fall times. Closing the loop allows the replica circuit 800,850 to fine tune the setting over mismatch variations for improved common-mode noise. The voltage reference VREF_TUNE plays a role similar to the control voltage in a PLL. In open loop, the PLL generates a frequency close to but typically not exactly equal to the desired frequency. Closing the loop allows the PLL to fine tune the control voltage so as to generate the desired frequency and acquire phase lock.

Squelch Mode and High-Impedance Mode

FIG. 11A1 illustrates a level shifter unit 1100 having both the first level shifter 340 and the second level shifter 360 described earlier in connection with FIGS. 3C1 and 3D1. The level shifter unit 1100 can be used in place of the level shifter 170 (FIG. 1D). The illustrated level shifters 340, 360 are capacitively coupled. In one embodiment, when it is desirable to include a squelch mode and/or a high-impedance mode, additional DC paths are incorporated into the level shifters 340, 360. FIG. 11A2 illustrates waveforms at various nodes of the illustrated level shifters of FIG. 11A1.

Figure 11B:
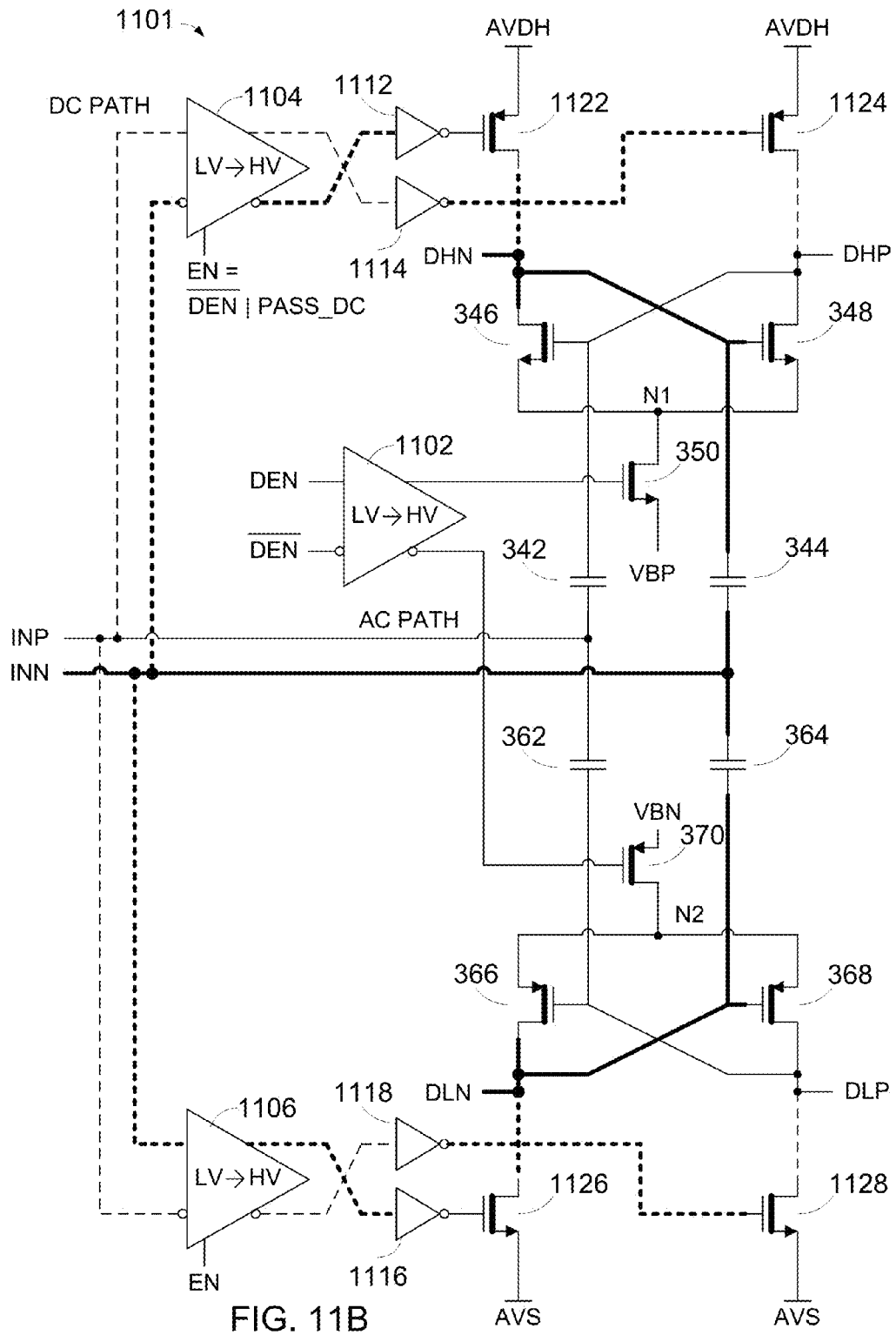
FIG. 11B illustrates a level shifter with both capacitively-coupled paths and direct current (DC) coupled paths according to an embodiment of the invention.

FIG. 11B illustrates a level shifter unit 1101 according to an embodiment of the invention. The level shifter unit 1101 can be used in place of the level shifter 170 (FIG. 1D). The level shifter unit 1101 has both the capacitively-coupled paths of the level shifters 340, 360 of FIG. 3C1, 3C2 and 11A1 and adding direct current (DC) coupled paths and an enable path from the low-voltage side. The DC coupled paths are shown with dashed or dotted lines. The enable path includes a first DC level shifter 1102, which converts the enable signals DEN, $\overline{\text{DEN}}$ for enabling a sub-cell from the low voltage side to the high voltage side and should be included with or without the DC coupled paths. The DC coupled paths include a second DC level shifter 1104, a third DC level shifter 1106, a first inverter 1112, a second inverter 1114, a third inverter 1116, a fourth inverter 1118, a first DC path PMOS driver transistor 1122, a second DC path PMOS driver transistor 1124, a first DC path NMOS driver transistor 1126, and a second DC path NMOS driver transistor 1128.

The input signals INP, INN are applied as inputs to the second DC level shifter 1104 and to the third DC level shifter 1106, which convert the signals from the low-voltage side to the high-voltage side. The second DC level shifter 1104 and the third DC level shifter 1106 also receives as input an enable signal EN, which is the logical OR of the inverted enable $\overline{\text{DEN}}$ and PASS_DC signal as illustrated in Equation 9.

$$EN = \overline{\text{DEN}} + PASS\_DC \quad \text{Equation 9}$$

In the context of the second DC level shifter 1104, the third DC level shifter 1106, and Equation 9, the enable signal EN is high to enable the DC path and is low to disable the DC path. When normal operation is desired and the sub-cell is enabled, the data enable DEN is high and the inverted data enable $\overline{\text{DEN}}$ is low. Accordingly, when the enable signal DEN is high, the enable signal EN is low unless the signal PASS_DC is high. In other words, the DC path is typically disabled unless the sub-cell is disabled or unless the signal PASS_DC is high, which can be the case for squelching or high impedance modes.

In one embodiment, these DC level shifters 1102, 1104, 1106 are implemented by the level shifter 300 described earlier in connection with FIG. 3A1 and therefore have logic levels at about 0 volts and at the supply voltage AVDH. However, other level shifters can alternatively be used. The level-shifted output of the second DC level shifter 1104 and to the third DC level shifter 1106 are provided as inputs to the inverters 1112, 1114, 1116, 1118, which can, for example, be implemented by standard CMOS inverters with the "thick oxide" transistors. Other types of inverters can alternatively be used. The outputs of the inverters 1112, 1114, 1116, 1118, are provided as inputs to gates of the transistors 1122, 1124, 1126, 1128.

Sources of the first DC path PMOS driver transistor 1122 and the second DC path PMOS driver transistor 1124 are coupled to the power supply voltage AVDH. The drain of the first DC path PMOS driver transistor 1122 is coupled to the node corresponding to the data high negative logic signal DHN, and the drain of the second DC path PMOS driver transistor 1124 is coupled to the node corresponding to the data high positive logic signal DHP. Sources of the first DC path NMOS driver transistor 1126 and the second DC path NMOS driver transistor 1128 are coupled to the power supply voltage AVS, which can be ground. The drain of the first DC path NMOS driver transistor 1126 is coupled to the node corresponding to the data low negative logic signal DLN, and the drain of the second DC path NMOS driver transistor 1128 is coupled to the node corresponding to the data low positive logic signal DLP.

The logical states remain the same as previously described for the level shifter unit 1100 (FIG. 11A1) having only capacitively-coupled level shifters. However, when both DC coupled paths and capacitively-coupled paths are present, signal integrity can be compromised in high-speed applications. Hence, the DC path should be on only for low-speed applications, such as for squelch mode. In addition, "bold" lines in FIG. 11B illustrate data signals in one state (negative logic) while the normal lines illustrate the other state (positive logic). Of course, during operation, these data signals will be switching actively.

Squelch Mode

When in a squelch mode of operation, the transmitter should hold its differential outputs TXOP, TXON at the common-mode level. As will be discussed in greater detail later in connection with FIG. 13, a squelch mode can be implemented by generating contention, in which at least one PMOS driver transistor 166 (FIG. 1D) and at least one NMOS driver transistor 168 (FIG. 1D) are on for the TXOP line, and at least one PMOS driver transistor 172 (FIG. 1D) and at least one NMOS driver transistor 174 (FIG. 1D) are on for the TXON line. Typically, fewer than all of the N unit driver cells will be operated in this manner during the squelch mode.

FIG. 12A1 illustrates normal output waveforms of the high-swing transmitter of FIG. 1C1. In the illustrated example, the outputs TXOP, TXON are switching between about 440 mV and about 1.36 volts, with the power supply voltages AVDH, AVS being about 1.8 volts and 0 volts, respectively. FIG. 12A2 illustrates output waveforms of the high-swing transmitter of FIG. 1C1 before and after activation of the squelch mode. When in the squelch mode, the transmitter outputs TXOP, TXON, are both equal to about the common mode voltage AVDH/2, which is about 0.9 volts in the illustrated example.

FIG. 12B1 illustrates normal output waveforms of the high-swing transmitter of FIG. 1C1. In the illustrated example, the outputs TXOP, TXON are switching between about 440 mV and about 1.36 volts, with the power supply voltages AVDH, AVS being about 1.8 volts and 0 volts, respectively. FIG. 12B2 illustrates output waveforms of the high-swing transmitter of FIG. 1C1 before and after deactivation of the squelch mode.

In one embodiment, in order to speed up the time used to go out of the squelch mode, the power supply voltages AVDH, AVS provided to the level shifter unit 1101 (FIG. 11B) can optionally be replaced by regulated power supply voltages, AVD_REG_LS, AVS_REG_LS. These regulated power supply voltages AVD_REG_LS and AVS_REG_LS can be generated on-chip as described in Equation 10 and Equation 11. Of course, the power supply voltages can vary from the levels calculated using Equation 10 and Equation 11. The power supply voltage AVD corresponds to the voltage supply that is used for normal, non-higher voltage circuits. The coupling efficiency variable in Equation 10 and Equation 11 can be as expressed in Equation 6. While illustrated in Equation 10 and Equation 11 using precise formulas, it will be understood that other voltages for the regulated power supply voltages can be used. In a non-limiting example, the regulated power supply voltages conform to Equation 10 and Equation 11 to within about 5% or within 10%.

$$AVD\_REG\_LS = VBP + coupling\_efficiency \times AVD \quad \text{Equation 10}$$

$$AVS\_REG\_LS = VBN - coupling\_efficiency \times AVD \quad \text{Equation 11}$$

In one example, for a power supply voltage AVDH of 1.8V and a power supply voltage AVD of 0.9V, the replica circuit 850 (FIG. 8B) generates a bias voltage VBP of about 0.8V and a bias voltage VBN of about 1V. With a coupling efficiency of 90%, the regulated voltage AVD_REG_LS is about 1.6V, which is about 200 mV lower than AVDH. For the same coupling efficiency, the regulated voltage AVS_REG_LS is about 200 mV. As can be seen, the regulated voltages are about 200 mV away from the rails. Using the regulated voltages AVD_REG_LS and AVS_REG_LS to power up the level-shifter unit 1101 (FIG. 11B) charges the capacitors 342, 344, 362, 364 (FIG. 11B) of the level-shifter unit 1101 close to their steady-state value in normal, transient mode. This effectively reduces the time used to charge or discharge the capacitors 342, 344, 362, 364 when going out of the squelch mode and reduces steps on the resulting common-mode voltage. Since the SAS protocol sets relatively stringent requirements on the common-mode step when going out of the squelch mode, regulating the supplies of the level-shifter unit 1101 can be insufficient by itself. There can remain a small settling time when a cell is turned on or off due to mismatch variations.

In one embodiment, to address this issue, logic can be added to reduce or minimize the number of cells that change state at a time, that is, be turned on or off, when going into or out of the squelch mode. In one embodiment of the logic, there is at most one sub-cell out of, for example, 48 total cells in the high-swing transmitter, at a time that toggles between the on and off states such that the cells gradually enter or exit the squelch mode. If the lowest amplitude supported uses 12 of the 48 sub-cells, then one sub-cells caries 8.3% of the drive strength. Common-mode steps due to that sub-cell are therefore negligible, especially when the supply voltages of the level-shifter unit 1101 are regulated. At high amplitudes with even more cells enabled, the sub-cell that is turned on or off carries even less of the total drive strength and has virtually no influence on the common-mode step when going into or out of squelch.

Figure 13:
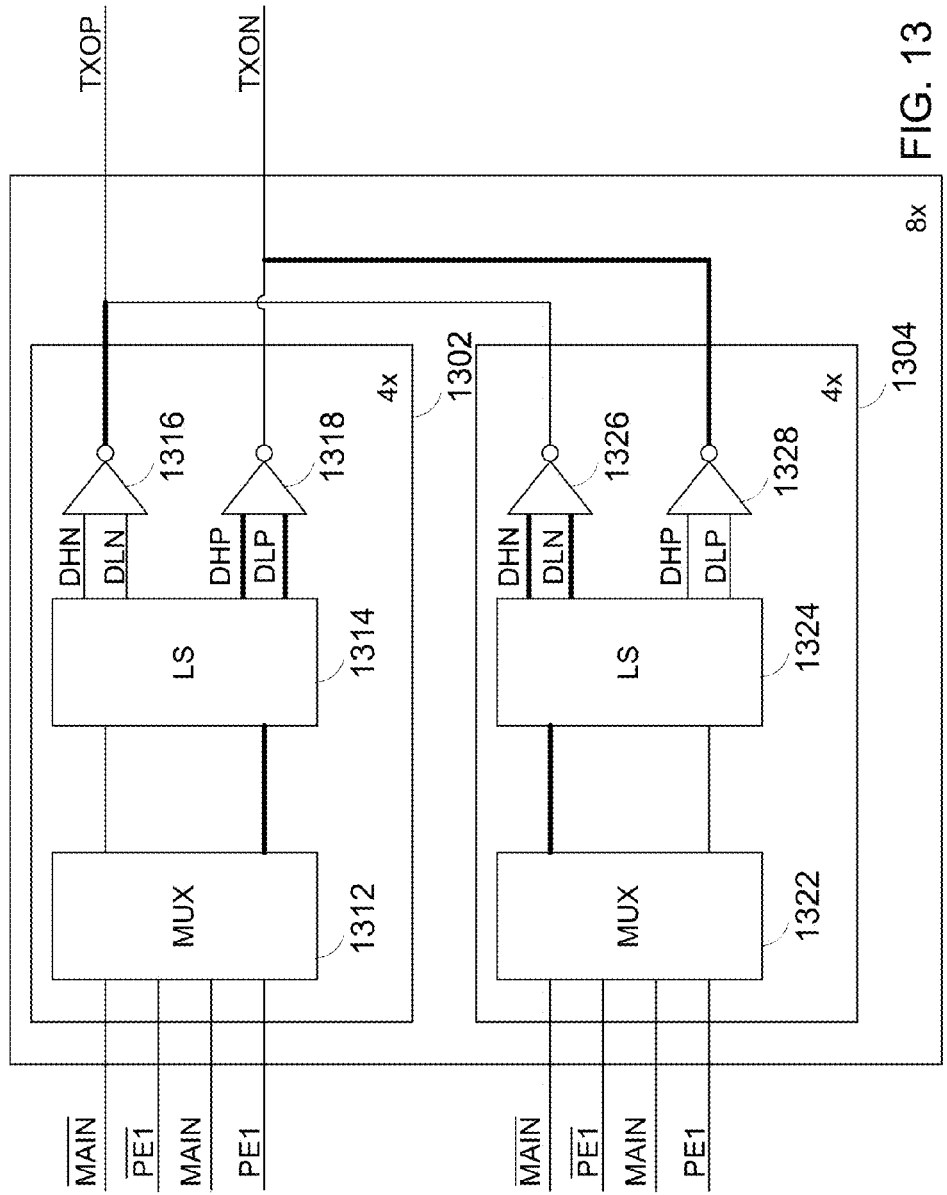
FIG. 13 illustrates an embodiment of implementing squelch.

FIG. 13 illustrates an embodiment of implementing squelch so as to have at most 1 sub-cell turned on or off when going into or out of squelch. Of course, in alternative embodiments, more than 1 sub-cell can be turned on or off at a time. As discussed earlier in connection with FIG. 1D, the transmitter can be made of N cells. These N cells can further be grouped into, for example, 8×, 4×, 2×, and 1× cells for efficient control. Various combinations can be selected for the particular voltage swing desired. In the example of FIG. 13, an 8× cell is actually built from two 4× cells with separate multiplexer controls for the two 4× cells. In normal mode, the two 4× cells within the 8× cell drive the same pattern; in squelch mode, the two 4× cells drive opposite logic so as to create contention within the 8× cell. As a result, the output of an 8× cell taken in isolation is squelched without having to pair it with another 8× cell. For some amplitude settings, pairing the 8× cell with another 8× cell is not possible and the 8× cell should be turned off for the output to be squelched (thereby creating common-mode spikes, which should be kept small).

FIG. 13 shows a way to solve the "pairing" problem: the 8× cell is self-squelching. Of course a 1× sub-cell cannot be split internally like, for example, 8×, 4×, and 2× cells. When possible, the 1× sub-cell can be paired with another 1× sub-cell to keep the output squelched; otherwise it should be turned off. Using this "self-squelch" approach for, for example, 8×, 4×, and 2× cells, there will be at most one sub-cell that should be turned off when going into squelch and that is going to happen when an odd number of sub-cells is enabled in normal mode.

Ordinarily, the enabled sub-cells operate in parallel to drive the same logic state. However, when more than 1 sub-cell is available, and particularly when an even number of sub-cells is being used, the sub-cells can be deliberately brought into contention for squelching. Contention is ordinarily a problem to be avoided, particularly with respect to computer busses, since it can cause logic errors, can be wasteful of power, and can cause overheating of components. For example, FIG. 13 illustrates one way in which an 8× sub-cell transmitter can be configured so that 4 sub-cells 1302 contend with 4 other sub-cells 1304 by driving opposite logic states. For clarity, simplified blocks are shown. The multiplexers (MUXes) 1312, 1322 can correspond to the multiplexed pre-drivers 162, 164 described earlier in connection with FIG. 5A. The level shifters 1314, 1324 can correspond to the level shifter unit 1101 described earlier in connection with FIG. 11B. The output drivers 1316, 1326 can correspond to the transistors 166, 168 and the termination resistor 118, and the output drivers 1318, 1328 can correspond to the transistors 172, 174 and the termination resistor 128.

In the illustrated example, the equalized path having pre-emphasis (PE1) can have the opposite static logic state as the main path. Alternatively, logic gates, such as AND and OR gates, can force particular lines to 0 or 1 as appropriate. The multiplexed pre-drivers 162, 164 can then be set to select the main path for some sub-cells and the equalized path for other sub-cells.

For example, four sub-cells drive a 1 state, while the remaining four drive a 0 state. The four cells driving a 1 each have their pull-up path enabled, while the four cells driving a zero each have their pull-down path enabled. As a result, a resistive path between the voltage biases AVDH and AVS exists. Since the replica circuit 850 (FIG. 8B) sets the pull-up and pull-down resistances to be equal, the positive-logic output signal TXOP should be equal to the negative-logic output signal TXON, and both should be midway between the power supply voltages AVDH, AVS or AVDH/2 for the case in which the power supply voltage AVS is zero. With this alternative implementation, none of the sub-cells need to change state (i.e. be turned on or off) when going into or out of squelch. Said another way, the same units that were activated to generate the desired output amplitude are maintained active when going into squelch mode. This reduces common-mode steps. The 4× and 2× cells use the same approach, whereas a 1× cell may potentially change state when going in or out of squelch if there is no other 1× cell with which to pair it.

High-Impedance Mode

The high-impedance mode of operation can useful to disable the transmitter and to save power, or possibly to change the output impedance of the transmitters. The two enable switches 350, 370 (FIG. 11B) that gate the bias voltages VBP, VBN illustrate one way of making the high-impedance mode possible. The enable switches 350, 370 are used to disable the positive feedback of the cross-coupled devices when the transmitter is to be put in high impedance mode. With the positive feedback disabled, the DC path can pull up the data high positive logic signal DHP and the data high negative logic signal DHN to AVDH (or AVD_REG_LS), thereby increasing significantly the resistance of the PMOS driver transistors. This sets the pull-up path in high impedance mode. Likewise, the DC path pulls down the data low positive logic signal DLP and the data low negative logic signal DLN nodes to set the pull-down path in high impedance mode. In high-impedance mode, relatively little to no static or dynamic current flows from the power supply voltage AVDH to the power supply voltage AVS, and so power consumption is reduced.

Scalability

One advantage of embodiments of the invention is that the transmitter architecture is applicable to a wide range of power supply voltages AVDH with no significant impact on signal integrity, rise and fall times, and jitter, and is accordingly readily scalable with respect to changes to the power supply voltage AVDH.

Figure 14A:
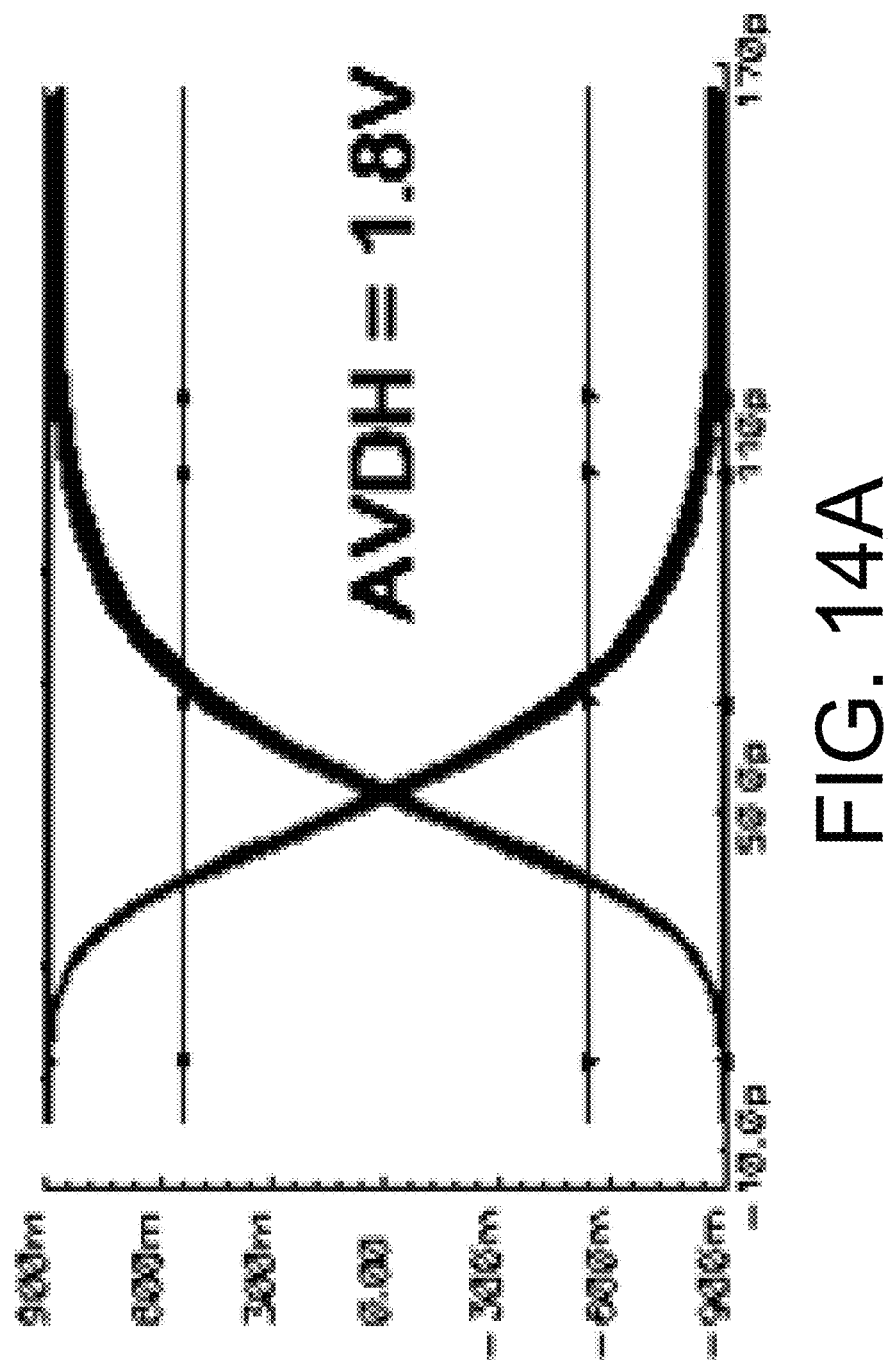
FIG. 14A-C illustrate output waveforms of the high-swing transmitter of FIG. 1C1 with varying supply voltages (AVDH) provided to the level shifter circuit for control of the output voltage level.
Figure 14B:
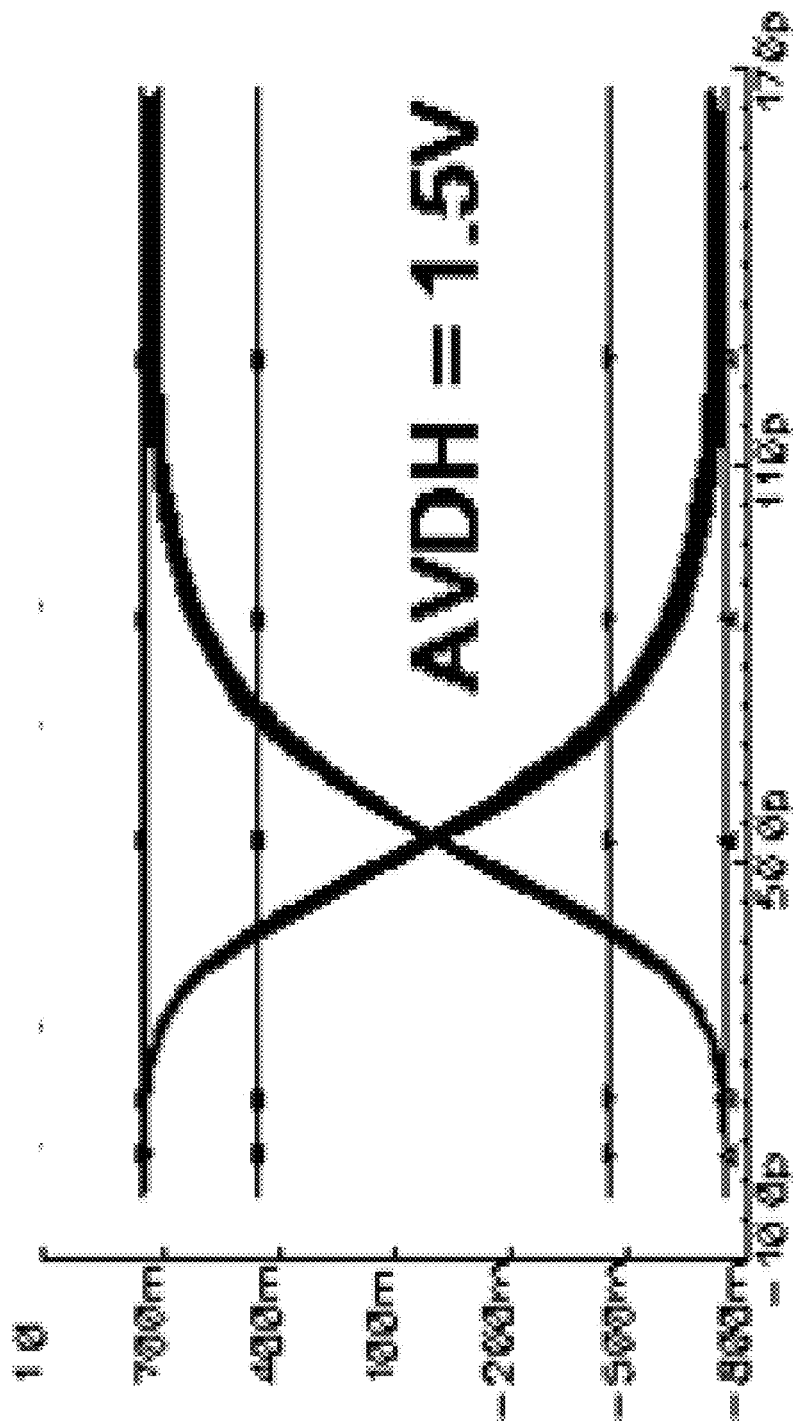
Figure 14C:
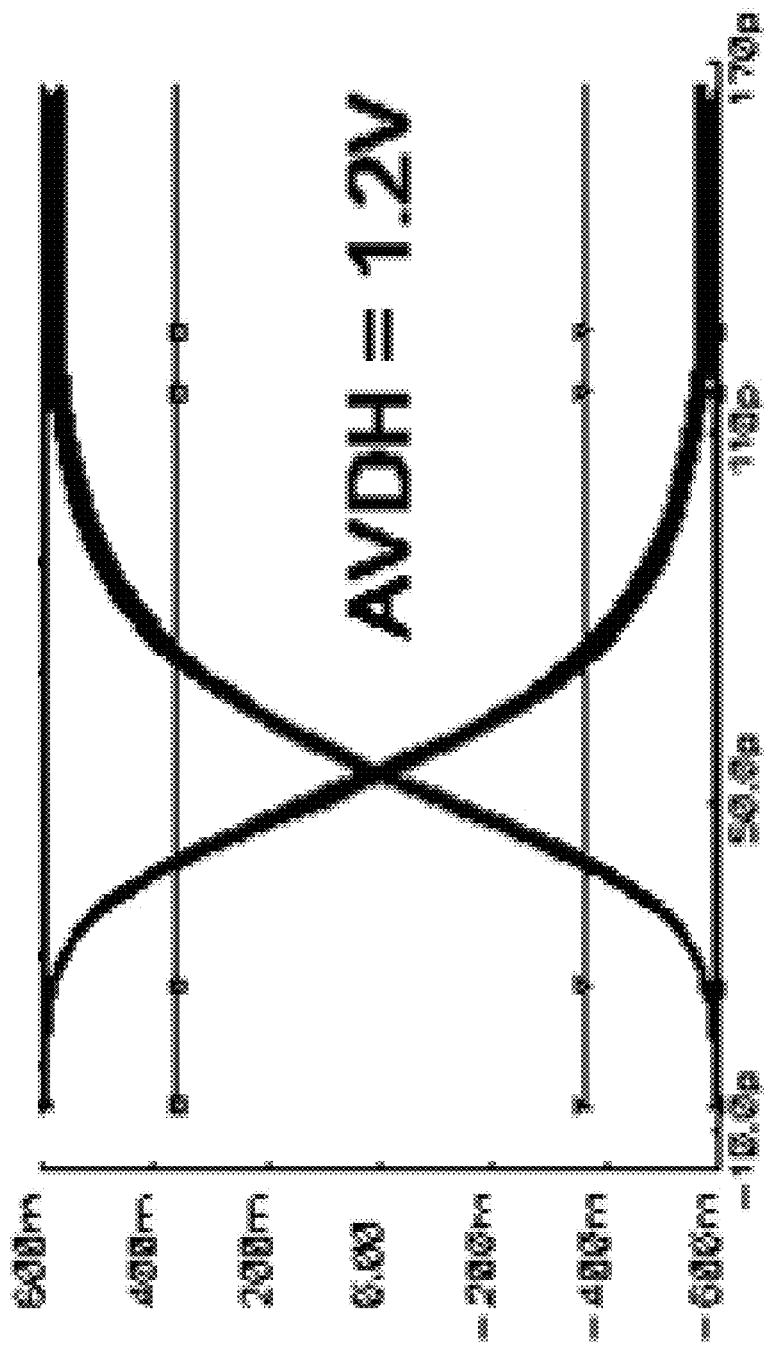

FIGS. 14A, 14B, and 14C illustrate simulated waveforms of output signals TXOP, TXON of the transmitter for three different AVDH supply voltages: 1.8V, 1.5V, and 1.2V, respectively. As can be seen in FIGS. 14A-14C, the architecture can handle AVDH supplies that approach the low-voltage supply AVD, which can be 0.9V in one embodiment. This can be used to tradeoff output amplitude for reduced power consumption. The replica circuits 800 (FIG. 8A), 850 (FIG. 8B) and the level-shifter units 1100 (FIG. 11A1), 1101 (FIG. 11B) permit the transmitter to be scalable.

The replica circuits 800, 850 are able to adapt to a lower power supply voltage AVDH by simply lowering bias voltage VBP. As the power supply voltage AVDH approaches the lower power supply voltage AVD, the bias voltage VBP gets closer and closer to the power supply voltage AVS, which is typically ground. A rail-to-rail operational amplifier for the first operational amplifier 804 (FIG. 8A) or the first operational amplifier 854 (FIG. 8B) should therefore be used in the replica circuit 800, 850 when support for the widest possible range of voltages for the power supply voltage AVDH is desired.

The level shifter unit 1100 (FIG. 11A1) or the level shifter unit 1101 (FIG. 11B) also contribute to making the overall architecture scalable. First, the level shifter unit 1100, 1101 looks like a passive circuit in normal mode, so a lower voltage headroom due to a lower supply will not be a problem, to some extent. Second, the third NMOS transistor 350 (FIG. 3C1) can pass through the shifted-down bias voltage VBP as the power supply voltage AVDH scales down.

Closed Loop Adaptive Feedback

Figure 15:
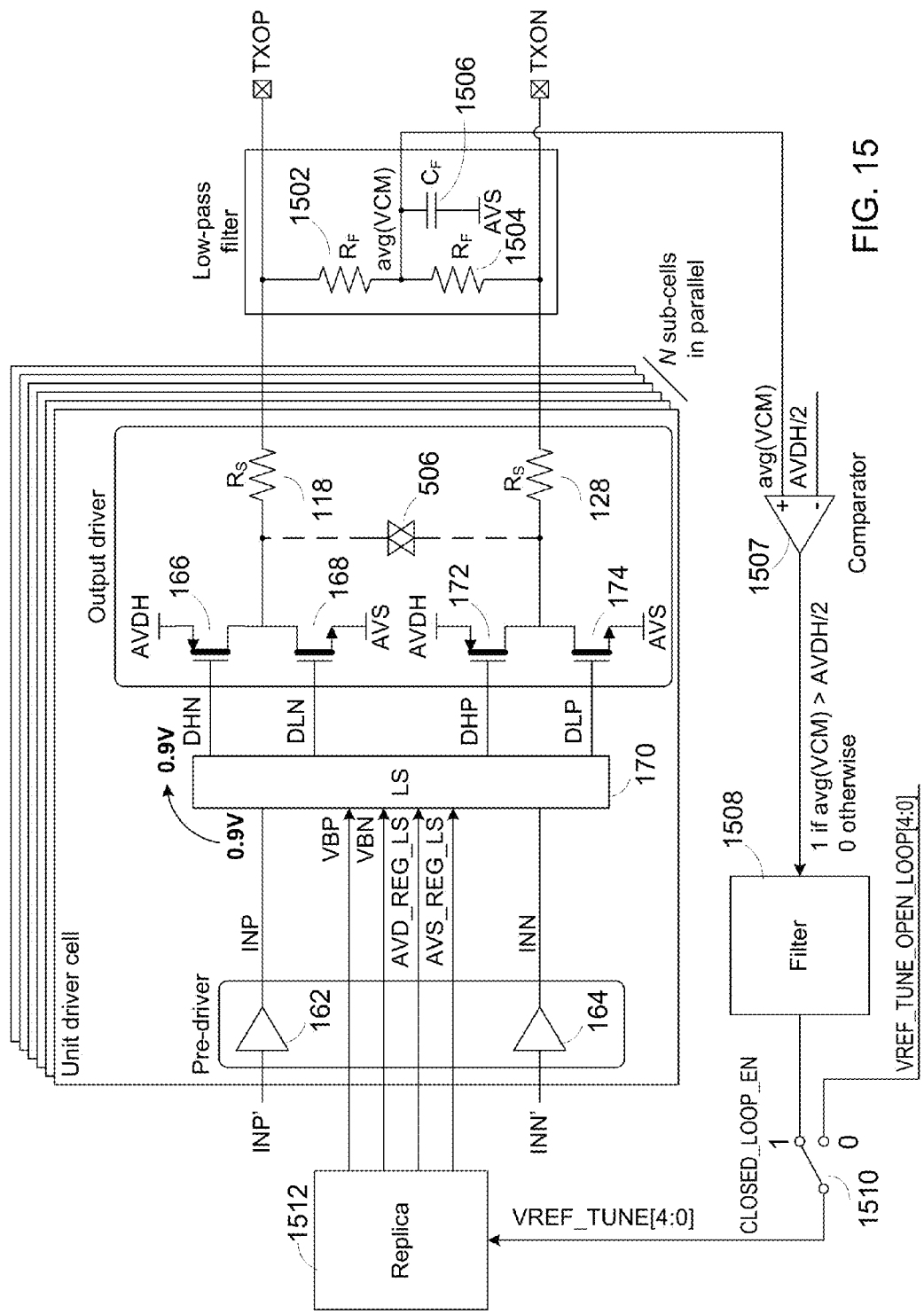
FIG. 15 illustrates a scalable high-swing transmitter with rise/fall time mismatch compensation with a feedback loop for level shifter bias control according to an embodiment of the invention.

FIG. 15 illustrates a scalable high-swing transmitter with rise/fall time mismatch compensation with a feedback loop for level shifter bias control according to an embodiment of the invention. As discussed earlier in connection with FIG. 1D, N unit driver cells or "sub-cells" can be instantiated in parallel, and the value for N can vary in a very broad range.

The bias voltage VBP, the bias voltage VBN, the regulated power supply voltage AVD_REG_LS, and the regulated power supply voltage AVS_REG_LS are provided as inputs to the inputs to the level shifter (LS) 170. The output stage shown in FIG. 15 uses thick-oxide transistors, but cascoded thin-oxide transistors could also be used as described earlier in connection with FIG. 4. An optional transmission gate 506 as described earlier in connection with FIG. 5A connects the positive and negative branches of the output driver and is used as a parallel termination. When a unit cell is enabled, the transmission gate should be disabled; when the unit cell is disabled to reduce the output amplitude, the transmission gate should be enabled to maintain the output impedance relatively constant. In the illustrated embodiment, a unit cell is disabled by pulling signals DHP and DHN up and pulling signals DLP and DLN down. In one embodiment, this is implemented using the DC path of the level shifter unit 1101 described earlier in FIG. 11B by control of the enable signal EN applied to the level shifters 1104, 1106. This provides an alternative way of disabling a sub-cell. For general principles regarding configuration of amplitude, de-emphasis, and parallel termination, please refer to U.S. Pat. No. 7,501,851, the disclosure of which is hereby incorporated by reference herein.

Two resistors $R_F$ 1502, 1504 are connected in series between the outputs TXOP and TXON. The resistors $R_F$ 1502, 1504 should have a high enough impedance to not load the outputs TXOP, TXON. The common tap of the resistors $R_F$ 1502, 1504 is connected to a relatively large on-chip capacitor $C_F$ 1506 to form a low-pass filter to generate the filtered common-mode signal avg(VCM). In the illustrated embodiment, the filtered common-mode signal avg(VCM) is then provided as an input to a comparator 1507. The comparator 1507 compares the filtered common-mode signal avg (VCM) with a reference for the common mode, which can be, for example, half of the supply voltage AVDH when the supply voltage AVS is zero. Of course, ratios other than half can be used with appropriate adjustments to the voltage reference AVDH/2, which can be adjusted via a change in an associated voltage divider, control of a DAC output, or the like.

Depending on the output value of the comparator 1507, a filter 1508, which can be embodied by a digital controller, will either increase on decrease a digital signal VREF_TUNE [4:0]. In the illustrated embodiment, the digital signal VREF_TUNE[4:0] corresponds to a 5-bit wide digital signal, and a digital-to-analog converter converts the digital signal VREF_TUNE[4:0] to the analog voltage reference VREF_TUNE inside the block for a replica circuit 1512; this analog voltage sets the reference of the operational amplifiers 854, 874 of FIG. 8B. Other features of the replica circuit 1512 can be as described for the replica circuit of FIG. 8B. Should it be desired to hold the analog voltage reference VREF_TUNE at a particular value, the loop can be effectively opened up via a switch 1510, which then provides a digital signal VREF_TUNE OPEN LOOP[4:0] as the digital signal VREF_TUNE[4:0]. The digital signal VREF_TUNE OPEN LOOP[4:0] can be, for example, a value stored during production test. Of course, other methods of opening up the feedback loop, such as latching, can alternatively be used, and the switching and/or muxing can be performed in the analog domain as well. For example, in another embodiment, the switch 1510 can be implemented in analog domain and select between the voltage reference derived from the digital signal VREF_TUNE[4:0] or the voltage VREF_TUNE from the voltage reference 852 described earlier in connection with FIG. 8B.

In an alternative embodiment, the comparator 1507, the filter 1508, and the D/A converter of the replica circuit 1512 can be replaced by an opamp to implement analog compensation instead of digital compensation.

Physical Link Example

Figure 16:
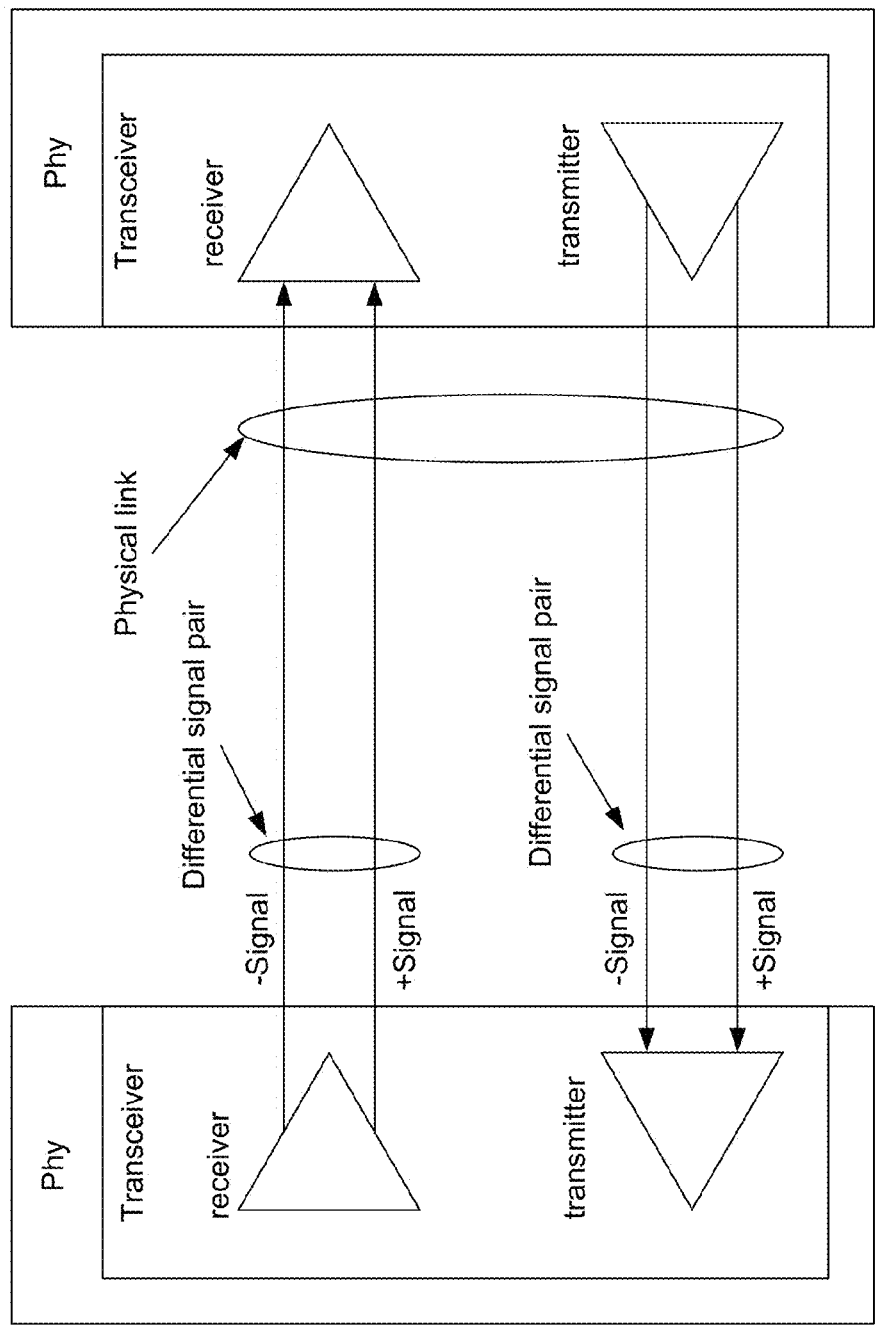
FIG. 16 illustrates a physical link, which is an example of an environment in which an embodiment of the invention can be incorporated.

In one example, the high-swing transmitter with rise/fall time mismatch compensation can be instantiated 24 times in a device for use in, for example, a SAS RAID controller supporting 24 links×6 Gb/s per link. As shown in FIG. 16, a physical link can include a set of four wires arranged as two differential signal pairs. One differential signal transmits in one direction while the other differential signal transmits in the opposite direction. Data may be transmitted in both directions simultaneously. A physical layer PHY contains a transceiver (1 transmitter+1 receiver) that electrically interfaces to a physical link, which attaches to another physical layer PHY.

The disclosed architecture makes use of multiple cells connected in parallel to provide an effective output impedance matched to the load impedance. The disclosed architecture provides a relatively constant output impedance for supported amplitude and de-emphasis settings. Alternatively, the output impedance can be changed by putting some of the cells in high-impedance mode. In one embodiment: the output stage can be powered from a relatively high-voltage supply and use thick-oxides transistors instead of thin-oxide transistors. Alternatively, the thick-oxide transistors can be replaced by cascoded low-voltage transistors. With thin-oxide transistors, cascoding can be used to limit electrical overstress. A high-speed level-shifter is disposed in the signal path between the pre-driver and the output driver to interface low-voltage logic to high-voltage logic. A replica of the output driver generates bias voltages that keep the rise/fall times matched and the output impedance relatively constant over process, voltage, and temperature (PVT) variations.

Embodiments of the invention introduce innovations including, but not limited to, the following: the level-shifter (see FIGS. 3C1, 3D1, 11B) includes a capacitively coupled architecture and adds 1) a programmable shift of the outputs, 2) a DC path, and 3) an enable switch. The programmable shift is controlled by the replica circuit and is used to compensate for the output stage's FET and poly resistance variations over PVT. This functionality provides control over the output impedance, a good matching of the rise and fall times, and therefore low common-mode noise. The programmable shift can be fine tuned automatically by the replica circuit when the amplitude setting changes. The DC path is used to support a squelch/idle mode, during which the transmitter holds its differential outputs at the common-mode level for some time. The squelch/idle mode can be a required feature for standards such as SAS and PCI-Express. One particularity of the DC path implementation is that it can be fully disabled in normal mode to provide better signal-integrity (that is, the level-shifter looks like a passive circuit in normal mode, with only the capacitors in the data path). The level-shifter shown in FIG. 3B also has a DC path, but the later is an inherent part of the level-shifting functionality and cannot be disabled. Signal integrity therefore suffers at high speed. The level-shifter of U.S. Pat. No. 7,586,358 does not have a DC path and therefore cannot support a squelch/idle mode. The DC path is also used to support a high-impedance mode, during which the transmitter should have a high output impedance. The enable switch is added so that the positive feedback of the cross-coupled devices of the level-shifter can be disabled when the output stage is to be put in high-impedance mode.

The architecture can support a wide range of voltage supplies levels. The circuit adapts automatically as the supply voltage is increased (to provide a higher output swing) or decreased (to save on power). The rise and fall times can be equalized for low common-mode noise and EMI over PVT and mismatch variations. The compensation is analog, so it does not suffer from the granularity of a digital approach.

The foregoing description and claims may refer to elements or features as being "connected" or "coupled" together. As used herein, unless expressly stated to the contrary, "connected" means that one element/feature is directly or indirectly connected to another element/feature, and not necessarily mechanically. Likewise, unless expressly stated to the contrary, "coupled" means that one element/feature is directly or indirectly coupled to another element/feature, and not necessarily mechanically. Thus, although the drawings illustrate various examples of arrangements of elements and components, additional intervening elements, devices, features, or components may be present in an actual embodiment.

As used herein, a "node" refers to any internal or external reference point, connection point, junction, signal line, conductive element, or the like at which a given signal, logic level, voltage, data pattern, current, or quantity is present.

Various embodiments have been described above. Although described with reference to these specific embodiments, the descriptions are intended to be illustrative and are not intended to be limiting. Various modifications and applications may occur to those skilled in the art.

What is claimed is:

1. An apparatus comprising:
   a first switching circuit configured to receive a differential data signal and a first bias voltage, wherein the first switching circuit is configured to convert the differential data signal to a first PMOS drive signal and a second PMOS drive signal for a first PMOS driver transistor and a second PMOS driver transistor, respectively, wherein the first switching circuit is configured to change a state of the first and second PMOS drive signals in response to a change in state of the data signal, wherein a first state of the first or second PMOS drive signal turns on the corresponding PMOS driver transistor and has a voltage level of the first bias voltage, wherein a second state of the first or second PMOS drive signal turns off the corresponding PMOS driver transistor;
   a second switching circuit configured to receive the differential data signal and a second bias voltage, wherein the second switching circuit is configured to convert the differential data signal to a first NMOS drive signal and a second NMOS drive signal for a first NMOS driver transistor and a second NMOS driver transistor, wherein the second switching circuit is configured to change a state of the NMOS drive signal in response to a change in state of the data signal, wherein a first state of the first or second NMOS drive signal turns on the corresponding NMOS driver transistor and has a voltage level of the second bias voltage, and wherein a second state of the first or second NMOS drive signal turns off the corresponding NMOS driver transistor;
   a first multiplexer configured to select at least between a first signal input and a second signal input different from the first signal input by phase and/or delay to generate the differential data signal for the first switching circuit and the second switching circuit;
   a third switching circuit configured to receive a second differential data signal and configured to convert the second differential data signal to third and fourth PMOS drive signals for third and fourth PMOS driver transistors, respectively;

a fourth switching circuit configured to receive the second differential data signal and configured to convert the second differential data signal to third and fourth NMOS drive signals for third and fourth NMOS driver transistors, respectively; and a second multiplexer configured to select at least between a first signal input and a second signal input different from the first signal input by phase and/or delay to generate the second differential data signal, wherein the first multiplexer and the second multiplexer select the same signal for normal operation and select different signals for a squelch mode.

2. The apparatus of claim 1:
wherein the first switching circuit further comprises:
a first NMOS transistor;
a second NMOS transistor, wherein sources of the first NMOS transistor and the second NMOS transistor are electrically connected to a first node;
a first capacitor;
a second capacitor; and
a first enable switch configured to receive the first bias voltage and to selectively provide the first bias voltage to the first node,
wherein the first switching circuit is configured to generate the first state of the first and second PMOS drive signals via capacitive coupling and to generate the second state of the first and second PMOS drive signals via a combination of capacitive coupling and turning on of at least one of the first NMOS transistor or the second NMOS transistor; and
wherein the second switching circuit further comprises:
a first PMOS transistor;
a second PMOS transistor, wherein sources of the first PMOS transistor and the second PMOS transistor are electrically connected to a second node;
a third capacitor;
a fourth capacitor;
a second enable switch configured to receive the second bias voltage and to selectively provide the second bias voltage to the second node;
wherein the second switching circuit is configured to generate the first state of the first and second NMOS drive signals via capacitive coupling and to generate the second state of the first and second NMOS drive signals via a combination of capacitive coupling and turning on of at least one of the first PMOS transistor or the second NMOS transistor.

3. The apparatus of claim 2, wherein the first state of the first and second PMOS drive signals and the first state of the first and second NMOS drive signals turn on the first and second PMOS driver transistors and the first and second NMOS driver transistors, respectively, to a triode region of operation via the first bias voltage and the second bias voltage.

4. The apparatus of claim 2, wherein the received data signal is provided from circuits powered by a first power supply voltage rail, and wherein the first and second PMOS driver transistors and the first and second NMOS driver transistors are referenced to a second power supply voltage rail higher than the first power supply voltage rail.

5. The apparatus of claim 2:
wherein the first capacitor has a first end and a second end, wherein the first end is configured to receive a first signal of the differential data signal, wherein the second end is electrically connected to a third node comprising a gate of the first NMOS transistor and a drain of the second NMOS transistor, wherein the third node is configured to provide the first PMOS drive signal;
wherein the second capacitor has a first end and a second end, wherein the first end is configured to receive a second signal of the differential data signal, wherein the second end is electrically connected to a fourth node comprising a gate of the second NMOS transistor and a drain of the first NMOS transistor, wherein the fourth node is configured to provide the second PMOS drive signal;
wherein the third capacitor has a first end and a second end, wherein the first end is configured to receive the first signal of the differential data signal, wherein the second end is electrically connected to a fifth node comprising a gate of the first PMOS transistor and a drain of the second PMOS transistor, wherein the fifth node is configured to provide the first NMOS drive signal; and
wherein the fourth capacitor has a first end and a second end, wherein the first end is configured to receive the second signal of the differential data signal, wherein the second end is electrically connected to a sixth node comprising a gate of the second PMOS transistor and a drain of the first PMOS transistor, wherein the sixth node is configured to provide the second NMOS drive signal.

6. An apparatus comprising:
a first switching circuit configured to receive a differential data signal and a first bias voltage, wherein the first switching circuit is configured to convert the differential data signal to a first PMOS drive signal and a second PMOS drive signal for a first PMOS driver transistor and a second PMOS driver transistor, respectively, wherein the first switching circuit is configured to change a state of the first and second PMOS drive signals in response to a change in state of the data signal, wherein a first state of the first or second PMOS drive signal turns on the corresponding PMOS driver transistor and has a voltage level of the first bias voltage, wherein a second state of the first or second PMOS drive signal turns off the corresponding PMOS driver transistor;

a second switching circuit configured to receive the differential data signal and a second bias voltage, wherein the second switching circuit is configured to convert the differential data signal to a first NMOS drive signal and a second NMOS drive signal for a first NMOS driver transistor and a second NMOS driver transistor, wherein the second switching circuit is configured to change a state of the NMOS drive signal in response to a change in state of the data signal, wherein a first state of the first or second NMOS drive signal turns on the corresponding NMOS driver transistor and has a voltage level of the second bias voltage, and wherein a second state of the first or second NMOS drive signal turns off the corresponding NMOS driver transistor;

a third switching circuit configured to receive a second differential data signal and to receive the first bias voltage, the third switching circuit further configured to convert the second differential data signal to third and fourth PMOS drive signals for third and fourth PMOS driver transistors, respectively;

a fourth switching circuit configured to receive the second differential data signal and to receive the first bias voltage, the fourth switching circuit further configured to convert the second differential data signal to third and fourth NMOS drive signals for third and fourth NMOS driver transistors, respectively;

a first switch configured to receive the first bias voltage and a first control signal, wherein the first switch is configured to selectively provide the first bias voltage to at least one of the first switching circuit or the third switching circuit;
a second switch configured to receive the second bias voltage and a second control signal, wherein the second switch is configured to selectively provide the second bias voltage to at least one of the second switching circuit or the fourth switching circuit;
a first DC-coupled switching circuit in parallel with the first switching circuit;
a second DC-coupled switching circuit in parallel with the second switching circuit;
a third DC-coupled switching circuit in parallel with the third switching circuit; and
a fourth DC-coupled switching circuit in parallel with the fourth switching circuit;
wherein for normal operation:
the first switch and the second switch are controlled to provide the first bias voltage and the second bias voltage, respectively; and
the first, second, third, and fourth DC paths are disabled;
wherein for squelched operation:
the first switch and the second switch are controlled to turn off; and
the first, second, third, and fourth DC paths are enabled and the inputs to the first, second, third, and fourth DC paths are provided such that the PMOS driver transistors are in contention with the NMOS driver transistors.

7. The apparatus of claim 6, further comprising:
a first voltage regulator configured to generate a first regulated voltage based on the first bias voltage, a coupling efficiency associated with the first switching circuit or the second switching circuit, and a first power supply voltage rail, wherein the received data signal is provided by circuits powered by the first power supply voltage rail, and wherein the PMOS driver transistor and the NMOS driver transistor are powered by a second power supply voltage rail higher than the first power supply voltage rail; and
a second voltage regulator configured to generate a second regulated voltage based on the second bias voltage, the coupling efficiency, and the first power supply voltage rail;
wherein output transistors of the first and third DC-coupled switching circuits are powered by the first regulated voltage;
wherein output transistors of the second and fourth DC-coupled switching circuits are powered by the second regulated voltage.

8. The apparatus of claim 7:
wherein the first regulated voltage is substantially equal to the first bias voltage summed with a product of the coupling efficiency and the first power supply voltage rail;
wherein the second regulated voltage is substantially equal to a difference between the second bias voltage and the product of the coupling efficiency and the first power supply voltage rail.

9. A method for driving a transistor, the method comprising:
receiving a differential data signal and a first bias voltage in a first switching circuit;
converting, using the first switching circuit, the differential data signal to a first PMOS drive signal and a second PMOS drive signal for a first PMOS driver transistor and a second PMOS driver transistor, respectively;
changing, using the first switching circuit, a state of the first and second PMOS drive signals in response to a change in state of the data signal, wherein a first state of the first or second PMOS drive signal turns on the corresponding PMOS driver transistor and has a voltage level of the first bias voltage, wherein a second state of the first or second PMOS drive signal turns off the corresponding PMOS driver transistor;
receiving the differential data signal and a second bias voltage in a second switching circuit;
converting, using the second switching circuit, the differential data signal to a first NMOS drive signal and a second NMOS drive signal for a first NMOS driver transistor and a second NMOS driver transistor;
changing, using the second switching circuit, a state of the NMOS drive signal in response to a change in state of the data signal, wherein a first state of the first or second NMOS drive signal turns on the corresponding NMOS driver transistor and has a voltage level of the second bias voltage, and wherein a second state of the first or second NMOS drive signal turns off the corresponding NMOS driver transistor;
selecting at least between a first signal input and a second signal input different from the first signal input by phase and/or delay to generate the differential data signal for the first switching circuit and the second switching circuit;
receiving a second differential data signal in a third switching circuit;
converting, using the third switching circuit, the second differential data signal to third and fourth PMOS drive signals for third and fourth PMOS driver transistors, respectively;
receiving the second differential data signal in a fourth switching circuit;
converting, using the fourth switching circuit, the second differential data signal to third and fourth NMOS drive signals for third and fourth NMOS driver transistors, respectively; and
selecting at least between a first signal input and a second signal input different from the first signal input by phase and/or delay to generate the second differential data signal, wherein the same signal is selected for normal operation and different signals are selected for a squelch mode.

10. A method for driving a transistor, the method comprising:
receiving a differential data signal and a first bias voltage in a first switching circuit;
converting, using the first switching circuit, the differential data signal to a first PMOS drive signal and a second PMOS drive signal for a first PMOS driver transistor and a second PMOS driver transistor, respectively;
changing, using the first switching circuit, a state of the first and second PMOS drive signals in response to a change in state of the data signal, wherein a first state of the first or second PMOS drive signal turns on the corresponding PMOS driver transistor and has a voltage level of the first bias voltage, wherein a second state of the first or second PMOS drive signal turns off the corresponding PMOS driver transistor;
receiving the differential data signal and a second bias voltage in a second switching circuit;
converting, using the second switching circuit, the differential data signal to a first NMOS drive signal and a second NMOS drive signal for a first NMOS driver transistor and a second NMOS driver transistor;

changing, using the second switching circuit, a state of the NMOS drive signal in response to a change in state of the data signal, wherein a first state of the first or second NMOS drive signal turns on the corresponding NMOS driver transistor and has a voltage level of the second bias voltage, and wherein a second state of the first or second NMOS drive signal turns off the corresponding NMOS driver transistor;

receiving a second differential data signal and the first bias voltage in a third switching circuit;

converting, using the third switching circuit, the second differential data signal to third and fourth PMOS drive signals for third and fourth PMOS driver transistors, respectively;

receiving the second differential data signal and the first bias voltage in a fourth switching circuit;

converting, using the fourth switching circuit, the second differential data signal to third and fourth NMOS drive signals for third and fourth NMOS driver transistors, respectively;

receiving the first bias voltage and a first control signal in a first switch;

selectively providing, using the first switch, the first bias voltage to at least one of the first switching circuit or the third switching circuit;

receiving the second bias voltage and a second control signal in a second switch;

selectively providing, using the second switch, the second bias voltage to at least one of the second switching circuit or the fourth switching circuit;

providing a first DC-coupled switching circuit in parallel with the first switching circuit;

providing a second DC-coupled switching circuit in parallel with the second switching circuit;

providing a third DC-coupled switching circuit in parallel with the third switching circuit; and providing a fourth DC-coupled switching circuit in parallel with the fourth switching circuit;

wherein for normal operation:
  the first switch and the second switch are controlled to provide the first bias voltage and the second bias voltage, respectively; and
  the first, second, third, and fourth DC paths are disabled;
wherein for squelched operation:
  the first switch and the second switch are controlled to turn off; and
  the first, second, third, and fourth DC paths are enabled and the inputs to the first, second, third, and fourth DC paths are provided such that the PMOS driver transistors are in contention with the NMOS driver transistors.

11. The method of claim 10, further comprising:
wherein the first switching circuit comprises a first capacitor, a second capacitor, a first NMOS transistor, a second NMOS transistor, and the first switch, wherein sources of the first NMOS transistor and the second NMOS transistor are electrically connected to a first node;
selectively providing the first bias voltage to the first node;
wherein changing further comprises:
  generating the first state of the first and second PMOS drive signals via capacitive coupling, wherein a first state of the first or second PMOS drive signal turns on the corresponding PMOS driver transistor and has a voltage level of the first bias voltage, and
  generating the second state of the first and second PMOS drive signals via a combination of capacitive coupling and turning on of at least one of the first NMOS transistor or the second NMOS transistor, wherein a second state of the first or second PMOS drive signal turns off the corresponding PMOS driver transistor;

wherein the second switching circuit comprises a third capacitor, a fourth capacitor, a first PMOS transistor, a second PMOS transistor, and the second switch, wherein sources of the first PMOS transistor and the second PMOS transistor are electrically connected to a second node;

selectively providing the second bias voltage to the second node;

wherein changing further comprises:
  generating the first state of the first and second NMOS drive signals via capacitive coupling, wherein a first state of the first or second NMOS drive signal turns on the corresponding NMOS driver transistor and has a voltage level of the second bias voltage, and
  generating the second state of the first and second NMOS drive signals via a combination of capacitive coupling and turning on of at least one of the first PMOS transistor or the second NMOS transistor, wherein a second state of the first or second NMOS drive signal turns off the corresponding NMOS driver transistor.

12. The method of claim 11, wherein the first state of the first and second PMOS drive signals and the first state of the first and second NMOS drive signals turn on the first and second PMOS driver transistors and the first and second NMOS driver transistors, respectively, to a triode region of operation via the first bias voltage and the second bias voltage.

13. The method of claim 11, wherein the received data signal is provided from circuits powered by a first power supply voltage rail, and wherein the first and second PMOS driver transistors and the first and second NMOS driver transistors are referenced to a second power supply voltage rail higher than the first power supply voltage rail.

14. The method of claim 11, further comprising selecting at least between a first signal input and a second signal input different from the first signal input by phase and/or delay to generate the differential data signal for the first switching circuit and the second switching circuit.

15. The method of claim 10, further comprising:
generating, using a first voltage regulator, a first regulated voltage based on the first bias voltage, a coupling efficiency associated with the first switching circuit or the second switching circuit, and a first power supply voltage rail, wherein the received data signal is provided by circuits powered by the first power supply voltage rail, and wherein the PMOS driver transistor and the NMOS driver transistor are powered by a second power supply voltage rail higher than the first power supply voltage rail;

generating, using a second voltage regulator, a second regulated voltage based on the second bias voltage, the coupling efficiency, and the first power supply voltage rail;

powering output transistors of the first and third DC-coupled switching circuits with the first regulated voltage; and powering output transistors of the second and fourth DC-coupled switching circuits with the second regulated voltage.

16. The method of claim 15:
- wherein the first regulated voltage is substantially equal to the first bias voltage summed with a product of the coupling efficiency and the first power supply voltage rail;
- wherein the second regulated voltage is substantially equal to a difference between the second bias voltage and the product of the coupling efficiency and the first power supply voltage rail.

17. An apparatus for driving a transistor, the apparatus comprising:
- a first means for receiving a differential data signal and a first bias voltage, wherein the first receiving means includes capacitively coupled paths and switched paths;
- a means for converting the differential data signal to a first PMOS drive signal and a second PMOS drive signal for a first PMOS driver transistor and a second PMOS driver transistor, respectively;
- a means for changing a state of the first and second PMOS drive signals in response to a change in state of the data signal, wherein a first state of the first or second PMOS drive signal turns on the corresponding PMOS driver transistor and has a voltage level of the first bias voltage, wherein a second state of the first or second PMOS drive signal turns off the corresponding PMOS driver transistor;
- a second means for receiving the differential data signal and a second bias voltage, wherein the second receiving means includes capacitively coupled paths and switched paths;
- a means for converting the differential data signal to a first NMOS drive signal and a second NMOS drive signal for a first NMOS driver transistor and a second NMOS driver transistor;
- a means for changing a state of the NMOS drive signal in response to a change in state of the data signal, wherein a first state of the first or second NMOS drive signal turns on the corresponding NMOS driver transistor and has a voltage level of the second bias voltage, and wherein a second state of the first or second NMOS drive signal turns off the corresponding NMOS driver transistor; and
- a third means for receiving a second differential data signal and the first bias voltage, wherein the third receiving means is configured to convert the second differential data signal to third and fourth PMOS drive signals for third and fourth PMOS driver transistors, respectively;
- a fourth means for receiving the second differential data signal and the first bias voltage, wherein the fourth receiving means is configure to convert the second differential data signal to third and fourth NMOS drive signals for third and fourth NMOS driver transistors, respectively;
- a first switch configured to receive the first bias voltage and a first control signal in a first switch, wherein the first switch is further configured to provide the first bias voltage to at least one of the first switching circuit or the third switching circuit;
- a second switch configured to receive the second bias voltage and a second control signal, wherein the second switch is further configured to provide the second bias voltage to at least one of the second switching circuit or the fourth switching circuit;
- a first DC-coupled switching circuit in parallel with the first switching circuit;
- a second DC-coupled switching circuit in parallel with the second switching circuit;
- a third DC-coupled switching circuit in parallel with the third switching circuit; and
- a fourth DC-coupled switching circuit in parallel with the fourth switching circuit;
- wherein for normal operation:
    - the first switch and the second switch are controlled to provide the first bias voltage and the second bias voltage, respectively; and
    - the first, second, third, and fourth DC paths are disabled;
- wherein for squelched operation:
    - the first switch and the second switch are controlled to turn off; and
    - the first, second, third, and fourth DC paths are enabled and the inputs to the first, second, third, and fourth DC paths are provided such that the PMOS driver transistors are in contention with the NMOS driver transistors.

\* \* \* \* \*